(12) United States Patent
Yoshida et al.

(10) Patent No.: US 9,513,549 B2
(45) Date of Patent: Dec. 6, 2016

(54) COMPOUND, RESIN, PHOTORESIST COMPOSITION, AND METHOD FOR PRODUCING PHOTORESIST PATTERN

(71) Applicant: SUMITOMO CHEMICAL COMPANY, LIMITED, Tokyo (JP)

(72) Inventors: Isao Yoshida, Osaka (JP); Koji Ichikawa, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 14/474,752

(22) Filed: Sep. 2, 2014

(65) Prior Publication Data

US 2015/0064622 A1 Mar. 5, 2015

(30) Foreign Application Priority Data

Sep. 3, 2013 (JP) ................. 2013-181852

(51) Int. Cl.
| | |
|---|---|
| *G03F 7/039* | (2006.01) |
| *G03F 7/32* | (2006.01) |
| *C08F 220/28* | (2006.01) |
| *C08F 216/10* | (2006.01) |
| *G03F 7/30* | (2006.01) |
| *G03F 7/20* | (2006.01) |

(52) U.S. Cl.
CPC ........... *G03F 7/0397* (2013.01); *C08F 216/10* (2013.01); *C08F 220/28* (2013.01); *G03F 7/2041* (2013.01); *G03F 7/30* (2013.01); *G03F 7/325* (2013.01)

(58) Field of Classification Search
None
See application file for complete search history.

(56) References Cited

U.S. PATENT DOCUMENTS

| 2009/0061356 A1* | 3/2009 | Dazai et al. ............... 430/285.1 |
| 2009/0068342 A1* | 3/2009 | Senzaki et al. .................. 427/58 |
| 2009/0253881 A1* | 10/2009 | Hatakeyama et al. ........ 526/270 |
| 2012/0295201 A1 | 11/2012 | Ichikawa et al. |

FOREIGN PATENT DOCUMENTS

| JP | 2000-29219 A | | 1/2000 |
| JP | 2000-098614 | * | 4/2000 |
| JP | 2007-231202 | * | 9/2007 |
| JP | 2008-058538 | * | 3/2008 |
| JP | 2010-039143 | * | 2/2010 |
| JP | 2010-256874 | * | 11/2010 |
| JP | 2011-043786 | * | 3/2011 |
| JP | 2011-215613 | * | 10/2011 |

OTHER PUBLICATIONS

Machine translation of JP2010-039143 (Feb. 2010).*
Tarutani, "Negative developing process and materials for resist", Monthly Display published by Technotimes Corp., Jun. 2011, pp. 31-36, including an English translation of its title and p. 31, left col. line 1 to right col. line 21.

* cited by examiner

*Primary Examiner* — Martin Angebranndt
(74) *Attorney, Agent, or Firm* — Birch, Stewart, Kolasch & Birch, LLP

(57) ABSTRACT

A compound represented by formula (I):

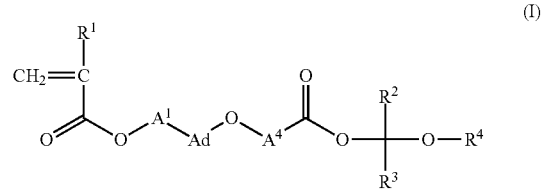

wherein $R^1$ represents a hydrogen atom, a halogen atom, or a C1-C6 alkyl group which may have a halogen atom;

$R^2$ and $R^3$ each independently represent a hydrogen atom or a C1-C6 monovalent saturated hydrocarbon group, and $R^4$ represents a C1-C6 monovalent saturated linear hydrocarbon group, a C3-C6 monovalent saturated branched hydrocarbon group, a C5-C12 monovalent alicyclic hydrocarbon group or a C5-C12 monovalent alicyclic hydrocarbon-containing group, or $R^3$ and $R^4$ represent a C2-C6 heterocyclic ring together with an oxygen atom and a carbon atom;

$A^1$ represents a single bond, or $\text{*-}A^2\text{-}X^1\text{-}(A^3\text{-}X^2)_a\text{—}$ where $A^2$ and $A^3$ each independently represent a C1-C6 alkanediyl group, $X^1$ and $X^2$ each independently represent an oxygen atom, a carbonyloxy group or an oxycarbonyl group, and "a" represents 0 or 1;

$A^4$ represents a C1-C6 alkanediyl group;

Ad represents a divalent adamantanediyl group.

3 Claims, No Drawings

COMPOUND, RESIN, PHOTORESIST COMPOSITION, AND METHOD FOR PRODUCING PHOTORESIST PATTERN

This nonprovisional application claims priority under 35 U.S.C. §119(a) on patent application No. 2013-181852 filed in JAPAN on Sep. 3, 2013, the entire contents of which are hereby incorporated by reference.

FIELD OF THE INVENTION

The present invention relates to a compound, resin, a photoresist composition and a method for producing a photoresist pattern.

BACKGROUND OF THE INVENTION

US2012/0295201A1 discloses a compound represented by formula (I'), a resin which comprises a structural unit derived from the compound, and a composition which comprises the resin and the acid generator of formula (B1-3):

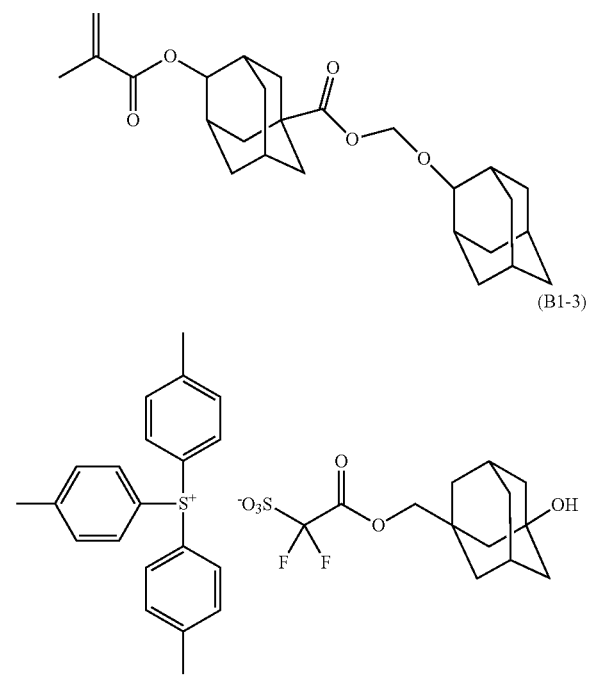

As to the lithography process for producing a photoresist pattern from photoresist composition, the magazine "Monthly Display", June, 2011, page 31, published by Technotimes Corp., teaches that a positive type photoresist pattern can be obtained by developing with an alkaline developer, and that a negative type photoresist pattern can be obtained by developing with an organic solvent.

SUMMARY OF THE INVENTION

The present invention is to provide a compound for suitable for a photoresist composition. The present invention relates to the followings:

<1> A compound represented by formula (I):

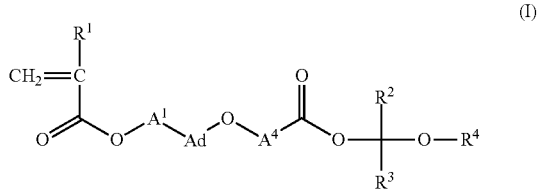

wherein
R$^1$ represents a hydrogen atom, a halogen atom, or a C1-C6 alkyl group which may have a halogen atom;
R$^2$ and R$^3$ each independently represent a hydrogen atom or a C1-C6 monovalent saturated hydrocarbon group;
R$^4$ represents a C1-C6 monovalent saturated linear hydrocarbon group, a C3-C6 monovalent saturated branched hydrocarbon group, a C5-C12 monovalent alicyclic hydrocarbon group or a C5-C12 monovalent alicyclic hydrocarbon-containing group, or R$^3$ and R$^4$ represent a C2-C6 heterocyclic ring together with an oxygen atom and a carbon atom;
A$^1$ represents a single bond, or *-A$^2$-X$^1$-(A$^3$-X$^2$)$_a$— where A$^2$ and A$^3$ each independently represent a C1-C6 alkanediyl group, X$^1$ and X$^2$ each independently represent an oxygen atom, a carbonyloxy group or an oxycarbonyl group, and "a" represents 0 or 1;
A$^4$ represents a C1-C6 alkanediyl group;
Ad represents a divalent adamantanediyl group.
<2> The compound according to <1>, wherein Ad is a divalent group represented by any one of formulae (Ad-1), (Ad-2) and (Ad-3):

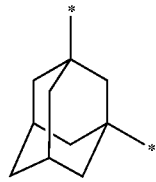

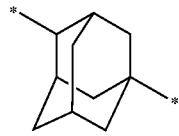

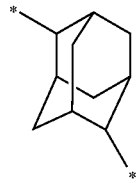

where * represents a binding position.
<3> The compound according to <1> or <2>, wherein A$^1$ is a single bond.
<4> The compound according to any one of <1> to <3>, wherein R$^4$ is a C5-C10 monovalent alicyclic hydrocarbon group.
<5> A resin which comprises a structural unit derived from the compound according to any one of <1> to <4>.

<6> A photoresist composition, which comprises the resin according to <5> and an acid generator.
<7> A process for producing a photoresist pattern comprising the following steps (1) to (5):
(1) a step of applying the photoresist composition according to <6> on a substrate,
(2) a step of forming a composition film by conducting drying,
(3) a step of exposing the composition film to radiation,
(4) a step of baking the exposed composition film, and
(5) a step of developing the baked composition film thereby to form a photoresist pattern.

DESCRIPTION OF PREFERRED EMBODIMENTS

The present invention will be described in detail.
Herein, the term "(meth)acryl" means the structure which has $CH_2=CH-CO-$, i.e. an acryl moiety, or $CH_2=C(CH_3)-CO-$, i.e., a methacryl one.
The compound of the present invention is represented by formula (I):

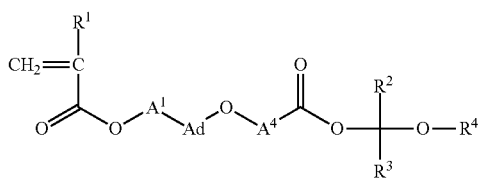

In formula (I), $R^1$ represents a hydrogen atom, a halogen atom, or a C1-C6 alkyl group which may have a halogen atom;
$R^2$ and $R^3$ each independently represent a hydrogen atom or a C1-C6 monovalent saturated hydrocarbon group;
$R^4$ represents a C1-C6 monovalent saturated linear hydrocarbon group, a C3-C6 monovalent saturated branched hydrocarbon group, a C5-C12 monovalent alicyclic hydrocarbon group or a C5-C12 monovalent alicyclic hydrocarbon-containing group, or $R^3$ and $R^4$ represent a C2-C6 heterocyclic ring together with an oxygen atom and a carbon atom;
$A^1$ represents a single bond, or $*\text{-}A^2\text{-}X^1\text{-}(A^3\text{-}X^2)_a-$ where $A^2$ and $A^3$ each independently represent a C1-C6 alkanediyl group, $X^1$ and $X^2$ each independently represent an oxygen atom, a carbonyloxy group or an oxycarbonyl group, and "a" represents 0 or 1;
$A^4$ represents a C1-C6 alkanediyl group;
Ad represents a divalent adamantanediyl group.

Examples of the alkyl group represented by $R^1$ include a methyl group, an ethyl group, a propyl group, a butyl group, a pentyl group, and a hexyl group, preferably a C1-C4 alkyl group, and more preferably a methyl group and an ethyl group. Herein, the butyl group includes n-butyl group, iso-butyl group and tert-butyl group.

Examples of halogen atom represented by $R^1$ include a fluorine atom, a chlorine atom, a bromine atom and an iodine atom.

As to $R^1$, examples of the alkyl group which has an halogen atom include a trifluoromethyl group, a pentafluoroethyl group, a perfluoropropyl group, a perfluoroisopropyl group, a perfluorobutyl group, a perfluoro-sec-butyl group, a perfluoro-tert-butyl group, a perfluoropentyl group, a perfluorohexyl group, a trichloromethyl group, a tribromomethyl group, and a triiodomethyl group.

$R^1$ is a hydrogen atom or a methyl group.

As to $A^2$, $A^3$ and $A^4$, examples of the alkanediyl group include C1-C6 linear alkanediyl groups such as a methylene group, an ethylene group, a propane-1,3-diyl group, a butane-1,4-diyl group, a pentane-1,5-diyl group and a hexane-1,6-diyl group; C1-C6 branched alkanediyl groups such as an ethane-1,1-diyl group, a propane-1,2-diyl group, a propane-1,3-diyl group, a butane-1,3-diyl group, a 2-methylpropane-1,3-diyl group, a 2-methylpropane-1,2-diyl group, a pentane-1,4-diyl group and a 2-methylbutane-1,4-diyl group.

$A^2$, $A^3$ and $A^4$ are preferably a C1-C3 alkanediyl group. Among them, $A^4$ is more preferably a methylene group or an ethane-1,1-diyl group. $A^1$ represents a single bond or a group represented by $*\text{-}A^2\text{-}X^1\text{-}(A^3\text{-}X^2)_a-$ where $A^2$ and $A^3$ are as defined above, and $X^1$ and $X^2$ each independently represent an oxygen atom, a carbonyloxy group or an oxycarbonyl group.

Examples of the groups represented by $*\text{-}A^2\text{-}X^1\text{-}(A^3\text{-}X^2)_a-$ include those represented by $*\text{-}A^2\text{-}O-$, $*\text{-}A^2\text{-}CO-O-$, $*\text{-}A^2\text{-}O-CO-$, $*\text{-}A^2\text{-}CO-O\text{-}A^3\text{-}CO-O-$, $*\text{-}A^2\text{-}O-CO\text{-}A^3\text{-}O-$, $*\text{-}A^2\text{-}O\text{-}A^3\text{-}CO-O-$, $*\text{-}A^2\text{-}CO-O\text{-}A^3\text{-}O-CO-$ and $*\text{-}A^2\text{-}O-CO\text{-}A^3\text{-}O-CO-$. Among them, preferred are those represented by $*\text{-}A^2\text{-}O-$, $*\text{-}A^2\text{-}CO-O-$, $*\text{-}A^2\text{-}CO-O\text{-}A^3\text{-}CO-O-$ and $*\text{-}A^2\text{-}O\text{-}A^3\text{-}CO-O-$ where $A^2$ and $A^3$ are as defined above.

$A^1$ is preferably a single bond or a group represented by $*\text{-}A^2\text{-}CO-O-$ where $A^2$ is as defined above, more preferably a single bond, $*-CH_2-CO-O-$ or $*-C_2H_4-CO-O-$, and still more preferably a single bond.

Examples of the monovalent saturated hydrocarbon group represented by $R^2$ and $R^3$ include alkyl groups such as a methyl group, an ethyl group, a propyl group, a butyl group, a pentyl group, and a hexyl group;
cycloalkyl groups such as a cyclopentyl group, and a cyclohexyl group; and
groups formed by combining any of these alkyl groups with any of these cycloalkyl groups.

As to $R^4$, examples of the monovalent linear saturated hydrocarbon group and the monovalent branched saturated hydrocarbon group include alkyl groups such as a methyl group, an ethyl group, a propyl group, a butyl group, a pentyl group, and a hexyl group.

As to $R^4$, examples of the monovalent alicyclic hydrocarbon-containing group include a group formed by combining a monovalent saturated alicyclic hydrocarbon group with a monovalent saturated linear or branched hydrocarbon group. Examples of monovalent saturated alicyclic hydrocarbon group include a cyclopentyl group, a cyclohexyl group, an adamantyl group, and a norbornane group. Examples of the monovalent alicyclic hydrocarbon-containing group include a cyclohexylmethyl group, and an adamantylmethyl group.

$R^2$ and $R^3$ are preferably a hydrogen atom, a methyl group or an ethyl group, and more preferably a hydrogen atom or a methyl group.

$R^4$ is preferably a C5-C10 monovalent alicyclic hydrocarbon group, more preferably a C5-C10 monovalent monocyclic hydrocarbon group, and still more preferably a cyclohexyl group.

$R^4$ is preferably a methyl group, an ethyl group or a propyl group, and more preferably a methyl group or an ethyl group.

Examples of the heterocyclic ring represented by $R^3$ and $R^4$ together include an oxirane ring, an oxicetane ring, an oxisolan ring and a tetrahydropyran group.

Ad is preferably a divalent group represented by any one of formulae (Ad-1), (Ad-2) and (Ad-3), more preferably a divalent group represented by formula (Ad-1) or (Ad-2), and still more preferably a divalent group represented by formula (Ad-1):

(Ad-1)

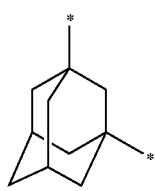

(Ad-2)

(Ad-3)

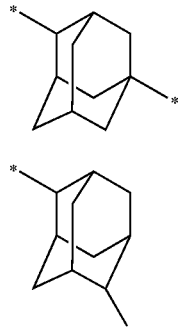

where * represents a binding position.

Examples of the compound represented by formula (I) include the following ones.

(I-1)

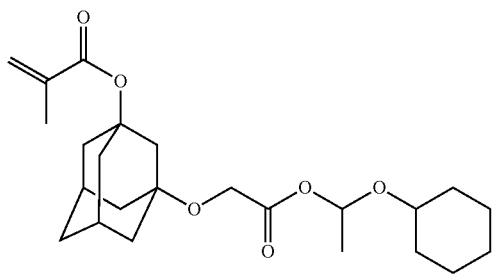

(I-2)

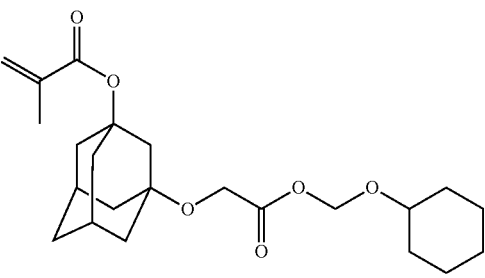

(I-3)

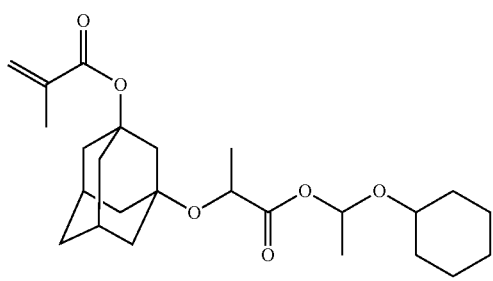

(I-4)

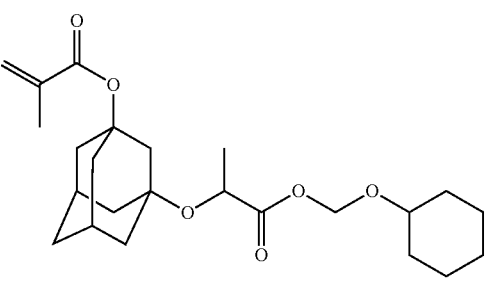

(I-5)

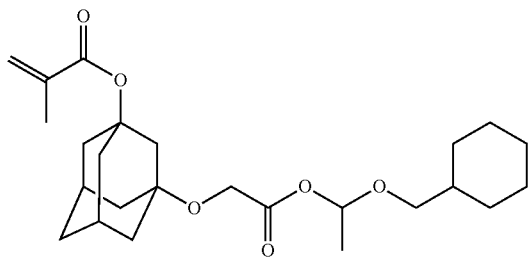

(I-6)

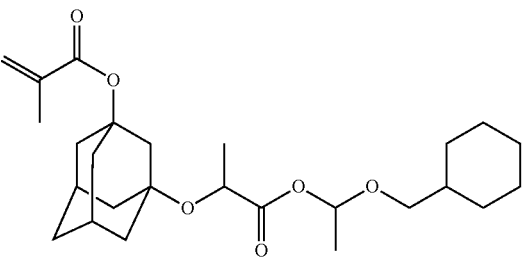

-continued
(I-7)
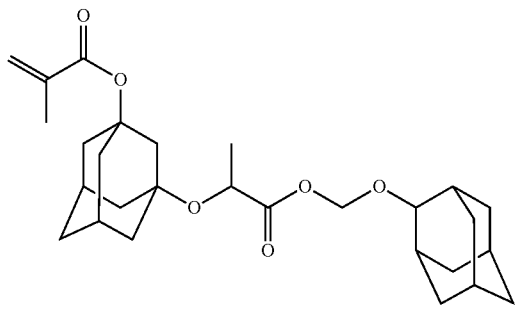
(I-8)
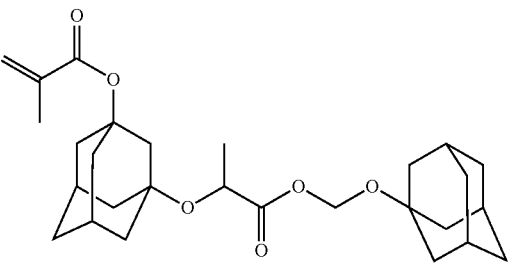
(I-9)
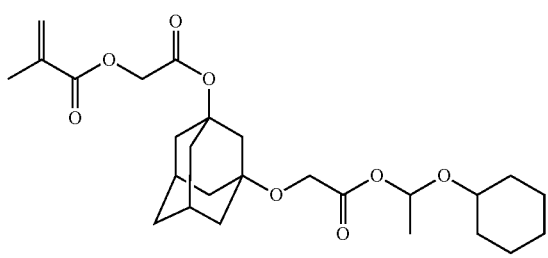
(I-10)
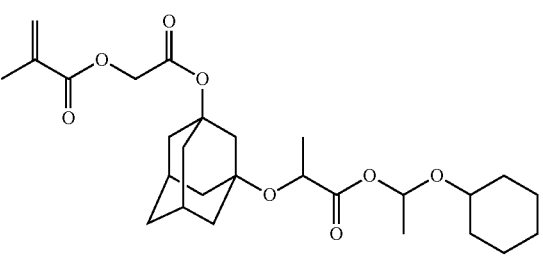
(I-11)
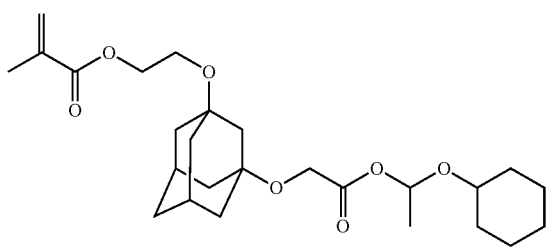
(I-12)
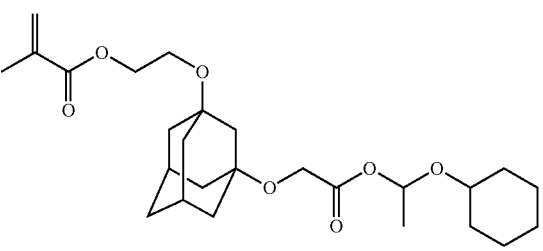
(I-13)
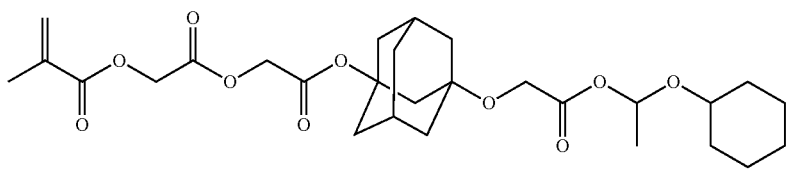
(I-14)
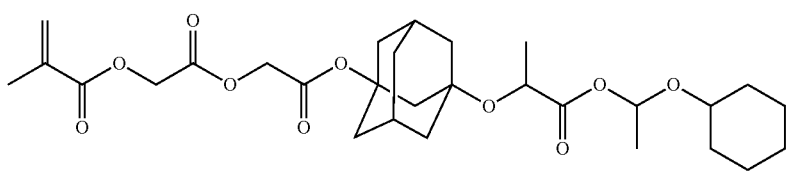
(I-15)
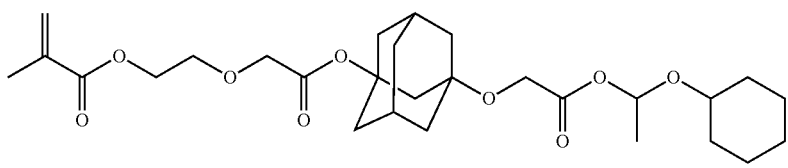
(I-16)
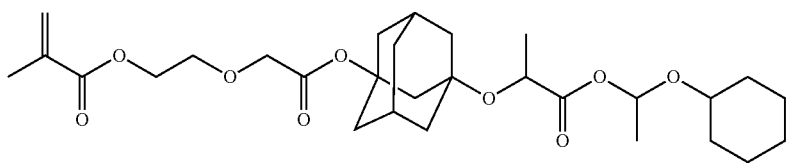

-continued
(I-17) 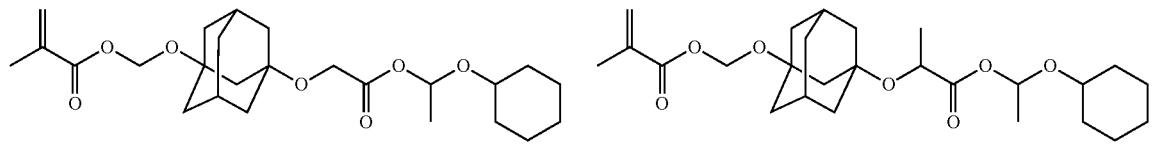 (I-18)
(I-19) 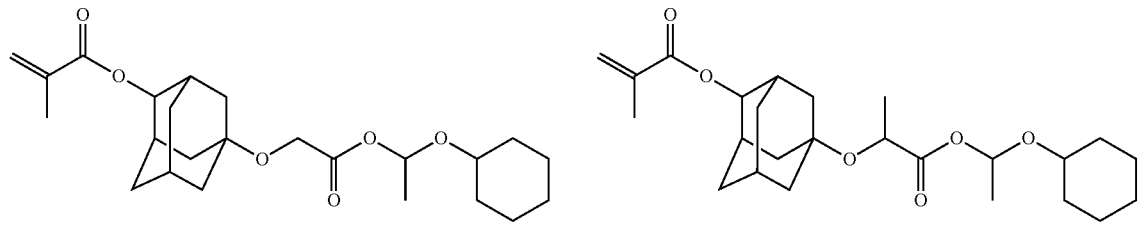 (I-20)
(I-21) 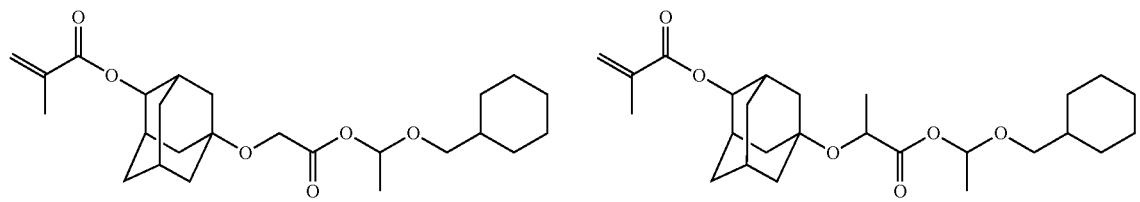 (I-22)
(I-23) 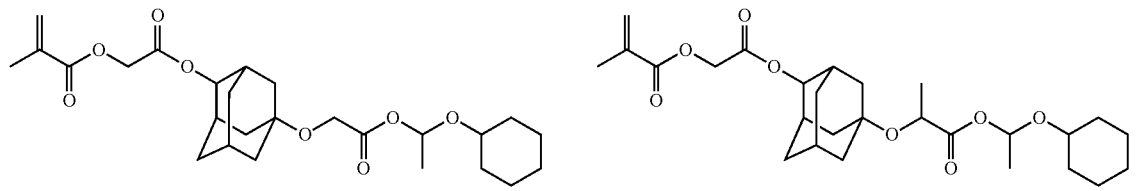 (I-24)
(I-25) 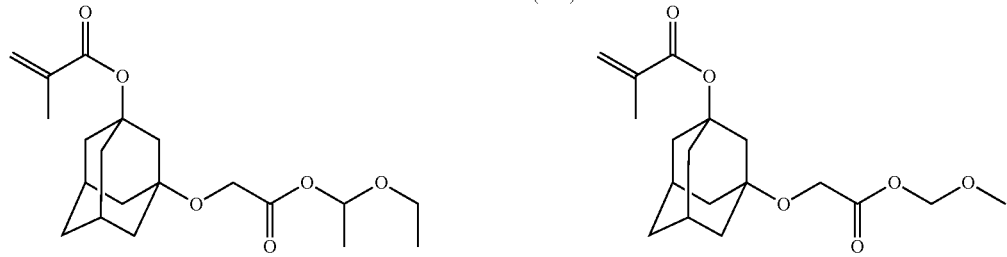 (I-26)
(I-26) 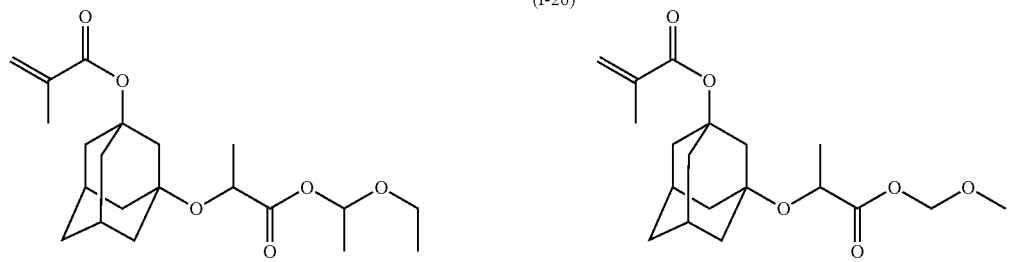 (I-27)

-continued
(I-28)
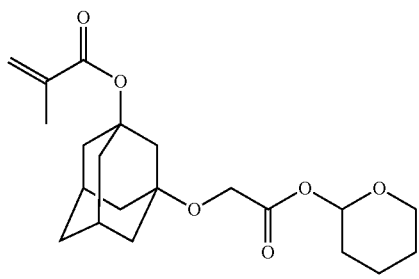
(I-29)
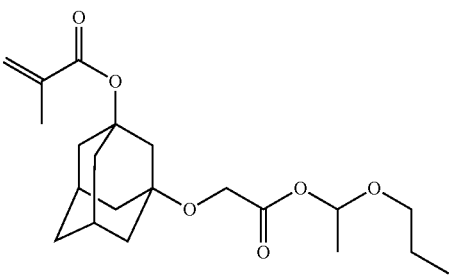
(I-30)
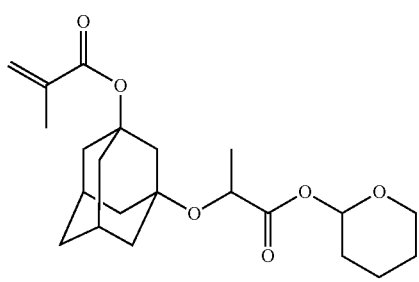
(I-31)
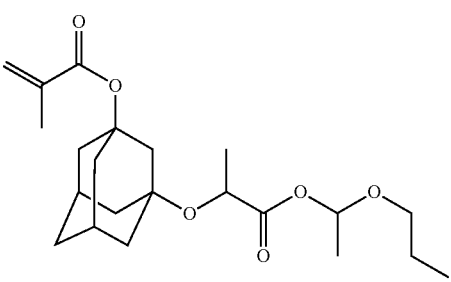
(I-32)
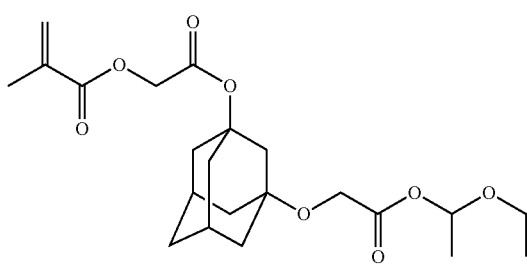
(I-33)
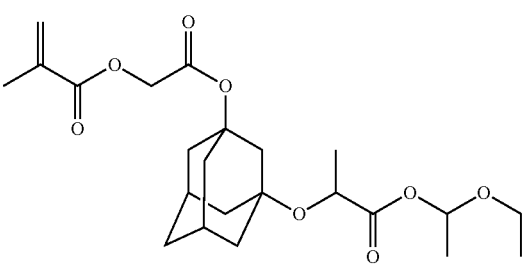
(I-34)
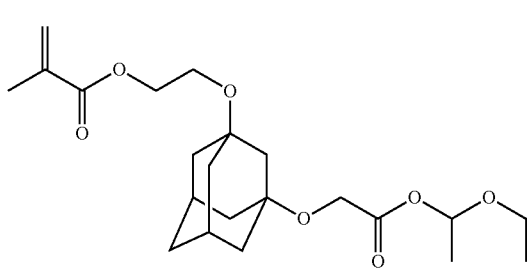
(I-35)
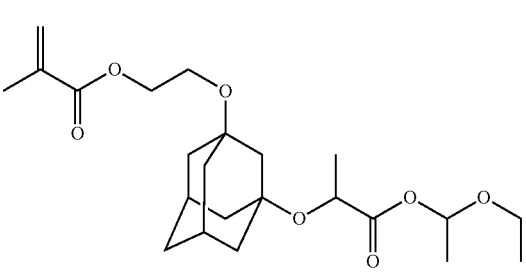
(I-36)
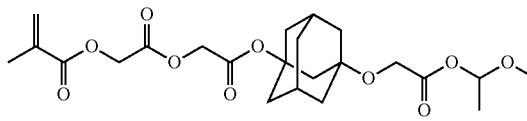
(I-37)
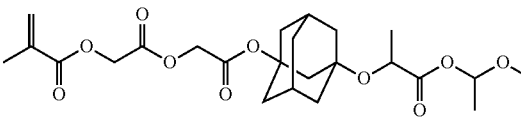
(I-38)
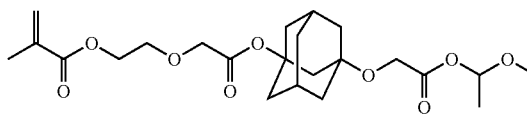
(I-39)
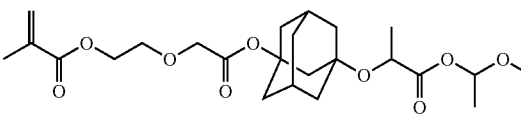
(I-40)
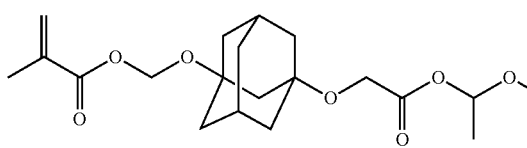
(I-41)
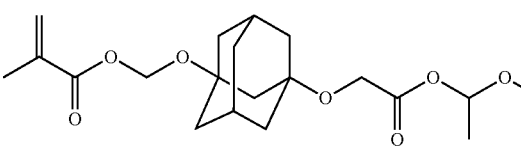

-continued

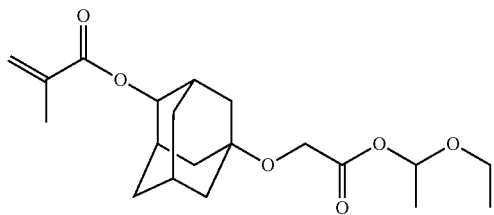
(I-42)

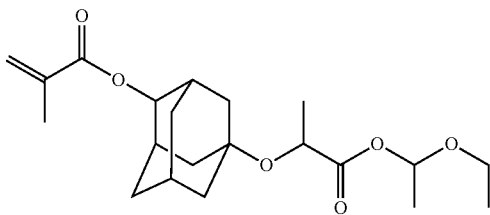
(I-43)

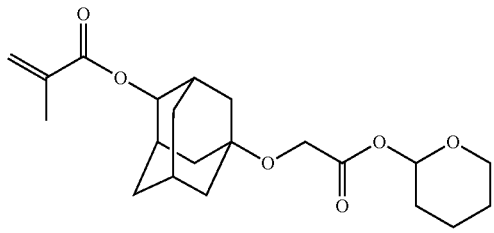
(I-44)

(I-45)

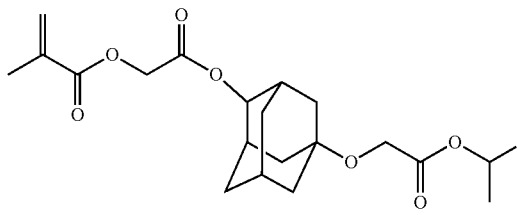
(I-46)

(I-47)

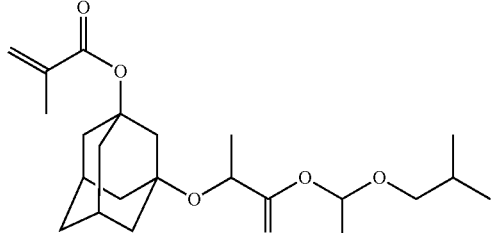
(I-48)

(I-49)

Examples of the compound further include the compounds where the methyl group corresponding to $R^1$ in any one of formulae (I-1) to (I-49) has been replaced by a hydrogen atom.

The process for producing the compound represented by formula (I) will be described.

The compound of formula (I) can be produced by reacting the compound represented by formula (I-a) and the compound represented by formula (I-b) in the presence of an acid catalyst such as a champhorsulfonic acid in a solvent such as chloroform or tert-butylmethylether.

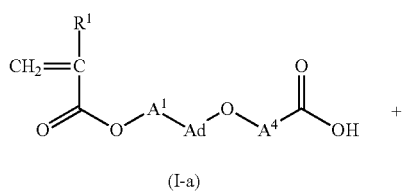
(I-a)

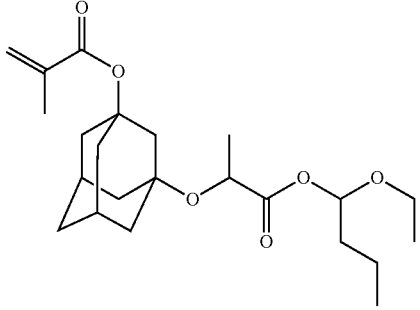
(I-b)

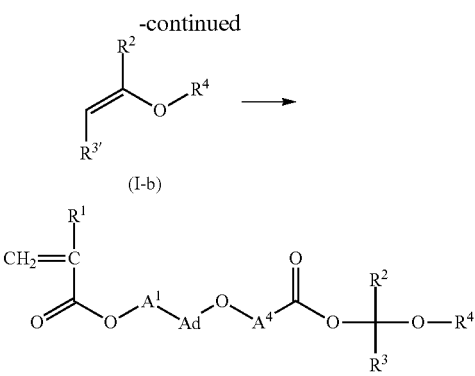
(I)

In each formula, $A^1$, $A^4$, $R^1$, $R^2$, $R^3$ and $R^4$ are as defined above, and $R^{3'}$ represents a C1-C5 monovalent saturated hydrocarbon group. Examples of the compound represented by formula (I-a) include those represented by the following formulae.

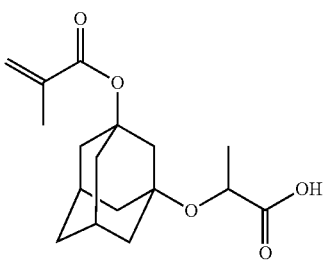

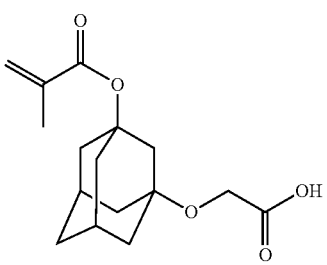

Examples of the compound represented by formula (I-b) include those represented by the following formulae.

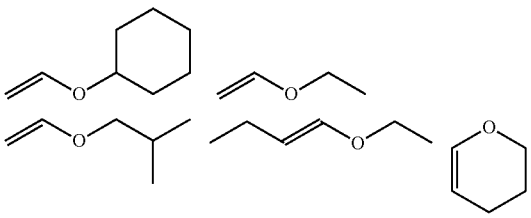

The compounds represented by formulae (I-a) and (I-b) are available on the market.

In the process, the reaction temperature is usually 5° C. to 60° C., which depends on the compounds represented by formulae (I-a) and (I-b) and other materials.

For the reaction, the amount of the acid catalyst is 0.01 to 1 mole per mole of the compound represented by formula (I-a).

A specific example of the process is illustrated as follows:

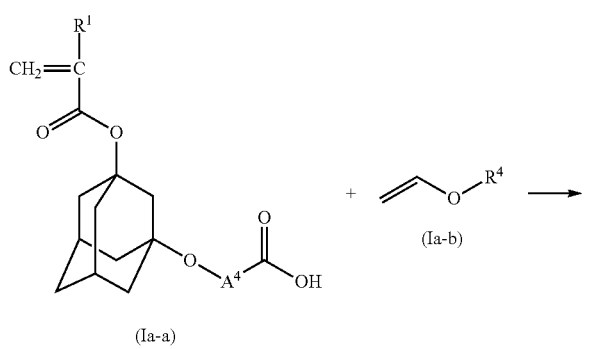

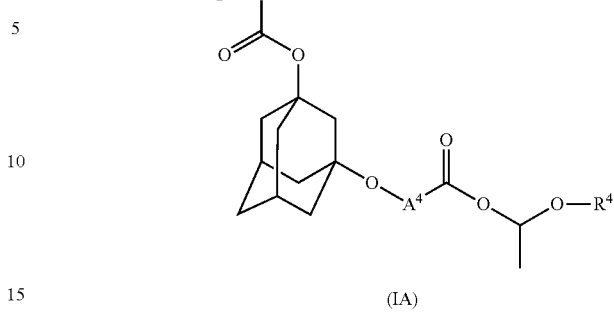

(IA)

In each formula, $A^4$, $R^1$ and $R^4$ are as defined above. The reaction for producing the compound represented by formula (IA) can be conducted in the same manner as mentioned above.

The compound of formula (I) is suitable for a monomer of a resin, preferably a resin for the photoresist composition.

<Resin which Comprises a Structural Unit Derived from the Compound of Formula (I)>

The resin of the present invention comprises a structural unit derived from the compound of formula (I). Hereinafter, such resin is sometimes referred to as "Resin (A)", and such structural unit is sometimes referred to as "structural unit (I)."

Resin (A) comprises a structural unit derived from the compound represented by formula (I) in an amount of preferably 1 to 60% by mole, more preferably 3 to 55% by mole, still preferably 5 to 50% by mole, relative to the total structural units in the resin.

Resin (A) may further comprise a structural unit derived from a monomer having an acid-labile group but not being represented by formula (I). Hereinafter, such monomer having an acid-labile group but not being represented by formula (I) is sometimes referred to as "compound (a1)".

Resin (A) may further comprise a structural unit derived from a monomer having no acid-labile group.

Hereinafter, such monomer having no acid-labile group is sometimes referred to as "compound (s)".

<Acid-Labile Group>

The term "acid-labile group" means a group which has a leaving group capable of being eliminated by the action of an acid thereby to be converted into a hydrophilic group such as a hydroxyl group or carboxyl group.

Examples of the acid-labile group include a group represented by the formula (1):

in which $R^{11}$, $R^{12}$ and $R^{13}$ independently each represent a C1-C8 alkyl group, a C3-C20 monovalent alicyclic hydrocarbon group, or a group formed by combining the alkyl group with the alicyclic hydrocarbon group, and $R^{11}$ and $R^{12}$ may be bonded each other to jointly represent a C2-C20 divalent hydrocarbon group, and * represents a binding position;

a group represented by the formula (2)

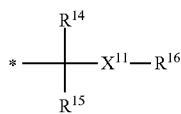
(2)

in which $R^{14}$ and $R^{15}$ independently each represent a hydrogen atom or a C1-C12 hydrocarbon group, and $R^{16}$ represents a C1-C20 monovalent hydrocarbon group, or $R^{15}$ and $R^{16}$ are bonded to each other to jointly represent a C2-C20 divalent hydrocarbon group where a methylene group may be replaced by —O— or —S—, $X^{11}$ represents —O— or —S— and *represents a binding position; and a group represented by the formula (3)

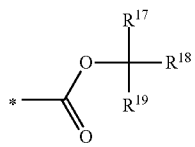
(3)

in which $R^{17}$, $R^{18}$ and $R^{19}$ independently each represent a C1-C8 alkyl group, a C3-C20 monovalent alicyclic hydrocarbon group or a group formed by combining the alkyl group with the alicyclic hydrocarbon group, or two of $R^{17}$ $R^{18}$ and $R^{19}$ are bonded to each other to jointly represent a C2-C20 divalent hydrocarbon group, and * represents a binding position.

Examples of the alkyl group represented by $R^{11}$, $R^{12}$, $R^{13}$, $R^{17}$, $R^{18}$ or $R^{19}$ include a methyl group, an ethyl group, a propyl group, an isopropyl group, a butyl group, a pentyl group, a hexyl group, a heptyl group and an octyl group.

The alicyclic hydrocarbon group represented by $R^{11}$, $R^{12}$, $R^{13}$, $R^{17}$, $R^{18}$ or $R^{19}$ may be a monocyclic or polycyclic one. Examples of the alicyclic hydrocarbon group include a monocyclic hydrocarbon group such as a C3-C20 cycloalkyl group (e.g. a cyclopentyl group, a cyclohexyl group, a cycloheptyl group and a cyclooctyl group) and a polycyclic alicyclic hydrocarbon group such as a decahydronaphthyl group, an adamantyl group, a norbornyl group and the followings.

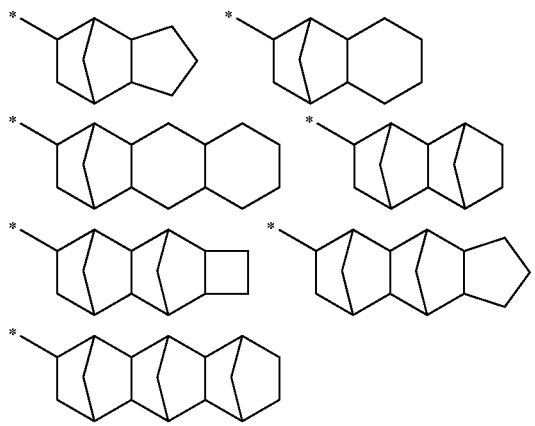

The alicyclic hydrocarbon group preferably has 3 to 16 carbon atoms. Examples of the group formed by combining the alkyl group with the alicyclic hydrocarbon group include methylcyclohexyl group, dimethylcyclohexyl group, and a methylnorbornyl group.

Examples of the group represented by the formula (1) include tertiary alkyl groups such as a tert-butyl group, a tert-pentyl group, and tert-octyl group.

When $R^{11}$ and $R^{12}$ of formula (1) are bonded each other to jointly represent a C2-C20 divalent hydrocarbon group, examples of the group represented by formula (1) include the following groups and the ring preferably has 3 to 12 carbon atoms.

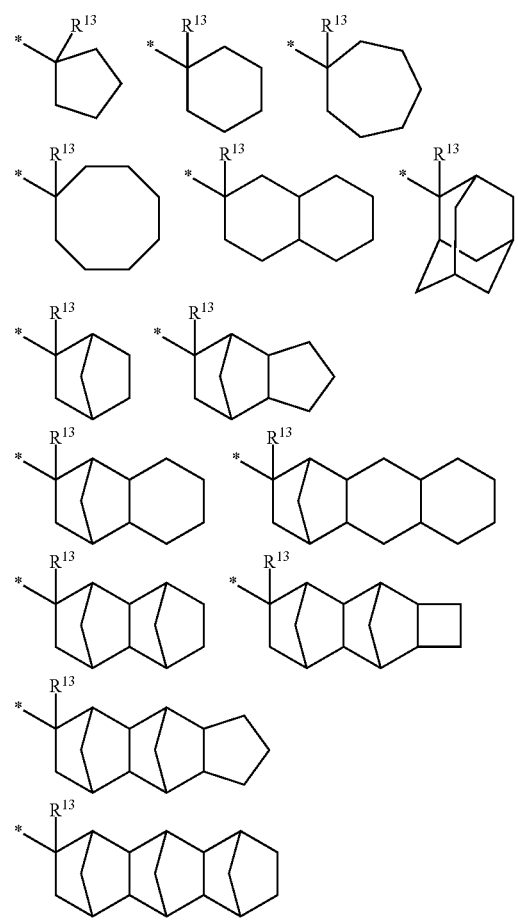

in each formula, $R^{13}$ is the same as defined above and * represents a binding position to —O— of formula (1).

As to formula (2), examples of the monovalent hydrocarbon group represented by $R^{14}$, $R^{15}$, $R^{16}$ include an alkyl group, an alicyclic hydrocarbon group, an aromatic hydrocarbon group, and a group formed by combining two or more of them.

Examples of the alkyl group and the alicyclic hydrocarbon group include the same as described above. Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

Divalent hydrocarbon group represented by $R^{15}$ and $R^{16}$ include groups which correspond to those as referred to by the monovalent hydrocarbon group represented by $R^{11}$, $R^{12}$ and $R^{13}$.

It is preferred that at least one of $R^{14}$ and $R^{15}$ is a hydrogen atom.

Examples of the group represented by formula (2) include the following.

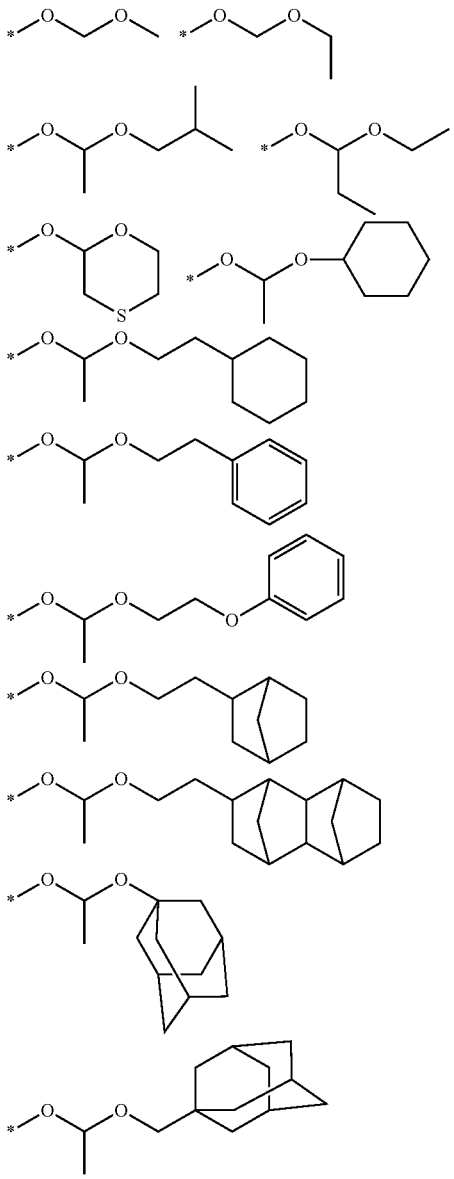

Examples of —C($R^{17}$) ($R^{18}$) ($R^{19}$) in formula (3) include the same groups as referred to by formula (1).

The group represented by the formula (3) where $R^{17}$, $R^{18}$ and $R^{19}$ independently each represent a C1-C8 alkyl group such as a tert-butyl group, the group represented by the formula (3) where $R^{17}$ and $R^{18}$ are bonded each other to jointly represent an adamantyl ring and $R^{19}$ is a C1-C8 alkyl group such as a 2-alkyladaman-2-tyloxycarbonyl group, and the group represented by the formula (3) where $R^{17}$ and $R^{18}$ are C1-C8 alkyl groups and $R^{19}$ is an adamantyl group such as a 1-(1-adaman-1-yl)-1-alkylalkoxycarbonyl group are preferred.

<Structural Unit (a1)>

The structural unit (a1) is derived from a monomer having an acid-labile group but not being represented by formula (I).

Hereinafter, such monomer is sometimes referred to as "monomer (a1)".

Preferred monomer (a1) is a monomer having an acid-labile group and carbon-carbon double bond but not being represented by formula (I), and more preferred monomer (a1) is a (meth)acrylic monomer having an acid-labile group but not being represented by formula (I).

Examples of such (meth)acrylic compound include (meth)acrylic compounds having a C5-C20 alicyclic hydrocarbon group. The resin obtained from monomer (a1) which has a bulky structure such as the above-mentioned alicyclic hydrocarbon group can provide a photoresist pattern with improved resolution.

The monomer (a1) has preferably one or both of the groups represented by formulae (1) and (2).

Examples of a structural unit derived from the (meth)acrylic compounds having the group of formula (1) include preferably a structural unit represented by formula (a1-0), a structural unit represented by formula (a1-1) and a structural unit represented by formula (a1-2). Hereinafter, the structural unit represented by formula (a1-0), the structural unit represented by formula (a1-1) and the structural unit represented by formula (a1-2) are respectively referred to as "structural unit (a0-1)", "structural unit (a1-1)" and "structural unit (a1-2)". The monomers from which the structural units (a0-1), (a1-1) and (a1-2) are derived are respectively referred to as "monomer (a0-1)", "monomer (a1-1)" and "monomer (a1-2)".

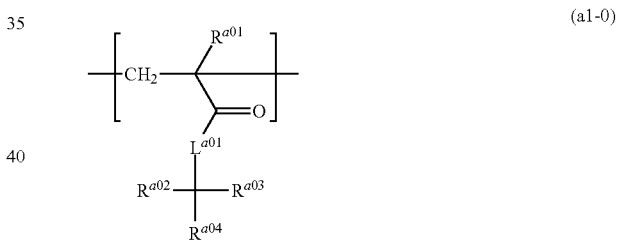
(a1-0)

where $L^{a01}$ represents —O— or *—O—(CH$_2$)$_{k01}$—CO—O— in which k01 represents an integer of 1 to 7 and * represents a binding site to —CO—, $R^{a01}$ represents a hydrogen atom or a methyl group, $R^{a02}$, $R^{a03}$ and $R^{a04}$ each independently represent a C1-C8 alkyl group, C3-C18 monovalent alicyclic hydrocarbon group, or a group formed by combining them provided that the alkyl group is not attached to the alicyclic hydrocarbon group at its binding position.

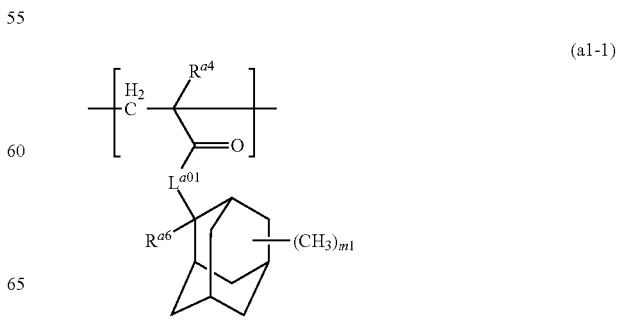
(a1-1)

-continued

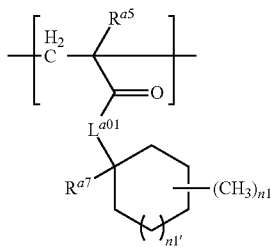
(a1-2)

where $L^{a1}$ and $L^{a2}$ each independently represent —O— or *—O—$(CH_2)_{k1}$—CO—O— in which k1 represents an integer of 1 to 7 and * represents a binding site to —CO—, $R^{a4}$ and $R^{a5}$ each independently represent a hydrogen atom or a methyl group, $R^{a6}$ and $R^{a7}$ each independently represent a C1-C8 alkyl group, C3-C20 monovalent alicyclic hydrocarbon group, or a group formed by combining them, m1 represents an integer of 0 to 14, n1 represents an integer of 0 to 10, and n1' represents an integer of 0 to 3.

In formula (a0-1), $L^{a01}$ represents preferably —O— or *—O—$(CH_2)_{k01}$—CO—O— in which k01 represents an integer of 1 to 4 and * represents a binding site to —CO—, and $L^{a01}$ represents more preferably —O—.

The alkyl groups represented by $R^{a02}$, $R^{a03}$ and $R^{a04}$ include a methyl group, an ethyl group, a propyl group, a butyl group, a pentyl group, a hexyl group, a heptyl group and an octyl group, and preferably C1-C6 alkyl group.

The alicyclic hydrocarbon group represented by $L^{a6}$ and $L^{a7}$ may be a monocyclic or polycyclic one, examples of which include a cycloalkyl group such as a cyclopentyl group, a cyclohexyl group, a cycloheptyl group, or a cycoctyl group; and a polycyclic saturated hydrogencarbon group such as a decahydronaphthyl group, an adamantyl group, a norbornyl group, and the followings.

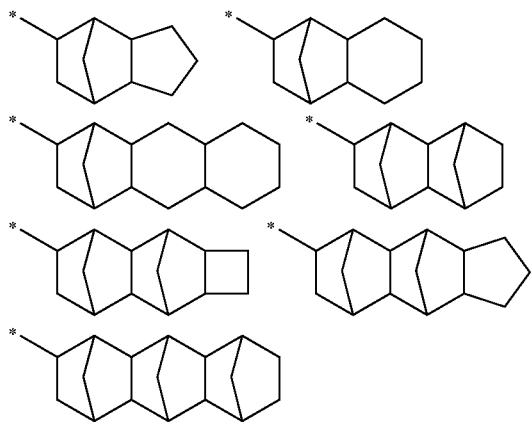

The alicyclic hydrocarbon group has preferably 3 to 18 carbon atoms, more preferably 3 to 6 carbon atoms.

In formula (a0-1), the group formed by combining the alkyl group with the alicyclic hydrocarbon group has preferably 18 or less carbon atoms in total, examples of which include methylcyclohexyl group, dimethylcyclohexyl group, and a methylnorbornyl group. Preferably, $R^{a02}$, $R^{a03}$ and $R^{a04}$ each independently represent a C1-C6 alkyl group, or two of $R^{a02}$, $R^{a03}$ and $R^{a04}$ each independently represent a C1-C6 alkyl group while the other represent a C5-C12 alicyclic hydrocarbon group.

More preferably, $R^{a02}$, $R^{a03}$ and $R^{a04}$ each independently represent a methyl group, an ethyl group or a propyl group, or two of $R^{a02}$, $R^{a03}$ and $R^{a04}$ each independently represent a methyl group, an ethyl group or a propyl group while the other represent a cyclohexyl group or an adamantyl group.

Specific examples of Monomer (a0-1) include those represented by formulae (a0-1-1) to (a0-1-12) and what are represented by the formulae where a methacroyl group has been replaced by an acroyl group in each of formulae (a0-1-1) to (a0-1-12).

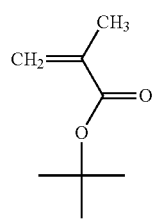
(a1-0-1)

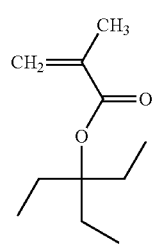
(a1-0-2)

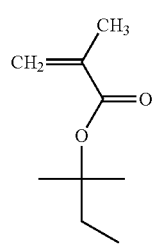
(a-1-0-3)

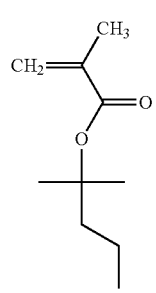
(a1-0-4)

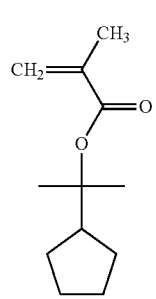
(a1-0-5)

(a1-0-6) 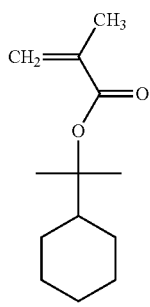

(a1-0-7) 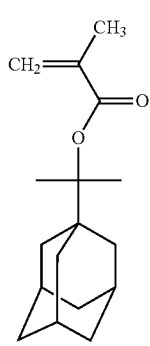

(a1-0-8) 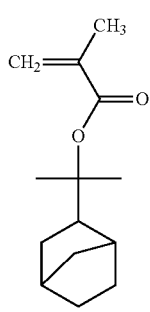

(a1-0-9) 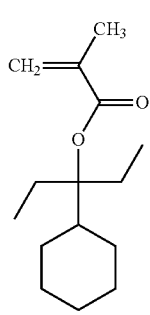

(a1-0-10) 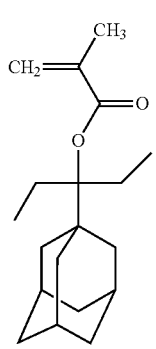

(a1-0-11) 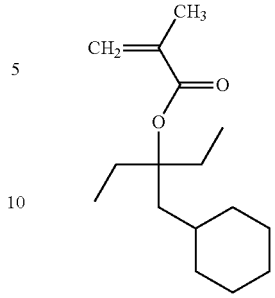

(a1-0-12) 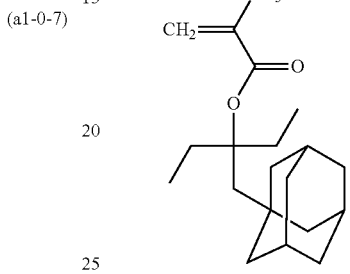

Among them, monomers represented by formulae (a0-1-1) to (a0-1-1 0) are preferred.

When Resin (A) comprises a structural unit (a0-1), the content the structural unit is usually 1 to 70% by mole, preferably 3 to 65% by mole based on 100% by mole of all the structural units of the resin.

In formulae (a1-1) and (a1-2), each of $L^{a1}$ and $L^{a2}$ is preferably —O— or *—O—$(CH_2)_{k1}$—CO—O— in which * and k1 are as defined above, and more preferably —O—.

The symbol k1 is preferably 1 to 4, more preferably 1.

$R^{a4}$ and $R^{a5}$ each preferably represent a methyl group.

Examples of the alkyl groups represented by $L^{a6}$ and $L_{a1}$ include the same as referred to for $R^{a02}$, $R^{a03}$ and $R^{a04}$, and preferably C1-C6 alkyl group.

The alicyclic hydrocarbon group represented by $L^{a6}$ and $L^{a7}$ may be a monocyclic or polycyclic one, examples of which include the same as referred to for $R^{a02}$, $R^{a03}$ and $R^{a04}$. The alicyclic hydrocarbon group represented by $L^{a6}$ and $L^{a7}$ has preferably 3 to 8 carbon atoms, more preferably 3 to 6 carbon atoms.

For formulae (a1-1) and (a1-2), examples of the group formed by combining the alkyl group with the alicyclic hydrocarbon group include methylcyclohexyl group, dimethylcyclohexyl group, and a methylnorbornyl group.

In the formula (a1-1), m1 is preferably an integer of 0 to 3, and is more preferably 0 or 1. In the formula (a1-2), n1 is preferably an integer of 0 to 3, more preferably 0 or 1, and n1' is preferably an integer of 0 or 1.

Examples of the monomer represented by the formula (a1-1) include the compounds mentioned in JP2010-204646A1. As the monomer represented by the formula (a1-1), preferred are monomers represented by formulae (a1-1-1), (a1-1-2), (a1-1-3), (a1-1-4), (a1-1-5), (a1-1-6), (a1-1-7) and (a1-1-8), and more preferred are monomers represented by formulae (a1-1-1), (a1-1-2), (a1-1-3) and (a1-1-4).

(a1-1-1) 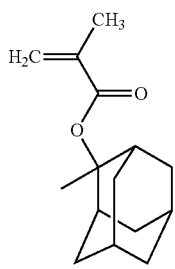

(a1-1-2) 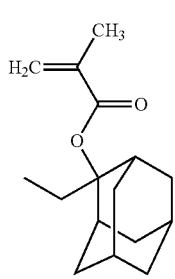

(a1-1-3) 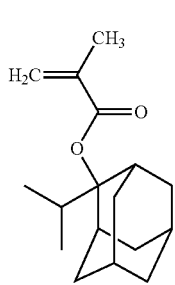

(a1-1-4) 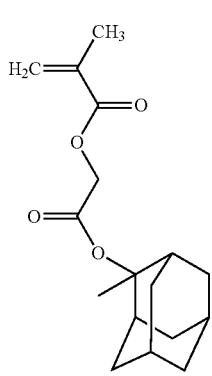

(a1-1-5) 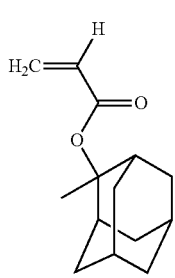

(a1-1-6) 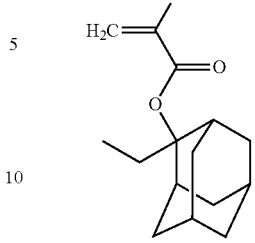

(a1-1-7) 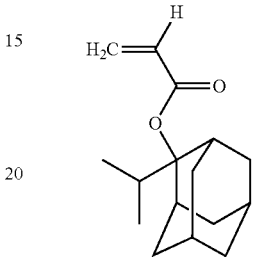

(a1-1-8) 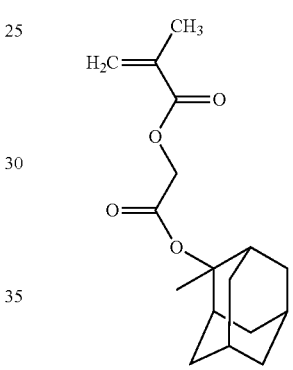

Examples of monomers (a1-2) include compounds such as 1-methylcyclopentane-1-yl (meth)acrylate, 1-ethylcyclopentane-1-yl (meth)acrylate, 1-methylcyclohexan-1-yl (meth)acrylate, 1-ethylcyclohexan-1-yl (meth)acrylate, 1-ethylcycloheptan-1-yl (meth)acrylate, 1-ethylcyclooctan-1-yl (meth)acrylate, 1-isopropylcyclopentane-1-yl (meth)acrylate and 1-isopropylcyclohexan-1-yl (meth)acrylate.

As the monomer (a1-2), preferred are those represented by formulae (a1-2-1), (a1-2-2), (a1-2-3), (a1-2-4), (a1-2-5), (a1-2-6), (a1-2-7), (a1-2-8), (a1-2-9), (a1-2-10), (a1-2-11) and (a1-2-12), more preferred are those represented by formulae (a1-2-3), (a1-2-4), (a1-2-9) and (a1-2-10), more preferred are those represented by formulae (a1-2-3) and (a1-2-9).

(a1-2-1) 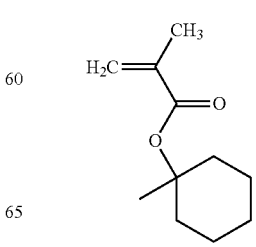

(a1-2-2) 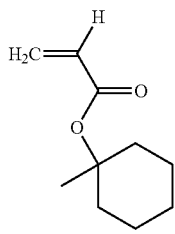

(a1-2-3) 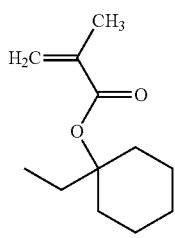

(a1-2-4) 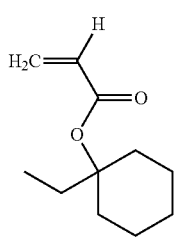

(a1-2-5) 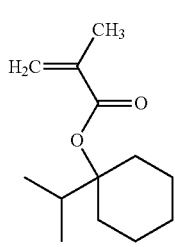

(a1-2-6) 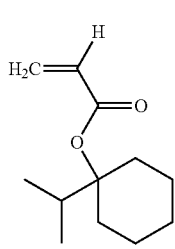

(a1-2-7) 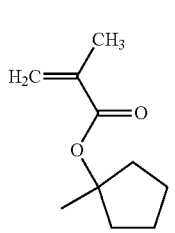

(a1-2-8) 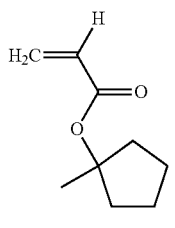

(a1-2-9) 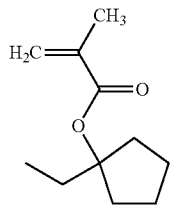

(a1-2-10) 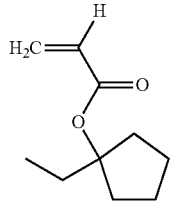

(a1-2-11) 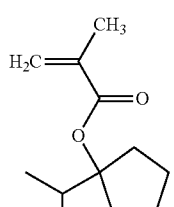

(a1-2-12) 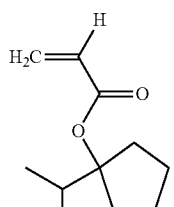

When Resin (A) comprises a structural unit (a1-1) and/or (a1-2), the content the structural unit is usually 10 to 95% by mole, preferably 15 to 90% by mole and preferably more 20 to 85% by mole based on 100% by mole of all the structural units of the resin.

Another example of the structural unit (a1) includes that represented by the formula (a-3):

(a1-3) 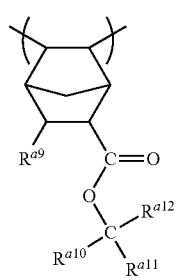

in which $R^{a9}$ represents a carboxy group, a cyano group, a hydrogen atom, —COOR$^{a13}$, or a C1-C13 monovalent aliphatic hydrocarbon group which may have a hydroxy group, $R^{a13}$ represents a C1-C8 monovalent aliphatic hydrocarbon group where a hydrogen atom can be replaced by a hydroxyl group and where a methylene group can be replaced by an oxygen atom or a carbonyl group, a C3-C20 monovalent alicyclic hydrocarbon group where a hydrogen atom can be replaced by a hydroxyl group and where a methylene group can be replaced by an oxygen atom or a carbonyl group, or a group formed by combining them, $R^{a10}$, $R^{a11}$ and $R^{a12}$ each independently represent a C1-C8 alkyl group, a C3-C20 monovalent alicyclic hydrocarbon group, a group formed by combining them, or two of $R^{a10}$, $R^{a11}$ and $R^{a12}$ are bonded to each other to jointly represent a C2-C20 divalent hydrocarbon group. Hereinafter, the structural unit represented by formula (a1-3) is referred to as "structural unit (a1-3)", and the monomer derived from the structural unit (a1-3) is referred to as "monomer (a1-3)". Examples of —COOR$^{a13}$ include those where an alkoxy group such as a methoxycarbonyl group or an ethoxycarbonyl group is bonded to a carbonyl group.

Examples of the monovalent aliphatic hydrocarbon group which may have a hydroxyl group for R$^{a9}$ include a methyl group, an ethyl group, a propyl group, a hydroxymethyl group and a 2-hydroxyethyl group. Examples of the monovalent aliphatic hydrocarbon group for R$^{a13}$ include a methyl group, ethyl group and propyl group. Examples of the monovalent alicyclic hydrocarbon group for R$^{a13}$ include a cyclopentyl group, a cyclopropyl group, and an adamantyl group.

Examples of the group formed by combining them include an adamantylmethyl group, a 1-adamantyl-1-methylethyl group, 2-oxo-oxolan-3-yl group and 2-oxo-oxolan-4-yl group.

Examples of the groups represented by R$^{a10}$, R$^{a11}$ and R$^{a12}$ include those as referred to by the alkyl group, the alicyclic hydrocarbon group and the group formed by combining them each represented by R$^{11}$, R$^{12}$ and R$^{13}$.

When R$^{a10}$ and R$^{a11}$ jointly represent a divalent hydrocarbon group, examples of the groups represented by —C(R$^{a10}$) (R$^{a11}$) (R$^{a12}$) include preferably the following ones.

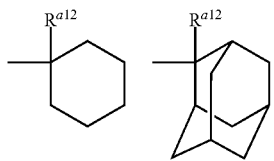

where R$^{a12}$ is as defined above.

Examples of the monomer (a1-3) include tert-butyl 5-norbornene-2-carboxylate, 1-cyclohexyl-1-methylethyl 5-norbornene-2-carboxylate, 1-methylcyclohexyl 5-norbornene-2-carboxylate, 1-methyl-2-adamantyl 5-norbornene-2-carboxylate, 2-ethyl-2-adamantyl 5-norbornene-2-carboxylate, (4-methylcyclohexyl)-1-methylethyl 5-norbornene-2-carboxylate, (4-hydroxycyclohexyl)-1-methylethyl 5-norbornene-2-carboxylate, 1-methyl-1-(4-oxocyclohexyl) ethyl 5-norbornene-2-carboxylate and (1-adamantyl)-1-methylethyl 5-norbornene-2-carboxylate.

The resin which comprises a structural unit (a1-3) has a bulky structure, so that the resin can provide a photoresist pattern with improved resolution. Such resin has a rigid norbornane ring at its main chain, so that a composition which comprises the resin can provide a film with an excellent resistance to dry etching. When the resin (A) comprises a structural unit (a1-3), its content is usually 10 to 95% by mole, preferably 15 to 90% by mole and more preferably 20 to 85% by mole based on 100% by mole of all the structural units of the resin.

Another example of the structural unit (a1) includes that represented by the formula (a1-4):

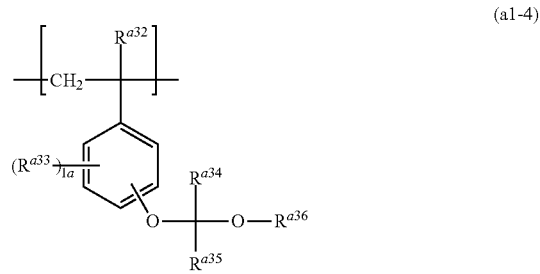

(a1-4)

wherein R$^{a32}$ represents a hydrogen atom, a halogen atom, a C1-C6 alkyl group or a C1-C6 halogenated alkyl group, R$^{a33}$ is independently in each occurrence a halogen atom, a hydroxy group, a C1-C6 alkyl group, a C1-C6 alkoxy group, a C2-C4 acyl group, a C2-C4 acyloxy group, an acryloyl group or a methacryloyl group, 1$^a$ represents an integer of 0 to 4, R$^{a34}$ and R$^{a35}$ each independently represent a hydrogen atom or a C1-C12 hydrocarbon group, R$^{a36}$ represents a C1-C20 aliphatic hydrocarbon group in which a methylene group can be replaced by —O— or —S—, and R$^{a35}$ and R$^{a36}$ are bonded to each other to jointly represent a C2-C20 divalent hydrocarbon group in which a methylene group can be replaced by —O— or —S—.

Hereinafter, the structural unit represented by formula (a1-4) is referred to as "structural unit (a1-4)".

Examples of the alkyl group represented by R$^{a32}$ and R$^{a33}$ include a methyl group, an ethyl group, a propyl group, a butyl group, a pentyl group, and a hexyl group, preferably a C1-C4 alkyl group, more preferably a methyl group and an ethyl group, and still more preferably a methyl group.

Examples of the alkoxy group represented by R$^{a33}$ include a methoxy group, an ethoxy group, a propoxy group, an isopropoxy group, a butoxy group, an isobutoxy group, a sec-butoxy group, a tert-butoxy group, a pentyloxy group and a hexyloxy group. Examples of the acyl group represented by R$^{a33}$ include an acetyl group, a propyonyl group and a butyryl group, and examples of the acyloxy group represented by R$^{a33}$ include an acetyloxy group, a propyonyloxy group and a butyryloxy group.

Examples of halogen atom represented by R$^{a32}$ and R$^{a33}$ include a fluorine atom, a chlorine atom, and a bromine atom.

Examples of the groups represented by R$^{a34}$ and R$^{a35}$ include those as referred to for R$^{14}$ and R$^{15}$.

Examples of the groups represented by R$^{a36}$ include those as referred to for R$^{16}$.

R$^{a32}$ preferably represents a hydrogen atom.

R$^{a33}$ is preferably a C1-C4 alkoxy group, more preferably a methoxy group and an ethoxy group, and still more preferably a methoxy group.

The "1a" preferably represents 0 or 1, more preferably 1.

R$^{a34}$ preferably represents a hydrogen atom.

R$^{a35}$ is preferably a C1-C12 monovalent hydrocarbon group, more preferably a methyl group and an ethyl group.

The hydrocarbon group represented by R$^{a36}$ includes a C1-C18 alkyl group, a C3-C18 monovalent alicyclic hydrocarbon group, a C6-C18 monovalent aromatic hydrocarbon group, and any combination of them, and preferably a C1-C18 alkyl group, a C3-C18 monovalent alicyclic hydrocarbon group and a C7-C18 aralkyl group. These groups may be unsubstituted or substituted. The alkyl group and the monovalent alicyclic hydrocarbon group are preferably unsubstituted. As the substituent for the monovalent aromatic hydrocarbon group, a C6-C10 aryloxy group is preferred.

Examples of the monomer from which the structural unit (a1-4) is derived include monomers recited in JP2010-204646A1. Among them, the monomers represented by formulae (a1-4-1), (a1-4-2), (a1-4-3), (a1-4-4), (a1-4-5), (a1-4-6) and (a1-4-7) are preferred, and the monomers represented by formulae (a1-4-1), (a1-4-2), (a1-4-3), (a1-4-4) and (a1-4-5) are more preferred.

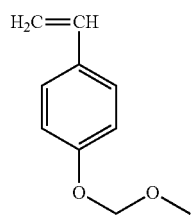
(a1-4-1)

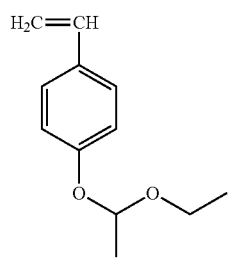
(a1-4-2)

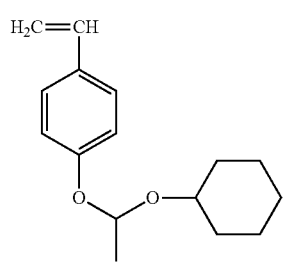
(a1-4-3)

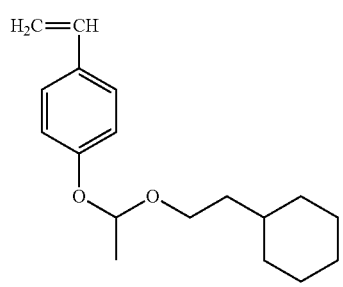
(a1-4-4)

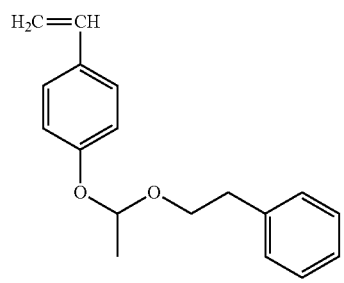
(a1-4-5)

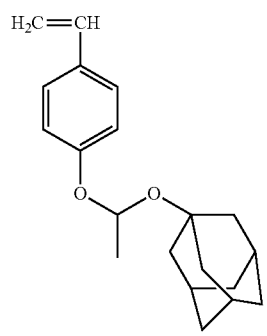
(a1-4-6)

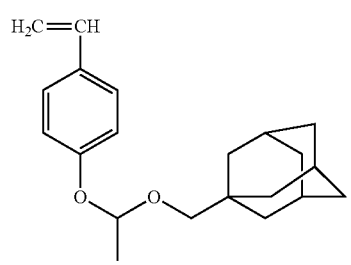
(a1-4-7)

When Resin (A) comprises a structural unit (a1-4), its content is usually 10 to 95% by mole, preferably 15 to 90% by mole and more preferably 20 to 85% by mole based on 100% by mole of all the structural units of the resin.

Another example of the structural unit (a1) includes that represented by the formula (a-5).

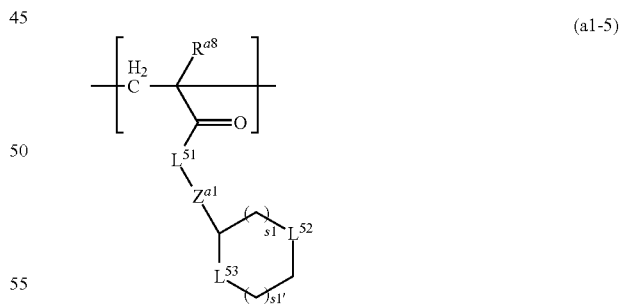
(a1-5)

Hereinafter, the structural unit represented by formula (a1-5) is referred to as "structural unit (a1-5)".

In formula (I-5), $R^{a8}$ represents a hydrogen atom, a halogen atom, or a C1-C6 alkyl group which may have a halogen atom, $Z^{a1}$ represents a single bond or *—$(CH_2)_{h3}$—CO-$L^{54}$- in which h3 represents an integer of 1 to 4 and * represents a binding site to L51, $L^{51}$, $L^{52}$, $L^{53}$ and $L^{54}$ each independently represent an oxygen atom or a sulfur atom, s1 represents an integer of 1 to 3, and s1' represents an integer of 0 to 3.

In the formula (a-5), examples of halogen atom include a fluorine atom or a chlorine atom, preferably a fluorine atom.

Examples of alkyl group having a halogen atom include alkyl groups such as a methyl group, an ethyl group, a propyl group, a butyl group, a pentyl group, a hexyl group, and fluoroalkyl groups such as a fluoromethyl group and a trifluoromethyl group.

$R^{a8}$ preferably represents a hydrogen atom, a methyl group, or a trifluoromethyl group.

$L^{51}$ preferably represents an oxygen atom.

It is preferred that one of $L^{52}$ and $L^{53}$ represents an oxygen atom, while the other represents a sulfur atom.

s1 preferably represents 1. s1' represents an integer of 0 to 2.

$Z^1$ preferably represents a single bond or *—$CH_2$—CO—O— wherein * represents a binding site to $L^{51}$.

Examples of the monomer from which the structural unit (a-5) is derived include the following ones:

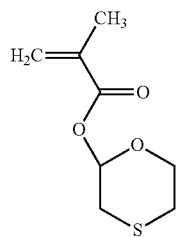
(a1-5-1)

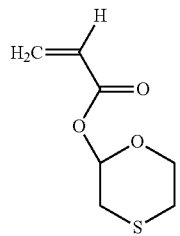
(a1-5-2)

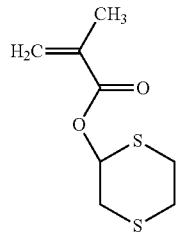
(a1-5-3)

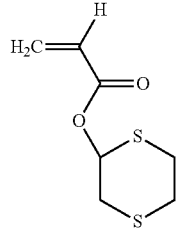
(a1-5-4)

When Resin (A) comprises a structural unit (a-5), its content is usually 1 to 50% by mole, preferably 3 to 45% by mole and more preferably 5 to 40% by mole based on 100% by mole of all the structural units of the resin.

The structural unit (a1) is preferably one selected from the group consisting of structural units (a1-0), (a1-1), (a1-2) and (a1-5), more preferably one selected from the group consisting of structural units (a1-1), (a1-2) and (a1-5), and still more preferably the structural unit (a1-1).

Resin (A) comprises preferably two or more structural units selected from the group consisting of structural units (a1-1), (a1-2) and (a1-5), and more preferably both the structural unit (a1-1) and the structural unit (a1-2) and/or (a1-5). Resin (A) comprises preferably the structural unit (a1-1).

<Structural Unit Having No Acid-Labile Group>

The structural unit (s), that is one having no acid-labile group, is derived from a monomer having no acid-labile group. Monomers which have been known to in the art can be used as such monomer and they are not limited to any specific one, provided that it has no acid-labile group.

The structural unit (s) preferably has a hydroxyl group or a lactone ring. When the resin comprises a structural unit (s) having a hydroxyl group or a lactone ring, a photoresist composition capable of providing a photoresist film with good resolution and adhesiveness of photoresist to a substrate can be obtained.

Hereinafter, the structural unit (s) having a hydroxy group is referred to as "structural unit (a2)", and the structural unit (s) having a lactone ring is referred to as "structural unit (a3)".

The hydroxy group which the structural unit (a2) has may be an alcoholic hydroxy group or a phenolic hydroxy group.

When KrF excimer laser (wavelength: 248 nm) lithography system, or a high energy laser such as electron beam and extreme ultraviolet is used as an exposure system, the resin which comprises the structural unit (a2) having a phenolic hydroxy group is preferred. When ArF excimer laser (wavelength: 193 nm) is used as an exposure system, the resin which comprises the structural unit (a2) having an alcoholic hydroxy group is preferred and the resin which comprises the structural unit (a2-1) described later is more preferred.

Resin (A) may comprise one or more of the structural units (a2).

Examples of the structural unit (a2) having a phenolic hydroxy group include one represented by the formula (a2-0):

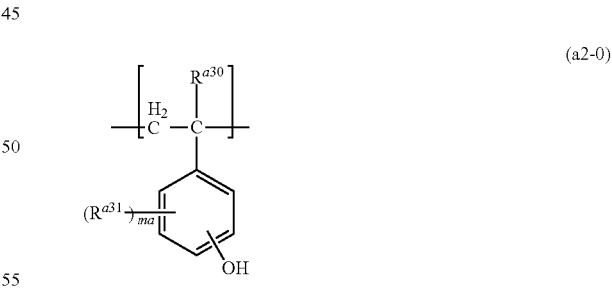
(a2-0)

In formula (a2-0), $R^{a30}$ represents a hydrogen atom, a halogen atom, a C1-C6 alkyl group or a C1-C6 halogenated alkyl group, $R^{a31}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, In the formula (a2-0), examples of the halogen atom include a fluorine atom, a chlorine atom, a bromine atom or iodine atom, examples of the C1-C6 alkyl group include a methyl group, an ethyl group, a propyl group, an isopropyl group, a n-butyl group, an isobutyl group, a sec-butyl group, a tert-butyl group, a pentyl group and a hexyl group, and a C1-C4 alkyl group is preferred and a C1-C2 alkyl group is more preferred and a methyl group is especially preferred. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferred and a C1-C2 alkoxy group is more preferred and a methoxy group is especially preferred. Examples of the C2-C4 acyl group include an acetyl group, a propyonyl group and a butyryl group, and examples of the C2-C4 acyloxy group include an acetyloxy group, a propyonyloxy group and a butyryloxy group.

In the formula (a2-0), ma is preferably 0, 1 or 2, and is more preferably 0 or 1, and especially preferably 0.

Examples of the monomer from which the structural unit (a2-0) is derived include compounds mentioned in JP2010-204634A1. Among them, the structural units represented by formulae (a2-0-1), (a2-0-2), (a2-0-3) and (a2-0-4) are preferred as the structural unit (a2-0), and those represented by formulae (a2-0-1) and (a2-0-2) are more preferred.

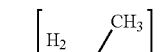

(a2-0-1)

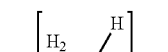

(a2-0-2)

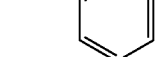

(a2-0-3)

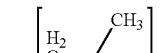

(a2-0-4)

Resin (A) which comprises a structural units represented by formula (a2-0) can be produced, for example, by polymerizing a monomer where its phenolic hydroxyl group has been protected with a suitable protecting group, followed by deprotection. Examples of the protecting group for a phenolic hydroxyl group include an acetyl group.

When Resin (A) comprises the structural unit (a2-0), its content is usually 5 to 95% by mole and preferably 10 to 85% by mole and more preferably 15 to 80% by mole based on all the structural units of the resin.

Examples of the structural unit (a2) having an alcoholic hydroxy group include one represented by the formula (a2-1):

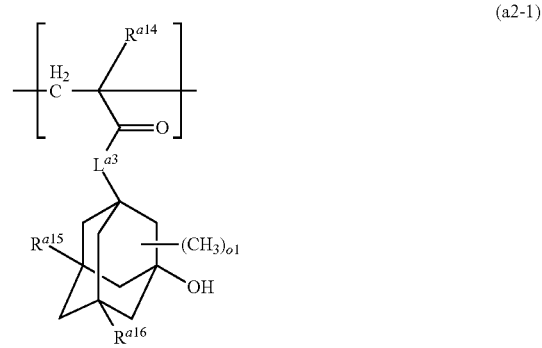

(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and o1 represents an integer of 0 to 10. Hereinafter, the structural unit represented by formula (a2-1) is referred to as "structural unit (a2-1)".

In the formula (a2-1), $R^{a14}$ is preferably a methyl group. $R^{a15}$ is preferably a hydrogen atom. $R^{a16}$ is preferably a hydrogen atom or a hydroxyl group. $L^{a3}$ is preferably *—O— or *—O—$(CH_2)_{f2}$—CO—O— in which * represents a binding position to —CO—, and f2 represents an integer of 1 to 4, is more preferably *—O— and *—O—$CH_2$—CO—O—, and is still more preferably *—O—, and o1 is preferably 0, 1, 2 or 3 and is more preferably 0 or 1.

Examples of monomers from which the structural unit (a2-1) is derived include compounds mentioned in JP2010-204646A.

Preferred examples of the monomer include those represented by formulae (a2-1-1) to (a2-1-6).

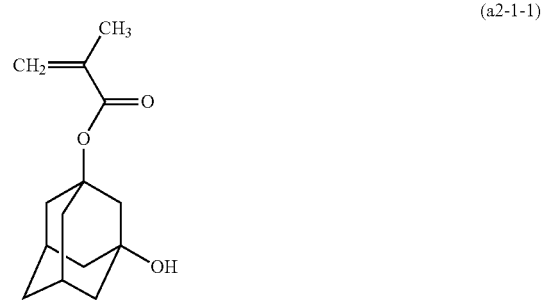

(a2-1-1)

(a2-1-2)

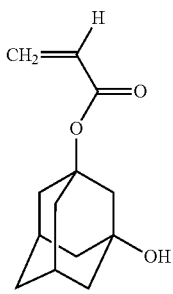

(a2-1-3)

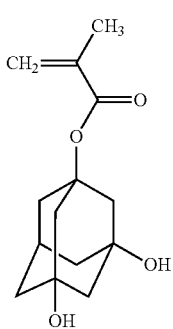

(a2-1-4)

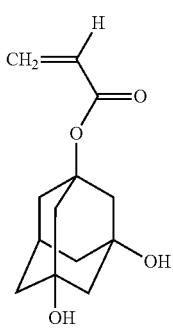

(a2-1-5)

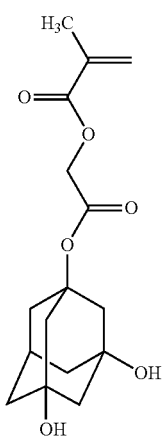

(a2-1-6)

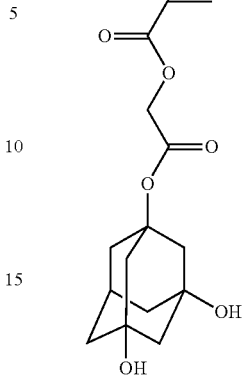

Among them, more preferred are the monomers represented by formulae (a2-1-1), (a2-1-2), (a2-1-3) and (a2-1-4), still more preferred are monomers represented by formulae (a2-1-1) and (a2-1-3).

When Resin (A) comprises the structural unit (a2-1), its content is usually 1 to 45% by mole, preferably 1 to 40% by mole, and more preferably 1 to 35% by mole, and especially preferably 2 to 20% by mole, based on all the structural units of the resin.

Examples of the lactone ring which the structural unit (a3) has include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferred examples of structural unit (a3) include those represented by the formulae (a3-1), (a3-2), (a3-3) and (a3-4):

(a3-1)

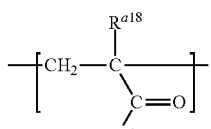
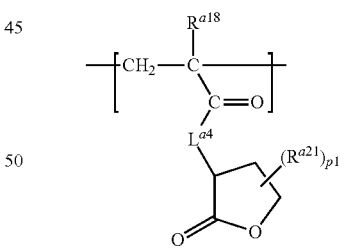

(a3-2)

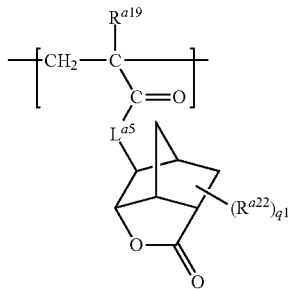

-continued

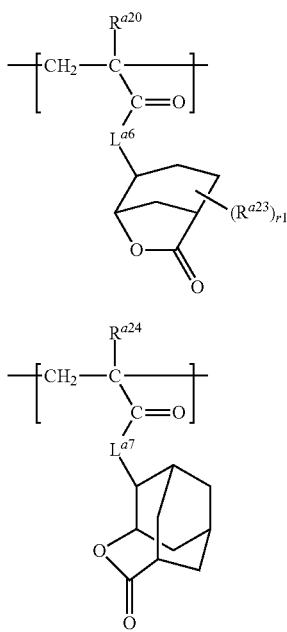

(a3-3)

(a3-4)

In formulae, $L^{a4}$, $L^{a5}$ and $L^{a6}$ each independently represent *—O— or *—O—(CH$_2$)$_{k3}$—CO—O— in which * represents a binding position to —CO— and k3 represents an integer of 1 to 7, $R^{a18}$, $R^{a19}$ and $R^{a20}$ each independently represent a hydrogen atom or a methyl group, $R^{a21}$ represents a C1-C4 monovalent aliphatic hydrocarbon group, $R^{a22}$ and $R^{a23}$ are independently in each occurrence a carboxyl group, a cyano group or a C1-C4 monovalent aliphatic hydrocarbon group, $R^{a24}$ each independently represent a hydrogen atom, a halogen atom, or a C1-C6 alkyl group which may have a halogen atom, $L^{a1}$ represents a single bond, *$^1$-L$^{a8}$-O—, *$^1$-L$^{a8}$-CO—O—, *$^1$-L$^{a8}$-CO—O-L$^{a9}$-CO—O— or *$^1$-L$^{a8}$-CO—O-L$^{a9}$-O— in which $L^{a8}$ and $L^{a9}$ each independently represent C1-C6 divalent alkanediyl group,

*$^1$ represents a binding position to —O—, and p1 represents an integer of 0 to 5, q1 and r1 independently each represent an integer of 0 to 3.

Examples of halogen atom represented by $R^{a24}$ include a fluorine atom, a chlorine atom, a bromine atom and an iodine atom. Examples of the alkyl group represented by $R^{a24}$ include a methyl group, an ethyl group, a propyl group, a butyl group, a pentyl group, and a hexyl group, preferably a C1-C4 alkyl group, and more preferably a methyl group and an ethyl group.

As to $R^{a24}$, examples of the alkyl group which has an halogen atom include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a trichloromethyl group, a tribromomethyl group, and a triiodomethyl group.

As to $L^{a8}$ and $L^{a9}$, examples of the alkanediyl group include a methylene group, an ethylene group, a propane-1,3-diyl group, a butane-1,4-diyl group, a pentane-1,5-diyl group and a hexane-1,6-diyl group, a butane-1,3-diyl group, 2-methylpropane-1,3-diyl group, a 2-methylpropane-1,2-diyl group, a pentane-1,4-diyl group and a 2-methylbutane-1,4-diyl group.

It is preferred that $L^{a4}$, $L^{a5}$ and $L^{a6}$ each independently represent *—O— or *—O—(CH$_2$)$_{d1}$—CO—O— in which * represents a binding position to —CO— and d1 represents an integer of 1 to 4, and it is more preferred that $L^{a4}$, $L^{a5}$ and $L^{a6}$ are *—O— and *—O—CH$_2$—CO—O—, and it is still more preferred that $L^{a4}$, $L^{a5}$ and $L^{a6}$ are *—O—.

$R^{a18}$, $R^{a19}$, $R^{a20}$ and $R^{a21}$ are preferably methyl groups. It is preferred that $R^{a22}$ and $R^{a23}$ are independently in each occurrence a carboxyl group, a cyano group or a methyl group.

It is preferred that p1, q1 and r1 each independently represent an integer of 0 to 2, and it is more preferred that p1, q1 and r1 each independently represent 0 or 1.

$R^{a24}$ is preferably a hydrogen atom or a C1-C4 alkyl group, more preferably a hydrogen atom, a methyl group or an ethyl group, and still more preferably a hydrogen atom or a methyl group.

$L^{a7}$ represents preferably a single bond or *$^1$-L$^{a8}$-CO—O—, more preferably a single bond, *$^1$—CH$_2$—CO—O— or *$^1$—C$_2$H$_4$—CO—O—.

Examples of the monomer from which the structural unit (a3) is derived include those mentioned in JP2010-204646A, JP2000-122294A and JP2012-41274A. As the structural unit (a3), preferred are those represented by the formulae (a3-1-1) to (a3-1-4), the formulae (a3-2-1) to (a3-2-4), the formulae (a3-3-1) to (a3-3-4) and the formulae (a3-4-1) to (a3-4-6), more preferred are those represented by the formulae (a3-1-1), (a3-1-2), (a3-2-3) and (a3-2-4), and still more preferred are those represented by the formulae (a3-1-1) and (a3-2-3).

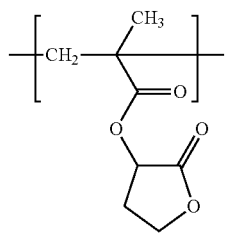

(a3-1-1)

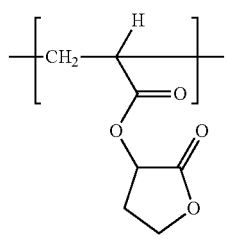

(a3-1-2)

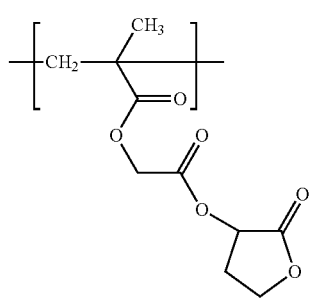

(a3-1-3)

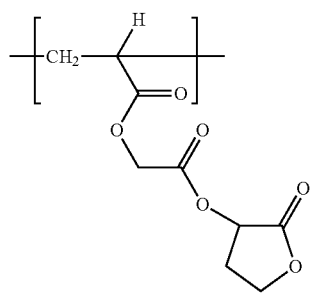
(a3-1-4)
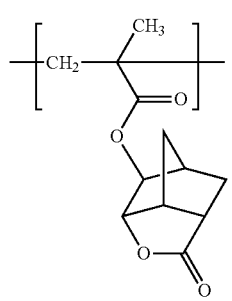
(a3-2-1)
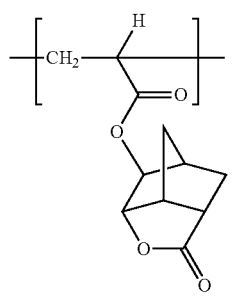
(a3-2-2)
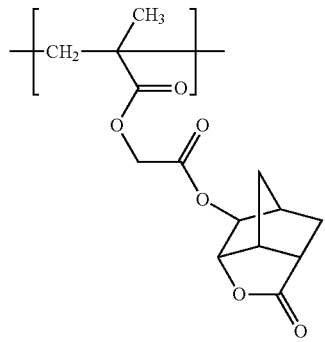
(a3-2-3)
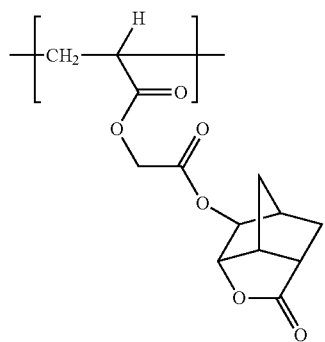
(a3-2-4)
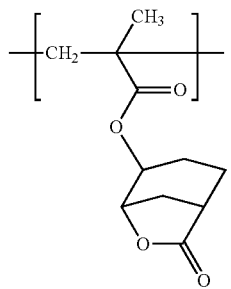
(a3-3-1)
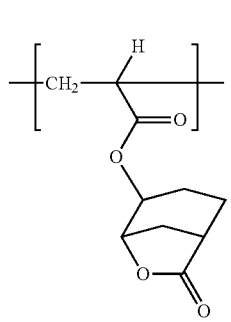
(a3-3-2)
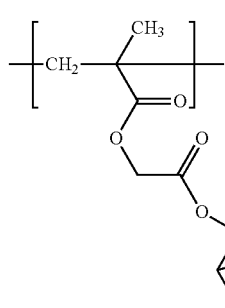
(a3-3-3)
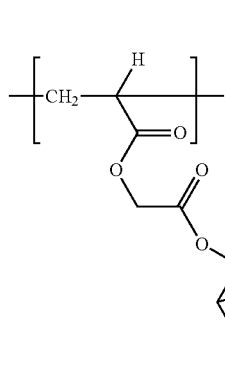
(a3-3-4)
(a3-4-1)

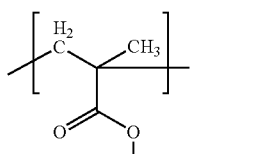
(a3-4-2)

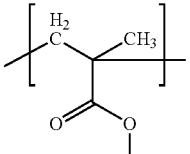
(a3-4-5)

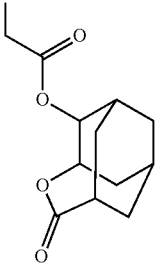

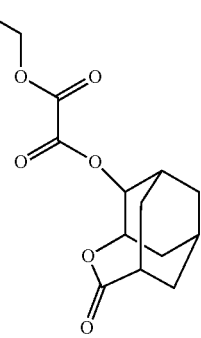
(a3-4-6)

(a3-4-3)

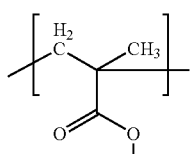

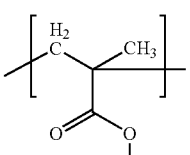

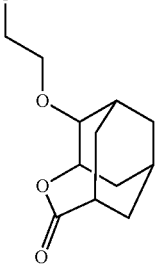

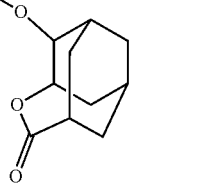

Specific examples of the structural unit (a3) include those where methyl groups of formulae (a3-4-1) to (a3-4-6) are replaced by hydrogen atoms.

When Resin (A) comprises the structural unit (a3), its content thereof is preferably 5 to 70% by mole, and more preferably 10 to 65% by mole and more preferably 10 to 60% by mole, based on all the structural units of the resin.

Examples of the structural unit having no acid-labile group include a structural unit having no acid-labile group but having a halogen atom. Hereinafter, the structural unit having no acid-labile group but having a halogen atom is referred to as "structural unit (a4)". Halogen atoms for the structural unit (a4) may be a fluorine atom, a chlorine atom, a bromine atom, or an iodine atom. The structural unit (a4) has preferably a fluorine atom.

Examples of the structural unit (a4) include a compound represented by formula (a4-0):

(a3-4-4)

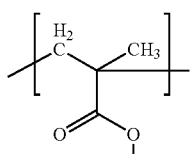

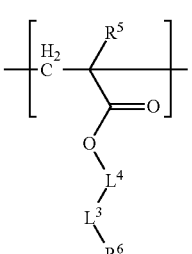

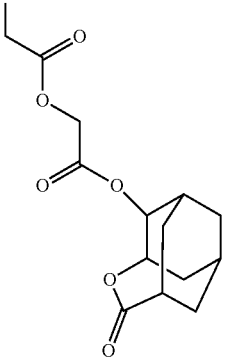

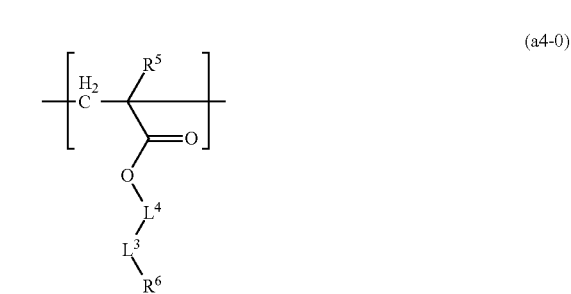
(a4-0)

wherein $R^5$ represents a hydrogen atom or a methyl group;
$L^4$ represents a single bond or a C1-C4 aliphatic saturated hydrocarbon group, preferably a C1-C4 aliphatic saturated hydrocarbon group;
$L^3$ represents a C1-C8 perfluoroalkanediyl group or a C3-C10 divalent alicyclic perfluorocarbon group, preferably a C3-C10 divalent alicyclic perfluorocarbon group;
$R^6$ represents a hydrogen atom or a fluorine atom.

Examples of the perfluoroalkanediyl group for $L^3$ include a difluoromethylene group, a perfluoroethylene group, a (perfluoroethyl) fluorometylene group, a perfluoropropane-1,3-diyl group, a perfluoropropane-1,2-diyl group, a perfluorobutane-1,4-diyl group, a perfluoropentane-1,5-diyl group, a perfluorohexane-1,6-diyl group, a perfluoroheptane-1,7-diyl group, and a perfluorooctane-1,8-diyl group.

$L^4$ is preferably a methylene group or an ethylene group, more preferably a methylene group.

$L^3$ is preferably a C1-C6 perfluoroalkanediyl group, more preferably a C1-C3 perfluoroalkanediyl group.

Examples of the structural unit (a4-0) include the following ones and those which a methyl group has been replaced by a hydrogen atom in each of the following formulae.

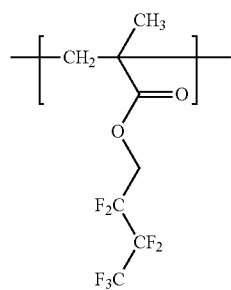
(a4-0-1)

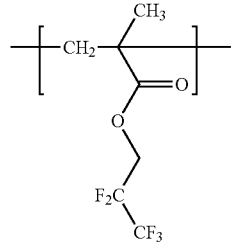
(a4-0-2)

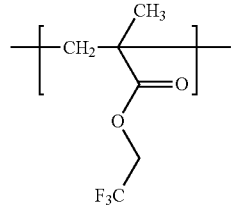
(a4-0-3)

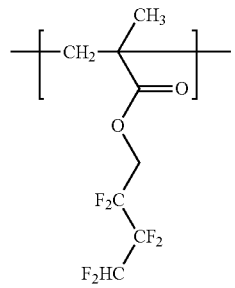
(a4-0-4)

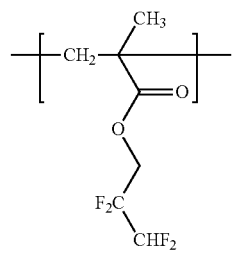
(a4-0-5)

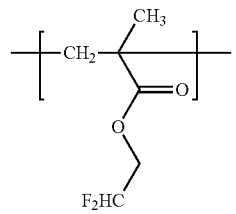
(a4-0-6)

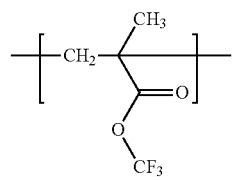
(a4-0-7)

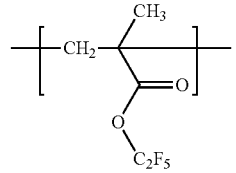
(a4-0-8)

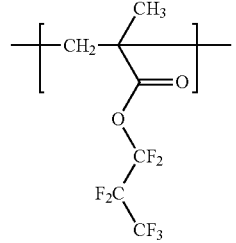
(a4-0-9)

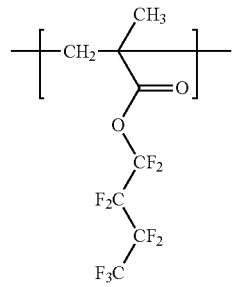
(a4-0-10)

(a4-0-11)

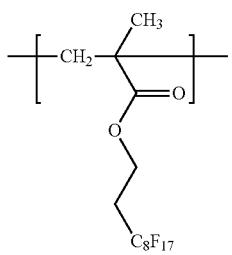

(a4-0-12)

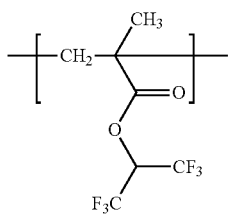

(a4-0-13)

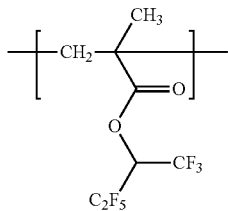

(a4-0-14)

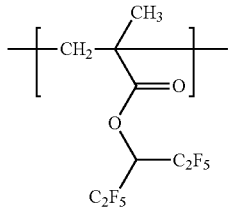

(a4-0-15)

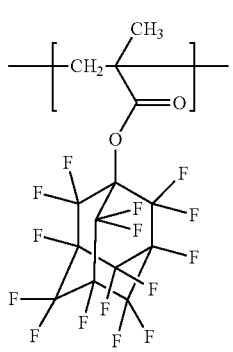

(a4-0-16)

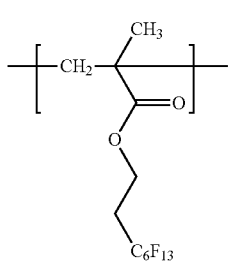

Examples of the structural unit (a4) include a compound represented by formula (a4-1):

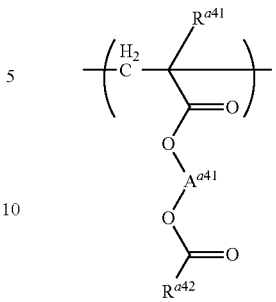

(a4-1)

wherein $R^{a41}$ represents a hydrogen atom or a methyl group; $A^{a41}$ represents a C1-C6 divalent alkanediyl group which may have a substituent or a moiety represented by formula (a-g1):

$$—A^{a42}—(X^{a41}—A^{a43})_s—X^{a42}—A^{a44}—$$ (a-g1)

in which s represents an integer of 0 to 1,
$A^{a42}$ and $A^{a43}$ respectively represent a C1-C5 divalent hydrocarbon group which may have a substituent,
$X^{a41}$ and $X^{a42}$ respectively represent —O—, —CO—, —CO—O—, or —O—CO—, provided that the sum of carbon atoms of $A^{a42}$, $A^{a43}$, $A^{a44}$, $X^{a41}$ and $X^{a42}$ is 6 or less;
$R^{a-42}$ represents a C1-C20 monovalent hydrocarbon group which may have a substituent, provided that each or both of $A^{a41}$ and $R^{a42}$ have a halogen atom; and
$A^{a44}$ is bonded to —O—CO—$R^{a42}$.

Examples of halogen atom for formula (a4-1) include a fluorine atom, a chlorine atom, a bromine atom and an iodine atom.

The divalent hydrocarbon group is preferably a divalent saturated hydrocarbon group while it may have a carbon-carbon double bond. Examples of the divalent saturated hydrocarbon group include alkandiyl groups which may be a linear or branched one, divalent alicyclic hydrocarbon groups, and combination of them.

Examples of the monovalent hydrocarbon group for $R^{a42}$ include monovalent chain or cyclic saturated hydrocarbon groups, a monovalent aromatic hydrocarbon group, and combination of them.

Examples of monovalent chain hydrocarbon group include a methyl group, an ethyl group, a propyl group, a butyl group, a pentyl group, a hexyl group, a heptyl group, an octyl group, a decyl group, a dodecyl group, a hexadecyl group, a pentadecyl group, a hexyldecyl group, heptadecyl group and an octadecyl group.

Examples of monovalent cyclic hydrocarbons include cycloalkyl groups such as a cyclopentyl group, a cyclohexyl group, a cycloheptyl group and a cyclooctyl group; and monovalent polycyclic hydrocarbon groups such as a decahyrdonaphthyl group, an adamantyl group, a norbornyl group, and the following groups where * represents a binding position.

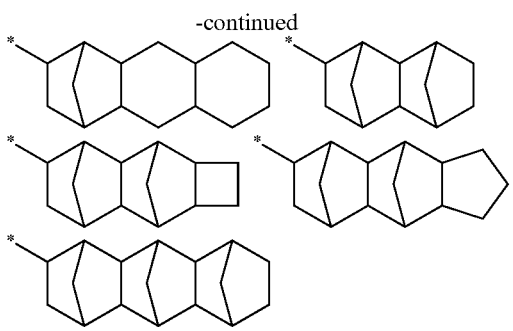

Examples of monovalent aromatic hydrocarbon groups include a phenyl group, a naphthyl group, an anthryl group, a biphenylyl group, a phenanthryl group and a fluorenyl group.

The monovalent hydrocarbon group for $R^{a42}$ is preferably monovalent chain and cyclic hydrocarbon groups and combination of them, which may have a carbon-carbon double bond, and more preferably a monovalent chain hydrocarbon group and cyclic hydrocarbon group and combination of them.

$R^{a42}$ is preferably a monovalent aliphatic hydrocarbon group which has a substituent, more preferably a monovalent aliphatic hydrocarbon group which has a halogen atom and/or a group represented by formula (a-g3).

$$-X^{a43}-A^{a45} \quad (a\text{-}g3)$$

in which $X^{a43}$ represents an oxygen atom, a carbonyl group, a carbonyloxy group or an oxycarbonyl group,
$A^{a45}$ represents a C3-C17 monovalent saturated hydrocarbon group which may have a fluorine atom.

When $R^{a42}$ is a monovalent saturated hydrocarbon group which has a group represented by formula (a-g3), $R^{a42}$ has preferably 15 or less carbon atoms, more preferably 12 or less carbon atoms in total including the carbon atoms of formula (a-g3). If $R^{a42}$ has a group represented by formula (a-g3), the number of the group is preferably 1.

The monovalent saturated hydrocarbon group which has a group represented by formula (a-g3) is preferably a compound represented by formula (a4-g2):

$$-A^{a46}-X^{a44}-A^{a47} \quad (a\text{-}g2)$$

in which $A^{a46}$ represents a C3-C17 divalent saturated hydrocarbon group which may have a fluorine atom, $X^{a44}$ represents a carbonyloxy group or an oxycarbonyl group, and $A^{a47}$ represents a C3-C17 divalent saturated hydrocarbon group which may have a fluorine atom, provided that $A^{a46}$, $A^{a47}$ and $X^{a44}$ have 18 or less of carbon atoms in total and one or both of $A^{a46}$ and $A^{a47}$ have a fluorine atom.

The halogen-containing saturated hydrocarbon group represented by $R^{a42}$ is preferably a monovalent fluorine-containing saturated hydrocarbon group, more preferably a perfluoroalkyl group or a perfluorocycloalkyl group, still more preferably a C1-C6 perfluoroalkyl group, and further more preferably a C1-C3 perfluoroalkyl group.

Examples of perfluoroalkyl group include a perfluoromethyl group, a perfluoroethyl group, a perfluoropropyl group, a perfluorobutyl group, a perfluoropentyl group, a perfluorohexyl group, a perfluoroheptyl group, and a perfluorooctyl group. Examples of the perfluorocycloalkyl group include perfluorocyclohexyl group.

The divalent saturated hydrocarbon group represented by $A^{a46}$ has preferably 1 to 6, more preferably 1 to 3 carbon atoms.

The monovalent saturated hydrocarbon group represented by $A^{a47}$ has preferably 4 to 15, more preferably 5 to 12 carbon atoms. $A^{a47}$ is more preferably a cyclohexyl group or an adamantyl group. Examples of the moiety represented by $-A^{a46}-X^{a44}-A^{a47}$ include the following ones.

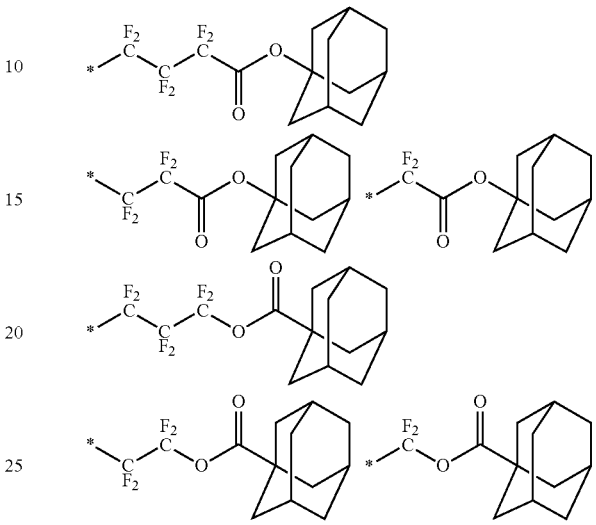

In each formula, * represents a binding position to a carbonyl group.

Examples of $A^{a41}$ typically include a C1-C6 alkanediyl group which may be a linear chain or branched chain. Specific examples of them include linear chain alkanediyl groups such as a methylene group, an ethylene group, a propane-1,3-diyl group, a butane-1,4-diyl group, a pentane-1,5-diyl group, or a hexane-1,6-diyl group; and branched chain alkanediyl groups such as a propane-1,3-diyl group, a butane-1,3-diyl group, a 1-methylbutane-1,2-diyl group, or a 2-methylbutane-1,4-diyl group. Examples of the substituents which such alkanediyl group may have include a hydroxyl group or a C1-C6 alkoxy group.

$A^{a41}$ is preferably a C1-C4 alkanediyl group, more preferably a C2-C4 alkanediyl group, and still more preferably an ethylene group. Examples of the alkanediyl group represented by $A^{a42}$, $A^{a43}$ and $A^{a44}$ include a methylene group, an ethylene group, a propane-1,3-diyl group, a butane-1,4-diyl group, a 2-methylpropane-1,3-diyl group, or a 2-methylbutane-1,4-diyl group. Examples of the substituents which such alkanediyl group may have include a hydroxyl group or a C1-C6 alkoxy group.

$X^{a42}$ represents —O—, —CO—, —CO—O—, or —O—CO—.

Examples of the moiety represented by formula (a-g1) where $X^{a42}$ is an oxygen atom include the following ones:

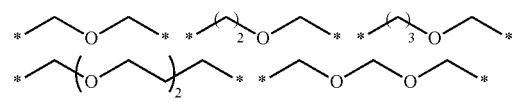

in which * represents a binding site, and the one positioned at the right side represents a binding site to —O—CO—$R^{a42}$.

Examples of the moiety represented by formula (a-g1) where $X^{a42}$ is a carbonyl group include the following ones:

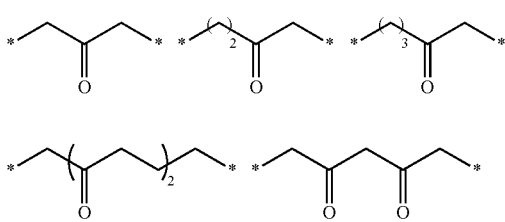

in which * represents a binding site, and the one positioned at the right side represents a binding site to —O—CO—R$^{a42}$.

Examples of the moiety represented by formula (a-g1) where X$^{a42}$ is a carbonyloxy group include the following ones:

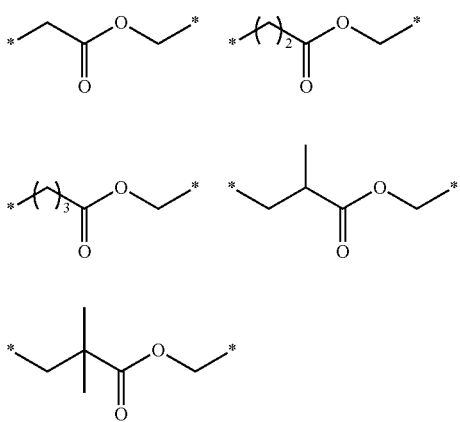

in which * represents a binding site, and the one positioned at the right side represents a binding site to —O—CO—R$^{a42}$.

Examples of the moiety represented by formula (a-g1) where X$^{a42}$ is an oxycarbonyl group include the following ones:

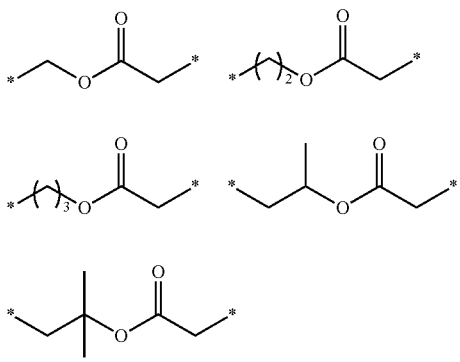

in which * represents a binding site, and the one positioned at the right side represents a binding site to —O—CO—R$^{a42}$.

The structural unit represented by formula (a-g1) is preferably one represented by formula (a4-2) or (a4-3).

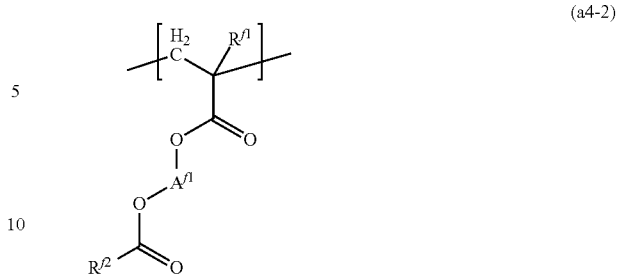

In formula, R$^{f1}$ represents a hydrogen atom or a methyl group.

A$^{f1}$ represents a C1-C6 alkanediyl group.

R$^{f2}$ represents a C1-C20, preferably C1-C10, monovalent hydrocarbon group having a fluorine atom.

The alkanediyl groups represented by A$^{f1}$ may be a linear chain or branched chain. Specific examples of them include linear chain alkanediyl groups such as a methylene group, an ethylene group, a propane-1,3-diyl group, a butane-1,4-diyl group, a pentane-1,5-diyl group, or a hexane-1,6-diyl group; and branched chain alkanediyl groups such as a propane-1,3-diyl group, a butane-1,3-diyl group, a 1-methylbutane-1,2-diyl group, or a 2-methylbutane-1,4-diyl group. Examples of the substituents which such alkanediyl group may have include a hydroxyl group or a C1-C6 alkoxy group.

The monovalent hydrocarbon group represented by R$^{f2}$ includes monovalent saturated hydrocarbon groups and monovalent aromatic hydrocarbon groups. The monovalent saturated hydrocarbon groups may be a chain or cyclic saturated hydrocarbon group, or a combined group of them.

The monovalent saturated hydrocarbon groups are preferably an alkyl group or a monovalent alicyclic hydrocarbon group.

Examples of the alkyl group include a methyl group, an ethyl group, n-propyl group, isopropyl group, n-butyl group, sec-butyl group, a tert-butyl group, a pentyl group, a hexyl group and 2-ethylhexyl group.

The monovalent alicyclic hydrocarbon groups may be monocyclic or polycyclic groups. Examples of monovalent monocyclic hydrocarbon groups include a cyclopropyl group, a cyclobutyl group, a cyclopentyl group, a cyclohexyl group, a methylcyclohexyl group, a dimethylcyclohexyl group, a cycloheptyl group, a cyclooctyl group, a cycloheptyl group and a cyclodecyl group.

Examples of monovalent polycyclic hydrocarbon groups include a decahydronaphthyl group, an adamantyl group, a norbornyl group, and an isobornyl group.

Examples of the combined group of the above-mentioned hydrocarbon group include a 2-alkyladamantane-2-yl group, a 1-(adamantane-1-yl)alkane-1-yl group, and a methylnorbornyl group. Examples of monovalent hydrocarbon groups having a fluorine atom for R$^{f2}$ include monovalent fluoroalkyl groups and monovalent fluorine atom-containing alicyclic hydrocarbon groups.

Specific examples of monovalent fluoroalkyl groups include a fluoromethyl group, a trifluoromethyl group, 1,1-difluoroethyl group, 2,2-difluoroethyl group, 2,2,2-trifluoroethyl group, perfluoroethyl group, 1,1,2,2-tetrafluoropropyl group, 1,1,2,2,3,3-hexafluoropropyl group, perfluoroethylmethyl group, 1-(trifluoromethyl)-1,2,2,2-tetrafluoroethyl group, perfluoropropyl group, 1,1,2,2-tetrafluorobutyl group, 1,1,2,2,3,3-hexafluorobutyl group, 1,1,2,2,3,3,4,4-octafluorobutyl group, perfluorobutyl group, 1,1-bis(trifluoro)methyl-2,2,2-trifluoroethyl group, 2-(perfluoropropyl)ethyl group, 1,1,2,2,3,3,4,4-octafluoropentyl group, perfluoropentyl group, 1,1,2,2,3,3,4,4,5,5-decafluoropentyl group, 1,1-bis(trifluoromethyl)-2,2,3,3,3-pentafluoropropyl group, 2-(perfluorobutyl)ethyl group, 1,1,2,2,3,3,4,4,5,5-decafluorohexyl group, 1,1,2,2,3,3,4,4,5,5,6,6-dodecafluorohexyl group, a perfluoropentylmethyl group and a perfluorohexyl group.

Specific examples of monovalent fluorine-containing alicyclic hydrocarbon groups include fluorocycloalkyl groups such as a perfluorocyclohexyl group and a perfluoroadamantyl group.

In formula (a4-2), $A^{f1}$ is preferably a C2-C4 alkylene group, and more preferably an ethylene group.

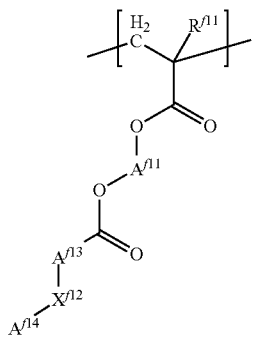

(a4-3)

In formula, $R^{f11}$ represents a hydrogen atom or a methyl group.

$A^{f11}$ represents a C1-C6 alkanediyl group.

$A^{f13}$ represents a C1-C18 divalent saturated hydrocarbon group which may have a fluorine atom.

$X^{f12}$ represents a carbonyloxy group or an oxycarbonyl group.

$A^{f14}$ represents a C1-C17 divalent saturated hydrocarbon group which may have a fluorine atom, provided that one or both of $A^{f13}$ and $A^{f14}$ represents a fluorine-containing saturated hydrocarbon group. Examples of the alkanediyl group represented by $A^{f11}$ include those as referred to for $A^{f12}$.

As to $A^{f13}$, the divalent saturated hydrocarbon group includes chain saturated hydrocarbon groups, cyclic saturated hydrocarbon groups and combined groups of these groups.

As to $A^{f13}$, the divalent saturated hydrocarbon group which may have a fluorine atom is preferably a divalent saturated chain hydrocarbon group which may have a fluorine atom, more preferably a perfluoroalkanediyl group.

Examples of the divalent aliphatic hydrocarbon group which may have a fluorine atom include an alkandiyl group such as a methyl group, an ethylene group, a propanediyl group, a butanediyl group and pentanediyl group; and a perfluoroalkandiyl group such as a difluoromethylene group, a perfluoroethylene group, a perfluoropropanediyl group, a perfluorobutanediyl group and perfluoropentanediyl group.

The divalent cyclic hydrocarbon group which may have a fluorine atom may be a divalent monocyclic or polycyclic group.

Examples of the divalent monocyclic hydrocarbon group which may have a fluorine atom include a cyclohexanediyl group and a per fluorocyclohexanediyl group.

Examples of the divalent polycyclic hydrocarbon group which may have a fluorine atom include an adamantanediyl group, norbornanediyl group, and a perfluoroadamantanediyl group.

In the group represented by $A^{f14}$, the monovalent saturated hydrocarbon group includes chain saturated hydrocarbon groups, cyclic saturated hydrocarbon groups and combined groups of these saturated hydrocarbon groups.

As to $A^{f14}$, the monovalent aliphatic hydrocarbon group which may have a fluorine atom is preferably a monovalent saturated aliphatic hydrocarbon group which may have a fluorine atom, more preferably a perfluoroalkanediyl group.

Examples of the monovalent aliphatic hydrocarbon group which may have a fluorine atom include a trifluoromethyl group, a fluoromethyl group, a methyl group, a perfluoroethyl group, a 1,1,1-trifluoroethyl group, a 1,1,2,2-tetrafluoroethyl group, an ethyl group, a perfluoropropyl group, a 1,1,1,2,2-pentafluoropropyl group, propyl group, a perfluorobutyl group, 1,1,2,2,3,3,4,4-octafluorobutyl group, a butyl group, a perfluoropentyl group, 1,1,1,2,2,3,3,4,4-nonafluoropentyl group, a pentyl group, a hexyl group, a perfluorohexyl group, a heptyl group, a perfluoroheptyl group, an octyl group and a perfluorooctyl group.

The monovalent cyclic hydrocarbon group which may have a fluorine atom may be monocyclic or polycyclic monovalent group.

Examples of the monovalent monocyclic cyclic hydrocarbon group which may have a fluorine atom include a cyclopropyl group, cyclopentyl group, cyclohexyl group, and perfluorocyclohexyl group. Examples of the monovalent polycyclic hydrocarbon group which may have a fluorine atom include an adamantyl group, a norbornyl group, and a perfluoroadamantyl group.

Examples of the combined groups of the above-mentioned aliphatic hydrocarbon group include a cyclopropylmethyl group, a cyclobutylmethyl group, an adamantylmethyl group, a norbornylmethyl group and a perfluoroadamantylmethyl group.

In formula (a4-3), $A^{f11}$ is preferably an ethylene group.

The divalent aliphatic hydrocarbon group represented by $A^{f13}$ has preferably 6 or less, more preferably 2 to 3, of carbon atoms. The monovalent aliphatic hydrocarbon group represented by $A^{f14}$ has preferably 3 to 12, more preferably 3 to 10, of carbon atoms. $A^{f14}$ has preferably a C3-C12 monovalent alicyclic hydrocarbon group, more preferably a cyclopropylmethyl group, a cyclopentyl group, a cyclohexyl group, a norbornyl group or an adamantyl group.

Examples of the structural unit of formula (a4-2) include preferably those represented by formulae (a4-1-1) to (a4-1-22).

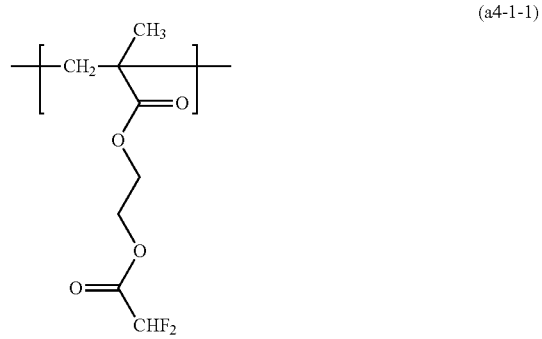

(a4-1-1)

-continued
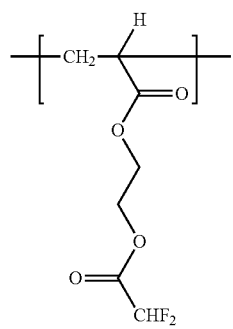
(a4-1-2)
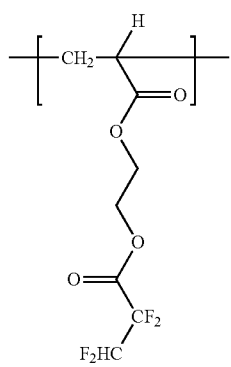
(a4-1-6)
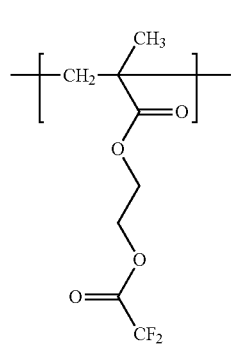
(a4-1-3)
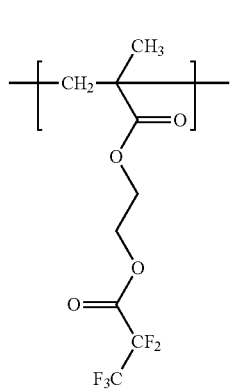
(a4-1-7)
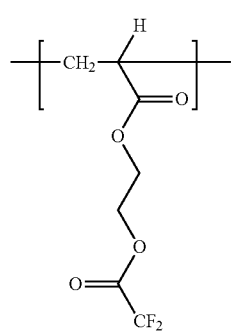
(a4-1-4)
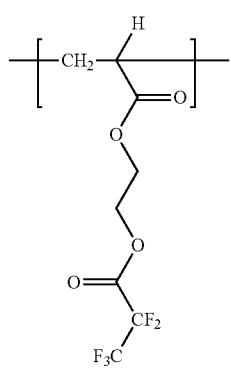
(a4-1-8)
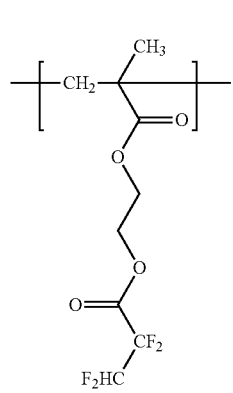
(a4-1-5)
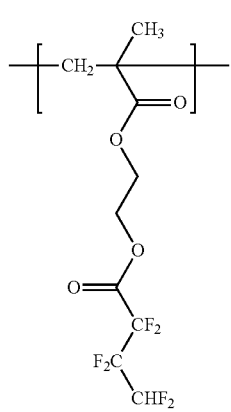
(a4-1-9)

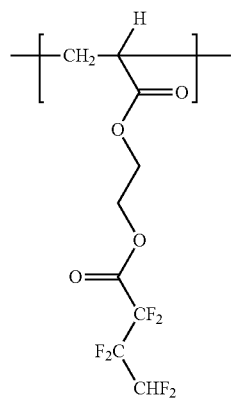
(a4-1-10)
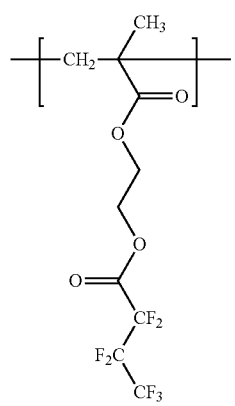
(a4-1-11)
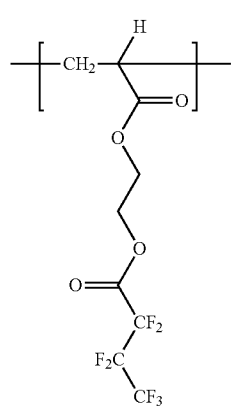
(a4-1-12)
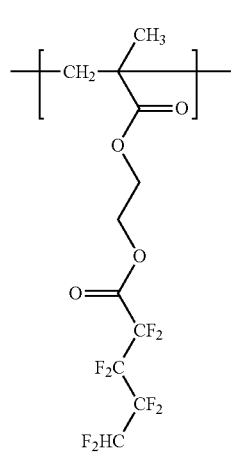
(a4-1-13)
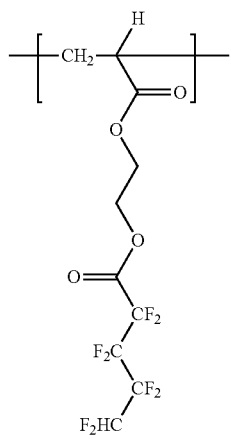
(a4-1-14)
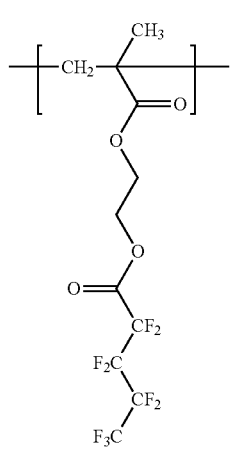
(a4-1-15)
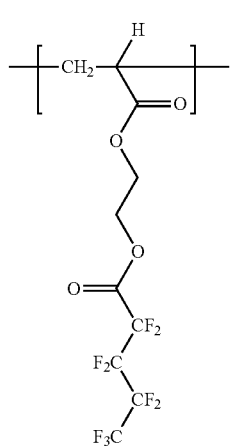
(a4-1-16)

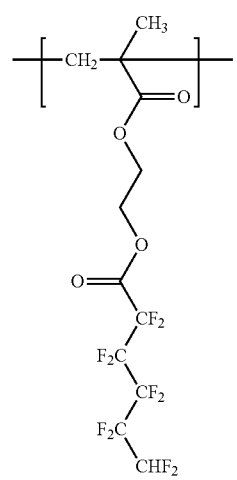
(a4-1-17)
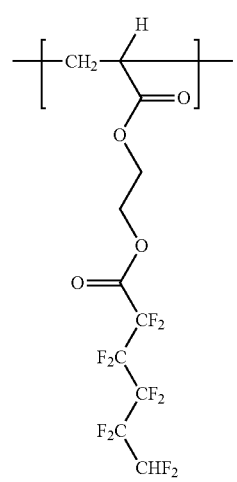
(a4-1-18)
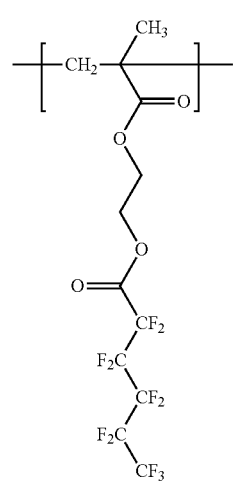
(a4-1-19)
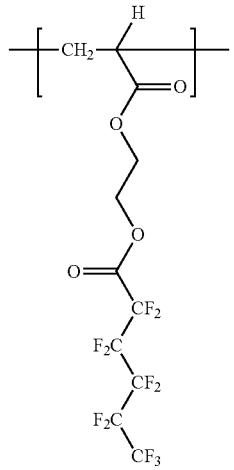
(a4-1-20)
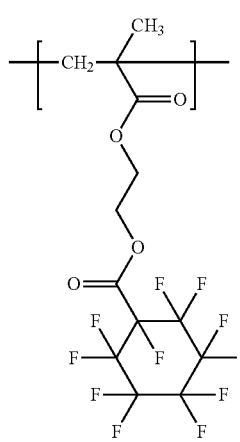
(a4-1-21)
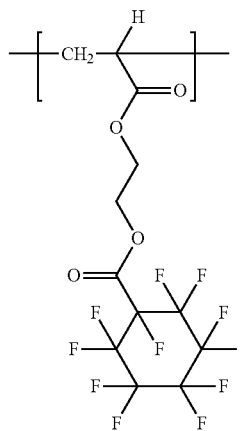
(a4-1-22)
Examples of the structural unit (a4-3) include preferably those represented by formulae (a4-1'-1) to (a4-1'-22).

(a4-1'-1)
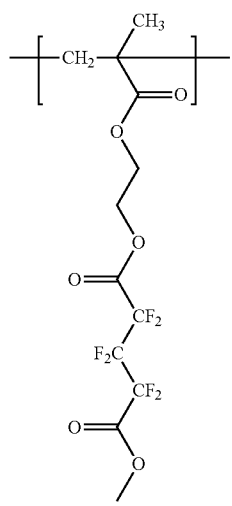
(a4-1'-4)
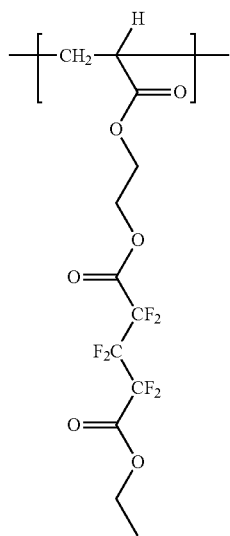
(a4-1'-2)
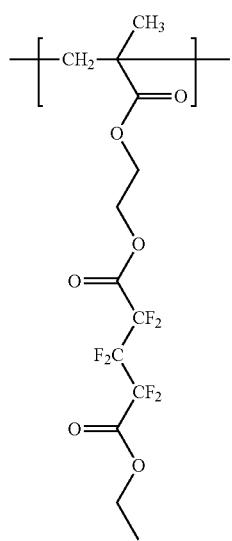
(a4-1'-5)
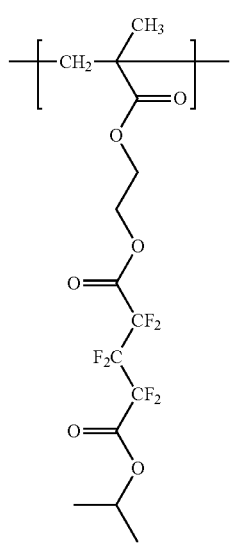
(a4-1'-3)
(a4-1'-6)
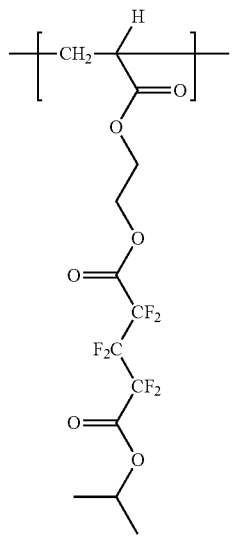

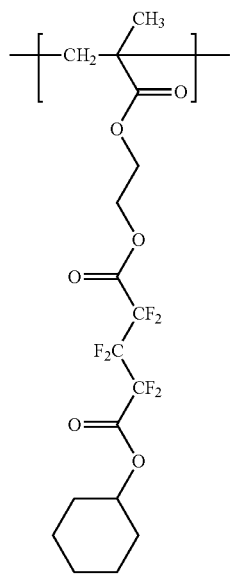 (a4-1'-7)
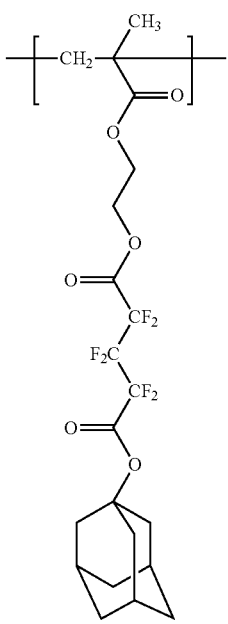 (a4-1'-9)
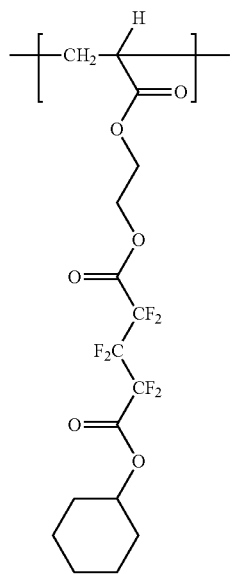 (a4-1'-8)
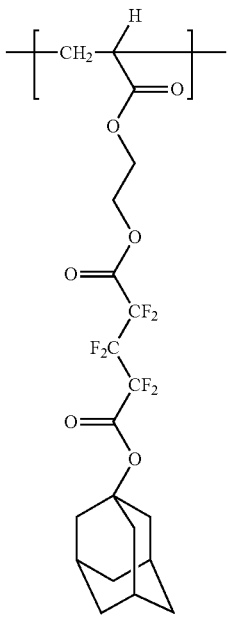 (a4-1'-10)

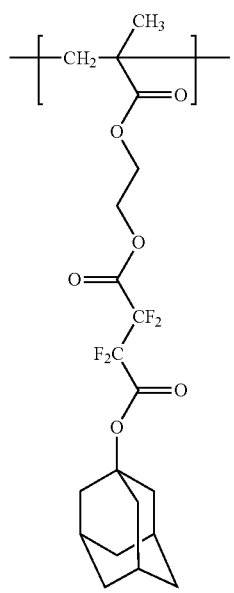
(a4-1'-11)
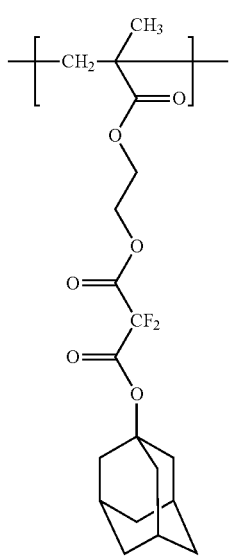
(a4-1'-13)
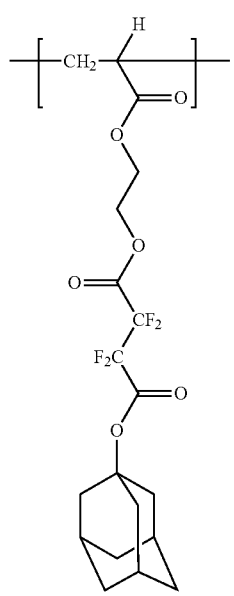
(a4-1'-12)
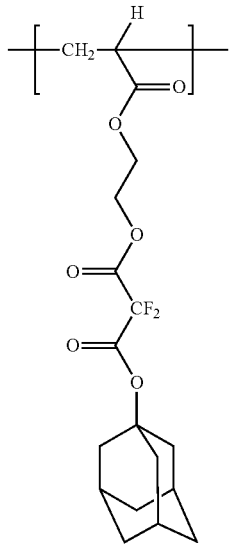
(a4-1'-14)

(a4-1'-15)
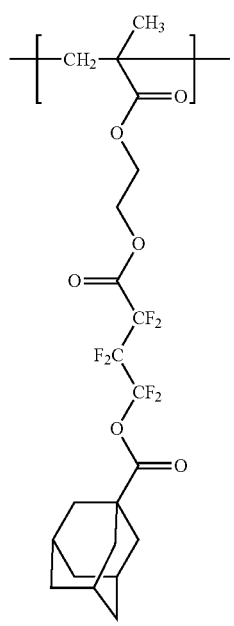
(a4-1'-17)
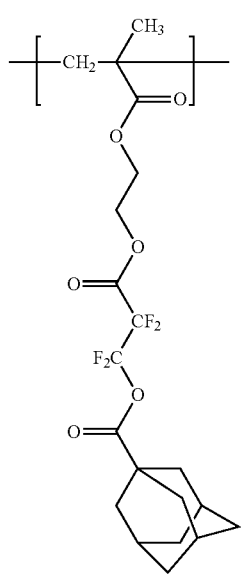
(a4-1'-16)
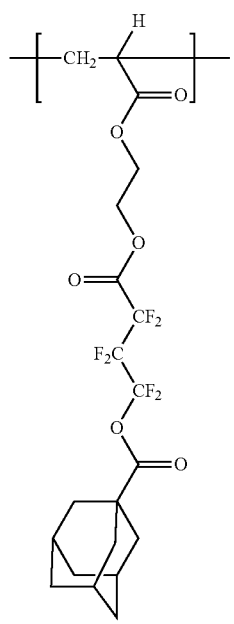
(a4-1'-18)
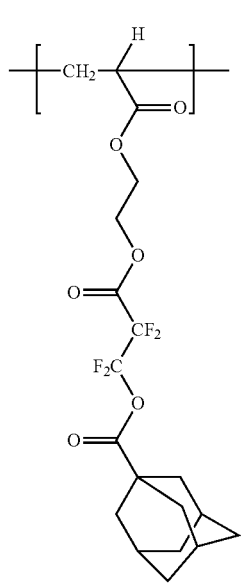

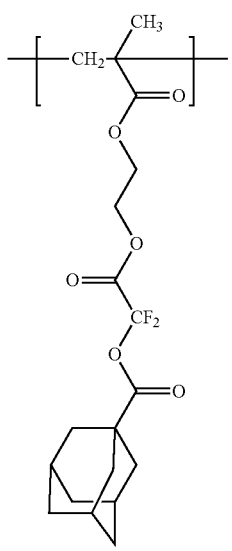

(a4-1'-19)

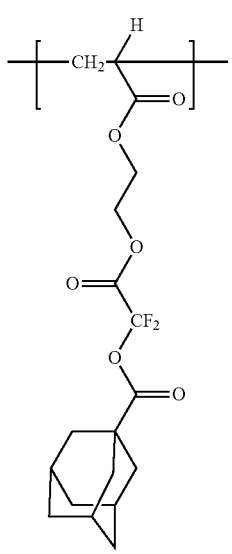

(a4-1'-20)

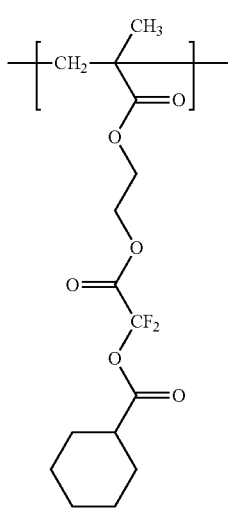

(a4-1'-21)

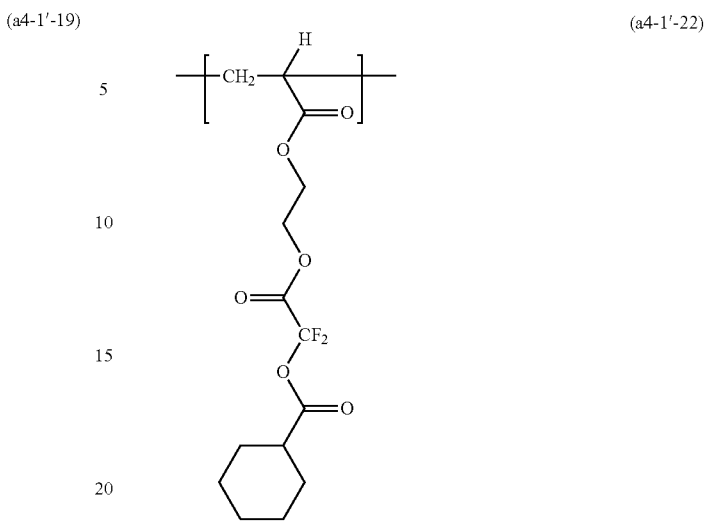

(a4-1'-22)

Another example of the structural unit (a4) includes those represented by formula (a4-4).

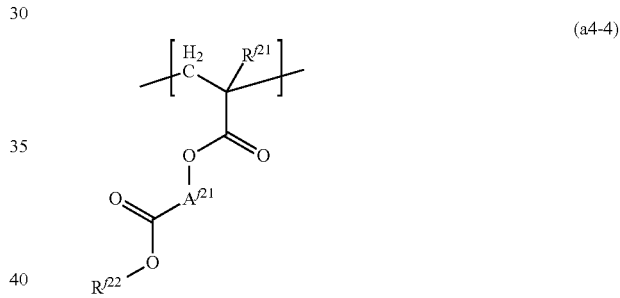

(a4-4)

In formula (a4-4), wherein $R^{f21}$ represents a hydrogen atom or a methyl group;

$A^{f21}$ represents —$(CH_2)_{j1}$—, —$(CH_2)_{j2}$—O—$(CH_2)_{j3}$— or —$(CH_2)_{j4}$—CO—O—$(CH_2)_{j5}$— where j1, j2, j3, j4 or j5 each independently represent an integer of 1 to 6; and $R^{f22}$ represents a C1-C10 monovalent hydrocarbon group having a fluorine atom.

For $R^{f22}$, examples of monovalent hydrocarbon group having a fluorine atom include those as referred to for $R^{f22}$.

$R^{f22}$ is preferably a C1-C10 monovalent alkyl group having a fluorine atom or a C3-C10 monovalent alicyclic hydrocarbon group having a fluorine atom, more preferably a C1-C10 monovalent alkyl group having a fluorine atom, and still more preferably a C1-C6 monovalent alkyl group having a fluorine atom.

In formula (a4-4), $A^{f21}$ is preferably —$(CH_2)$—, more preferably a methylene or ethylene group, and still more preferably a methylene group.

Examples of the structural unit (a4-4) include preferably the following ones.

71
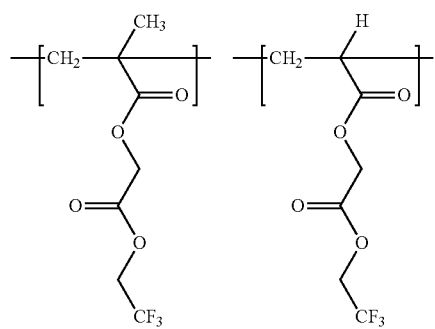
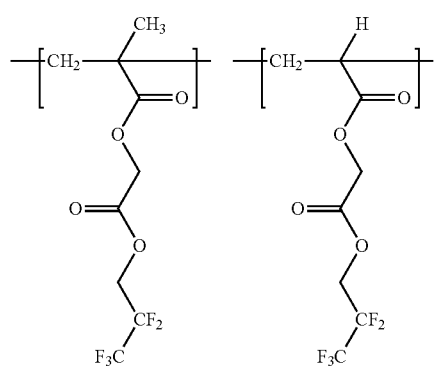
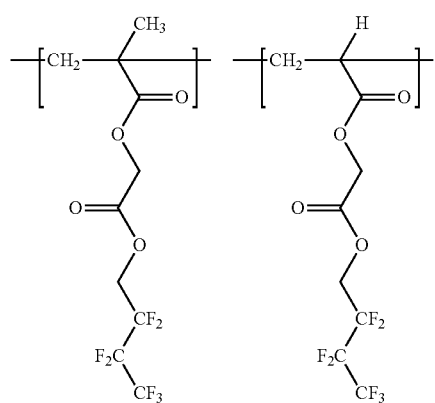
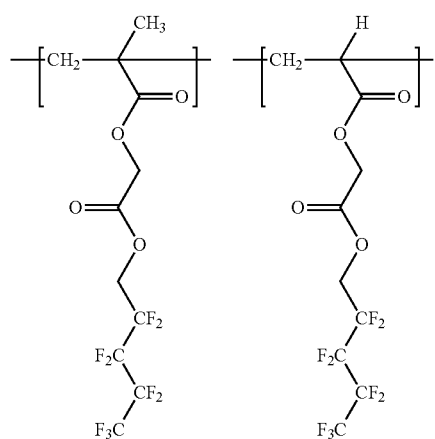
72
-continued
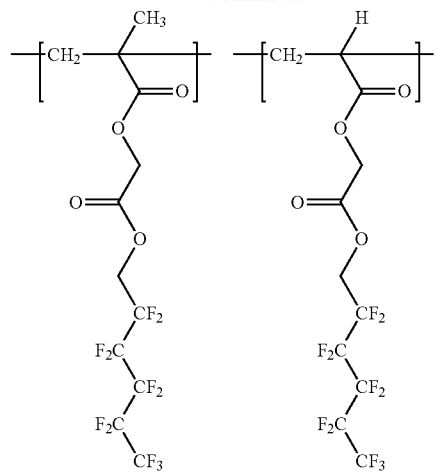
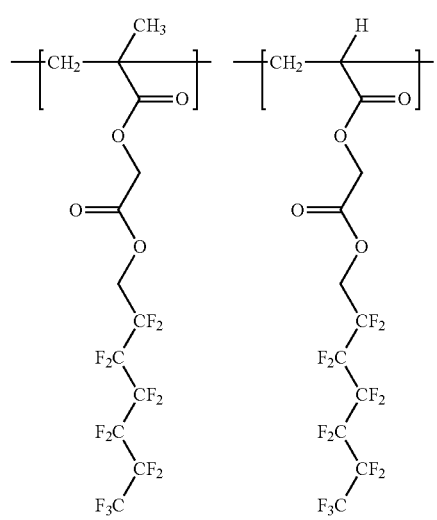
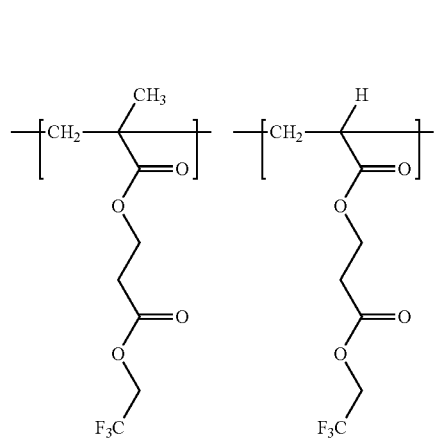

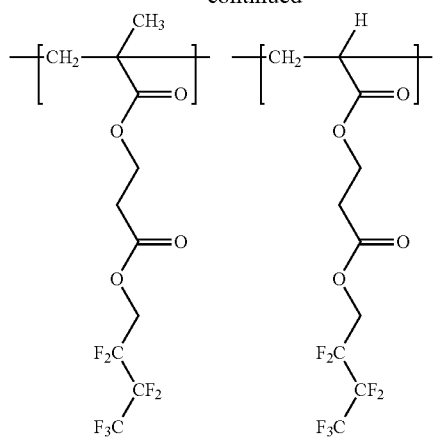

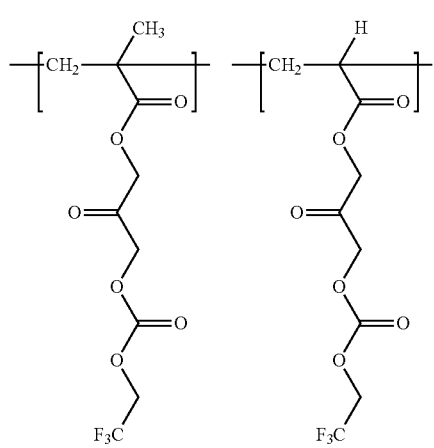

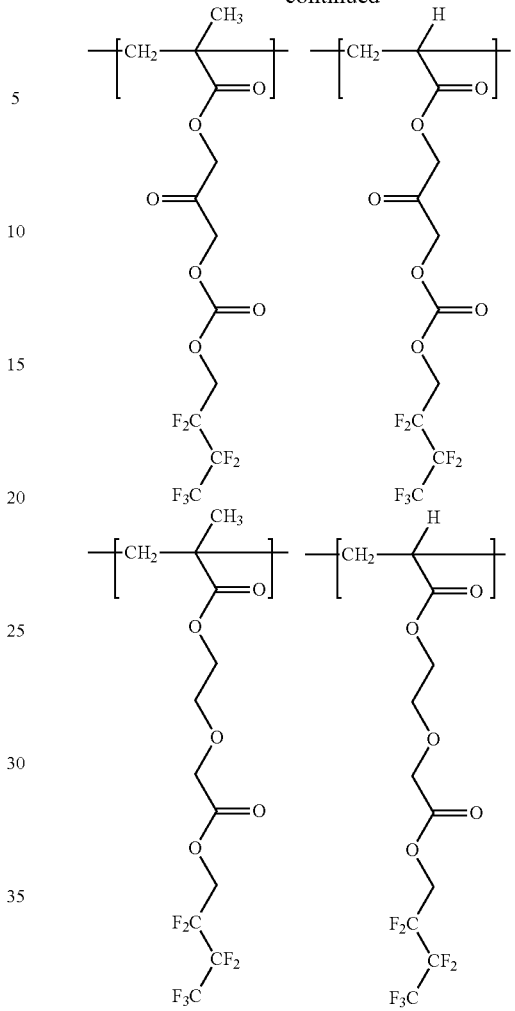

When Resin (A) comprises the structural unit (a4), its content is preferably 1 to 20% by mole, more preferably 2 to 15% by mole and still more preferably 3 to 10% by mole based on 100% by mole of all the structural units of the resin.

Resin (A) may comprise another structural unit than those as specifically mentioned above. Examples of such another structural unit include those as known in the art.

When Resin (A) comprises such another structural unit, its content is preferably 1 to 50% by mole, more preferably 3 to 40% by mole based on 100% by mole of all the structural units of the resin.

Other examples of the structural unit having no acid-labile group include one having an acid-stable hydrocarbon group.

Herein, the term "acid-stable hydrocarbon group" means such a hydrocarbon group that is not removed from the structural unit having the group by action of an acid generated from an acid generator as described later.

The acid-stable hydrocarbon group may be a linear, branched or cyclic hydrocarbon group.

The structural unit having an acid-stable hydrocarbon group preferably has an alicyclic hydrocarbon group.

Examples of the structural unit having an acid-stable hydrocarbon group include one represented by formula (a5-1).

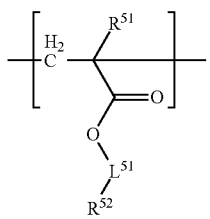

(a5-1)

where R[51] represents a hydrogen atom or a methyl group;
R[52] represents a C3-C18 monovalent alicyclic hydrocarbon group which may have a C1-C8 monovalent aliphatic hydrocarbon group as a substituent, provided that the alicyclic hydrocarbon group has no substituent on the carbon atom bonded to L[51]; and
L[51] represents a single bond or a C1-C18 divalent saturated hydrocarbon group where a methylene group can be replaced by an oxygen atom or carbonyl group.

The alicyclic hydrocarbon group represented by R[52] may be monocyclic or polycyclic one. Examples of the alicyclic hydrocarbon group include a monocyclic hydrocarbon group such as a C3-C18 cycloalkyl group (e.g. a cyclopropyl group, a cyclobutyl group, a cyclopentyl group, a cyclohexyl group) and a polycyclic alicyclic hydrocarbon group such as an adamantyl group, or a norbornyl group.

Examples of the aliphatic hydrocarbon group include an alkyl groups such as a methyl group, an ethyl group, n-propyl group, isopropyl group, n-butyl group, sec-butyl group, tert-butyl group, a pentyl group, a hexyl group, an octyl group and 2-ethylhexyl group.

Examples of the alicyclic hydrocarbon group having a substituent include a 3-hydroxyadamantyl group, and a 3-methyladamantyl group. R[52] is preferably a C3-C18 unsubstituted alicyclic hydrocarbon group, more preferably an adamantyl group, a norbornyl group or a cyclohexyl group.

Examples of the divalent saturated hydrocarbon group represented by L[51] include divalent aliphatic hydrocarbon groups and divalent alicyclic hydrocarbon groups, preferably divalent aliphatic hydrocarbon groups.

Examples of divalent aliphatic hydrocarbon groups include alkanediyl groups such as a methylene group, an ethylene group, a propanediyl group, a butanediyl group and a pentanediyl group.

The divalent alicyclic hydrocarbon groups may be monocyclic or polycyclic one.

Examples of divalent monocyclic hydrocarbon groups include cycloalkanediyl groups such as a cyclopentanediyl group and a cyclohexanediyl group. Examples of divalent polycyclic alicyclic hydrocarbon groups include an adamantanediyl group and a norbornanediyl group.

Examples of the divalent hydrocarbon group where a methylene group has been replaced by an oxygen atom or carbonyl group include those represented by formulae (L1-1) to (L1-4).

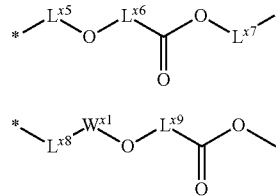

(L1-3)

(L1-4)

In these formulae, * represents a binding position to an oxygen atom.

$X^{x1}$ is a carbonyloxy group or an oxycarbonyl group; and $L^{x1}$ is a C1-C16 divalent saturated hydrocarbon group, and $L^{x2}$ is a single bond or a C1-C15 divalent aliphatic saturated hydrocarbon group, provided that the total number of the carbon atoms in $L^{x1}$ and $L^{x2}$ is 16 or less.

$L^{x3}$ is a C1-C17 divalent saturated hydrocarbon group, and $L^{x4}$ is a single bond or a C1-C16 divalent aliphatic saturated hydrocarbon group, provided that the total number of the carbon atoms in $L^{x3}$ and $L^{x4}$ is 17 or less.

$L^{x5}$ is a C1-C15 divalent saturated hydrocarbon group, and $L^{x6}$ and $L^{x7}$ is a single bond or a C1-C14 divalent aliphatic saturated hydrocarbon group, provided that the total number of the carbon atoms in $L^{x5}$, $L^{x6}$ and $L^{x7}$ is 15 or less.

$L^{x8}$ and $L^{x9}$ are each independently a single bond or a C1-C12 divalent aliphatic saturated hydrocarbon group, and $W^{x1}$ is a C3-C15 divalent cyclic saturated hydrocarbon group, provided that the total number of the carbon atoms in $L^{x8}$, $L^{x9}$ and $W^{x1}$ is 15 or less.

$L^{x1}$ is preferably a C1-C8 divalent saturated hydrocarbon group, more preferably a methylene group or an ethylene group.

$L^{x2}$ is preferably a single bond, or a C1-C8 divalent saturated hydrocarbon group, more preferably a single bond.

$L^{x3}$ is preferably a C1-C8 divalent saturated hydrocarbon group, more preferably a methylene group or an ethylene group.

$L^{x4}$ is preferably a single bond or a C1-C8 divalent saturated hydrocarbon group, more preferably a single bond, a methylene group or an ethylene group.

$L^{x5}$ is preferably a C1-C8 divalent saturated hydrocarbon group, more preferably a methylene group or an ethylene group.

$L^{x6}$ is preferably a single bond or a C1-C8 divalent saturated hydrocarbon group, more preferably a methylene group or an ethylene group.

$L^{x7}$ is preferably a single bond or a C1-C8 divalent saturated hydrocarbon group, more preferably a methylene group or an ethylene group.

$L^{x8}$ is preferably a single bond or a C1-C8 divalent saturated hydrocarbon group, more preferably a single bond or a methylene group.

$L^{x9}$ is preferably a single bond or a C1-C8 divalent saturated hydrocarbon group, more preferably a single bond or a methylene group.

$W^{x1}$ is a preferably C3-C10 divalent cyclic saturated hydrocarbon group, more preferably a cyclohexanediyl group or an adamantanediyl group.

Examples of the divalent hydrocarbon group represented by formula (L1-1) include the following ones.

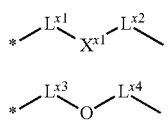

(L1-1)

(L1-2)

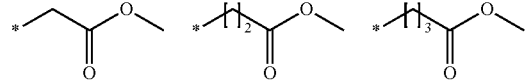

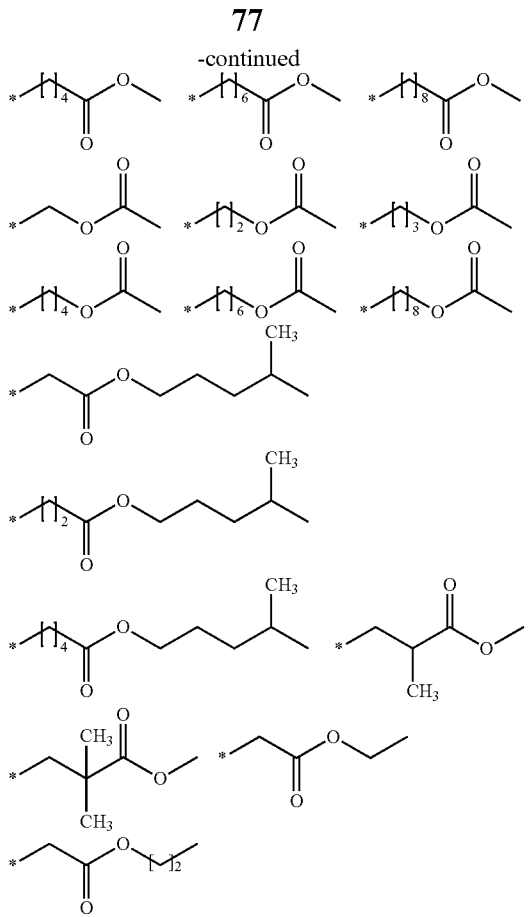

In these formulae, * represents a binding position to an oxygen atom.

Examples of the divalent hydrocarbon group represented by formula (L1-2) include the following ones.

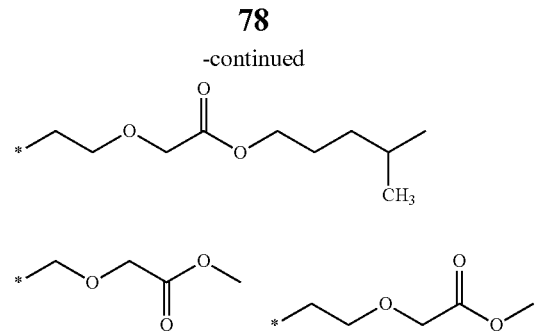

In these formulae, * represents a binding position to an oxygen atom.

Examples of the divalent hydrocarbon group represented by formula (L1-3) include the following ones.

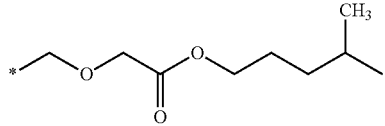

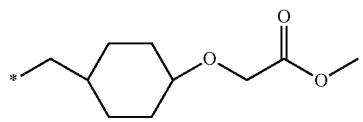

In these formulae, * represents a binding position to an oxygen atom.

Examples of the divalent hydrocarbon group represented by formula (L1-4) include the following ones.

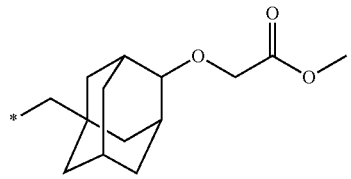

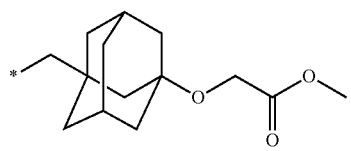

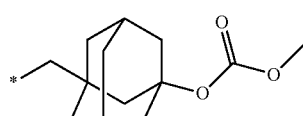

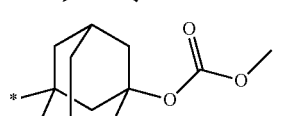

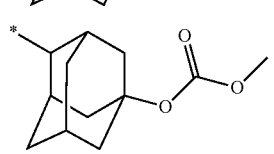

In these formulae, * represents a binding position to an oxygen atom.

$L^{51}$ is preferably a single bond or a group represented by formula (L1-1).

Examples of the structural unit represented by formula (a5-1) include the following ones and those where a methyl group has been replaced by a hydrogen atom in each formula.

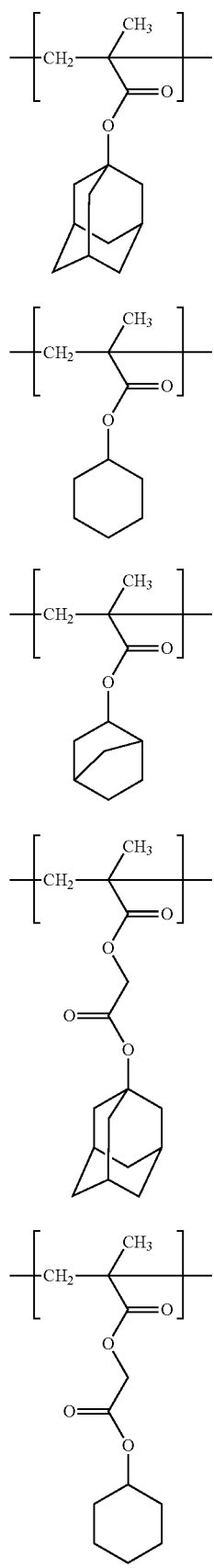
(a5-1-1)
(a5-1-2)
(a5-1-3)
(a5-1-4)
(a5-1-5)
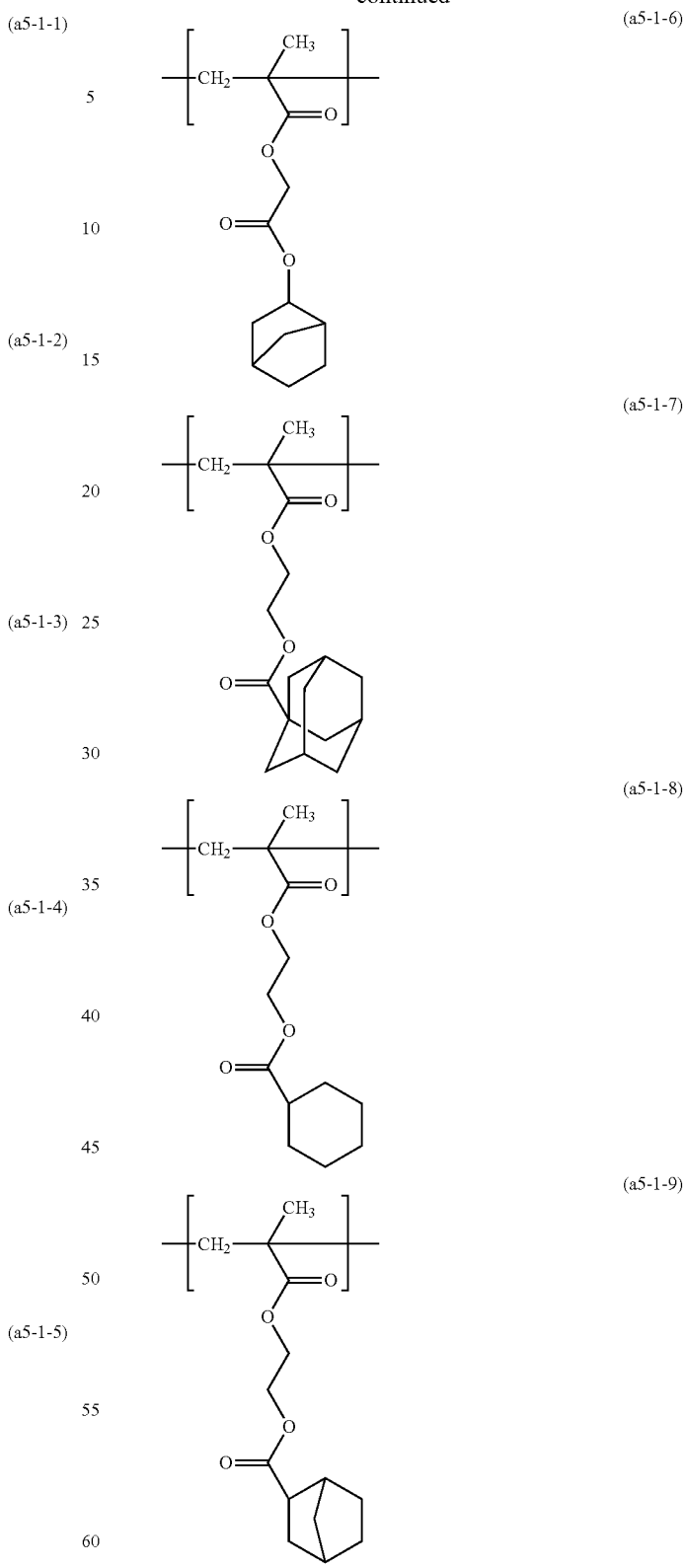
(a5-1-6)
(a5-1-7)
(a5-1-8)
(a5-1-9)
When Resin (A) comprises the structural unit (I), the structural unit (a1), and the structural unit (s), it comprises preferably
1 to 60% by mole of the structural unit (I)
20 to 69% by mole of the structural unit (a1), and 20 to 79% by mole of the structural unit(s); more preferably
3 to 55% by mole of the structural unit (I)
25 to 62% by mole of the structural unit (a1), and
20 to 72% by mole of the structural unit (s); and still more preferably
3 to 50% by mole of the structural unit (I)
30 to 55% by mole of the structural unit (a1), and
20 to 65% by mole of the structural unit (s).

Resin (A) preferably consists of the structural unit (I), the structural unit (a1), and the structural unit having no acid-labile group.

In Resin (A), the structural unit (a1) is preferably one of the structural unit (a1-1) and the structural unit (a1-2), more preferably the structural unit (a1-2).

The structural unit having no acid-labile group is preferably structural unit (a2) and a structural unit (a3). The structural unit (a2) is preferably a structural unit (a2-1). The structural unit (a3) is one of a structural unit (a3-1), a structural unit (a3-2) and a structural unit (a3-3).

Resin (A) can be produced by polymerizing the compound represented by formula (I) according to known polymerization methods such as radical polymerization.

The resin of the present invention usually has 2,500 or more of the weight-average molecular weight, preferably 3,000 or more of the weight-average molecular weight. The resin usually has 50,000 or less of the weight-average molecular weight, preferably has 30,000 or less of the weight-average molecular weight. The weight-average molecular weight can be measured with known methods such as liquid chromatography, gas chromatography or gel permeation chromatography.

The photoresist composition of the present invention comprises Resin (A) and an acid generator.

The photoresist composition of the present invention may further comprise another resin than Resin (A), a quencher, or a solvent. Preferably, the photoresist composition of the present invention further comprises a compound of formula (D).

The photoresist composition of the present invention usually comprises 80% by weight or more of Resin (A) based on sum of solid components. The photoresist composition of the present invention usually comprises 99% by weight or less of Resin (A) based on sum of solid component. In this specification, "solid components" mean components other than solvent in the photoresist composition. The content of solid components and the content of Resin (A) can be measured with known methods such as liquid chromatography, or gas chromatography.

Examples of another resin than Resin (A) include preferably what comprises the structural unit (a4), and more preferably what consists of the structural unit (a4).

The resin which comprises the structural unit (a4) may further comprise the structural unit (a2), the structural unit (a3) or another structural unit known in the art.

The resin which comprises the structural unit (a4) usually has 8000 or more of the weight-average molecular weight, preferably 1000 or more of the weight-average molecular weight. The resin usually has 80,000 or less of the weight-average molecular weight, preferably has 60,000 or less of the weight-average molecular weight.

The weight-average molecular weight can be measured with known methods such as liquid chromatography or gas chromatography. When the photoresist composition comprises the resin which comprises the structural unit (a4), the content of the resin is preferably 1 to 60 weight parts, more preferably 3 to 50 weight parts, and still more preferably 5 to 40 weight parts, furthermore preferably 5 to 30 weight parts, and still further more preferably 7 to 30 weight parts, relative to 100 weight parts of Resin (A).

The photoresist composition of the present invention usually comprises 80% by weight or more of the resins in total based on sum of solid components. The photoresist composition of the present invention usually includes 99% by weight or less of the resins in total based on sum of solid component.

The acid generator may be ionic compounds or nonionic compounds.

The nonionic compounds for the acid generator include organic halogenated compounds; sulfonate esters, e.g. 2-nitrobenzylester, aromatic sulfonates, oximesulfonate, N-sulfonyloxyimide, sulfonyloxyketone, and diazonaphthoquinone 4-sulfonate; sulfones, e.g., disulfone, ketosulfone, and sulfonium diazomethane.

The ionic compounds for the acid generator include onium salts having an onium cation, e.g., diazonium salts, phosphonium salts, sulfonium salts and iodonium salts. Anions of onium salt include a sulfonic acid anion, a sulfonylimide anion, sulfonylmethide anion. The photoresist composition may have one or more acid generators. As the acid generator, the compounds giving an acid by radiation can be used, which are mentioned in JP63-26653A1, JP55-164824A1, JP62-69263A1, JP63-146038A1, JP63-163452A1, JP62-153853A1, JP63-146029A1, U.S. Pat. No. 3,779,778B1, U.S. Pat. No. 3,849,137B1, DE3914407 and EP126,712A1. The acid generator for the photoresist composition can be produced by the method described in the above-mentioned documents.

The acid generator is preferably a fluorine-containing compound, more preferably salt represented by formula (B1)

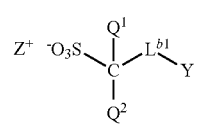

(B1)

wherein $Q^1$ and $Q^2$ respectively represent a fluorine atom or a C1-C6 perfluoroalkyl group, $L^{b1}$ represents a single bond or a C1-C24 saturated hydrocarbon group in which a methylene group may be replaced by —O— or —CO— and in which a hydrogen atom may be replaced by a hydroxyl group or a fluorine atom, Y represents a hydrogen atom or a C3-C18 alicyclic hydrocarbon group which may have a substituent, where a methylene of the alkyl group and methylene of the alicyclic hydrocarbon group may be replaced by —O—, —SO$_2$— or —CO—, and $Z^+$ represents an organic cation.

Hereinafter, the moiety corresponding to the part except $Z^+$ in formula (I) and having a negative charge is sometimes referred to as "sulfonic acid anion".

Examples of the C1-C6 perfluoroalkyl group represented by $Q^1$ and $Q^2$ include a trifluoromethyl group, a pentafluoroethyl group, a heptafluoropropyl group, a nonafluorobutyl group, an undecafluoropentyl group and a tridecafluorohexyl group. It is preferred that $Q^1$ and $Q^2$ independently each represent a fluorine atom or a trifluoromethyl group, and it is more preferred that $Q^1$ and $Q^2$ are fluorine atoms.

The divalent saturated hydrocarbon group represented by $L^{b1}$ includes linear chain alkanediyl groups, branched chain alkanediyl groups, monocyclic or polycyclic divalent saturated hydrocarbon groups, and a group combining two or more of the above-mentioned groups. Examples of $L^{b1}$ include linear chain alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group, an ethane-1,1-diyl group, a propane-1,1-diyl group, a propane-2,2-diyl group;

branched chain groups such as an ethane-1,1-diyl group, a propane-1,1-diyl group, propane-1,2-diyl group, propane-2,2-diyl group, a pentane-2,4-diyl group, a 1-methylpropane-1,3-diyl group, a 2-methylpropane-1,2-diyl group, a pentane-1,4-diyl group, and a 2-methylbutane-1,4-diyl group;

divalent alicyclic hydrocarbon groups including a cyclobutane-1,3-diyl group, a cyclopentane-1,3-diyl group, a cyclohexane-1,4-diyl group and a cyclooctane-1,5-diyl group; and a polycyclic divalent alicyclic hydrocarbon groups such as a nobornane-1,4-diyl group, a nobornane-1,5-diyl group, an amadantane-1,5-diyl group, or an amadantane-2,6-diyl group. Examples of the divalent saturated hydrocarbon group in which a methylene group has been replaced by an oxygen atom or a carbonyl group include groups represented by the formulae (b1-1), (b1-2) and (b1-3), as follow.

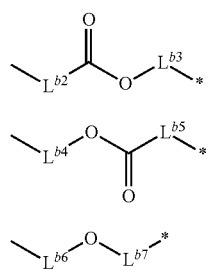

(b1-1)

(b1-2)

(b1-3)

In formula (b1-1), $L^{b2}$ represents a single bond or a C1-C22 divalent saturated hydrocarbon group where a hydrogen atom may be replaced by a fluorine atom, and $L^{b3}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, provided that total number of the carbon atoms of $L^{b2}$ and $L^{b3}$ is up to 22.

In formula (b1-2), $L^{b4}$ represents a C1-C22 divalent saturated hydrocarbon group where a hydrogen atom may be replaced by a fluorine atom, and $L^{b5}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, provided that the total carbon atoms of $L^{b4}$ and $L^{b5}$ is up to 22.

In formula (b1-3), $L^{b6}$ represents a single bond or a C1-C23 divalent saturated hydrocarbon group where a hydrogen atom may be replaced by a fluorine atom, and $L^{b7}$ represents a single bond or a C1-C22 divalent saturated hydrocarbon group where a hydrogen atom may be replaced by a hydroxyl group or a fluorine atom and where a methylene group may be replaced by an oxygen atom or carbonyl group, with the proviso that total carbon number of $L^{b6}$ and $L^{b7}$ is up to 23 and with the proviso that formula (b1-3) excludes group having a structure represented by -$L^{b6}$-O—CO—.

In these formulae, * represents a binding position, * of the left side represents a binding position to —C($Q^1$)($Q^2$)-, and * of the right side represents a binding position to the ring $W^1$.

In formulae (b1-1), (b1-2) and (b1-3), the divalent saturated hydrocarbon group includes linear chain alkanediyl groups, branched chain alkanediyl groups, monocyclic or polycyclic divalent saturated hydrocarbon groups, and a group combining two or more of the above-mentioned groups.

Specific examples of the divalent saturated hydrocarbon group include those as referred to for $L^{b1}$.

$L^{b2}$ is preferably a single bond.

$L^{b3}$ is preferably a C1-C4 alkanediyl group.

$L^{b4}$ is preferably a C1-C8 divalent saturated hydrocarbon group where a hydrogen atom may be replaced by a fluorine atom.

$L^{b5}$ is preferably a single bond or a C1-C8 divalent saturated hydrocarbon group.

$L^{b6}$ is preferably a single bond or a C1-C4 divalent saturated hydrocarbon group where a hydrogen atom may be replaced by a fluorine atom.

$L^{b7}$ is preferably a single bond or a C1-C7 divalent saturated hydrocarbon group where a hydrogen atom may be replaced by a hydroxyl group or a fluorine atom and where a methylene group may be replaced by an oxygen atom or carbonyl group.

Among them, those of formulae (b1-1) and (b1-3) are preferred. Examples of the group represented by formula (b1-1) include those represented by formulae (b1-4), (b1-5), (b1-6), (b1-7) and (b1-8).

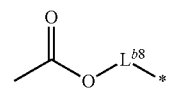

(b1-4)

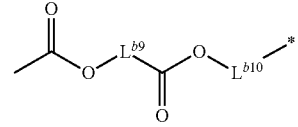

(b1-5)

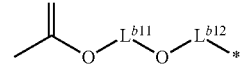

(b1-6)

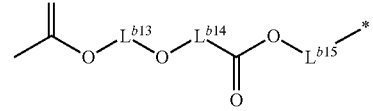

(b1-7)

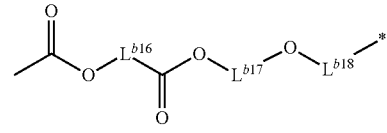

(b1-8)

In formula (b1-4), $L^{b8}$ represents a single bond or a C1-C22 divalent saturated hydrocarbon group where a hydrogen atom may be replaced by a fluorine atom or a hydroxyl group.

In formula (b1-5), $L^{b9}$ represents a C1-C20 divalent saturated hydrocarbon group, and $L^{b10}$ represents a single bond or a C1-C19 divalent saturated hydrocarbon group where a hydrogen atom may be replaced by a hydroxyl group or a fluorine atom, provided that the total carbon atoms of $L^{b10}$ and $L^{b9}$ is up to 20.

In formula (b1-6), $L^{b11}$ represents a C1-C21 divalent saturated hydrocarbon group, and $L^{b12}$ represents a single bond or a C1-C20 divalent saturated hydrocarbon group where a hydrogen atom may be replaced by a hydroxyl group or a fluorine atom, with the proviso that total carbon number of $L^{b11}$ and $L^{b12}$ is up to 21.

In formula (b1-7), $L^{b13}$ represents a C1-C19 divalent saturated hydrocarbon group, $L^{b14}$ represents a single bond or a C1-C18 divalent saturated hydrocarbon group, and $L^{b15}$ represents a single bond or a C1-C18 divalent saturated hydrocarbon group where a hydrogen atom may be replaced by a hydroxyl group or a fluorine atom, with the proviso that total carbon number of $L^{b13}$, $L^{b14}$ and $L^{b15}$ is up to 19.

In formula (b1-8), $L^{b16}$ represents a C1-C18 divalent saturated hydrocarbon group, $L^{b17}$ represents a C1-C18 divalent saturated hydrocarbon group, and $L^{b18}$ represents a single bond or a C1-C17 divalent saturated hydrocarbon group where a hydrogen atom may be replaced by a hydroxyl group or a fluorine atom, with the proviso that total carbon number of $L^{b16}$, $L^{b17}$ and $L^{b18}$ is up to 19.

In these formulae, * represents a binding position, * of the left side represents a binding position to —$C(Q^1)(Q^2)$-, and * of the right side represents a binding position to the ring $W^1$.

In these formulae, the divalent saturated hydrocarbon group includes linear chain alkanediyl groups, branched chain alkanediyl groups, monocyclic or polycyclic divalent saturated hydrocarbon groups, and a group combining two or more of the above-mentioned groups. Specific examples of the divalent saturated hydrocarbon group include those as referred to for $L^{b1}$.

$L^{b8}$ is preferably a C1-C4 alkanediyl group.

$L^{b9}$ is preferably a C1-C8 divalent saturated hydrocarbon group.

$L^{b10}$ is preferably a single bond or a C1-C19 divalent saturated hydrocarbon group, and more preferably a single bond or a C1-C8 divalent saturated hydrocarbon group.

$L^{b11}$ is preferably a C1-C8 divalent saturated hydrocarbon group.

$L^{b12}$ is preferably a single bond or a C1-C8 divalent saturated hydrocarbon group.

$L^{b13}$ is preferably a C1-C12 divalent saturated hydrocarbon group.

$L^{b14}$ is preferably a single bond or a C1-C6 divalent saturated hydrocarbon group.

$L^{b15}$ is preferably a single bond or a C1-C18 divalent saturated hydrocarbon group, and more preferably a single bond or a C1-C8 divalent saturated hydrocarbon group.

$L^{b16}$ is preferably a C1-C12 divalent saturated hydrocarbon group.

$L^{b17}$ is preferably a C1-C6 divalent saturated hydrocarbon group.

$L^{b18}$ is preferably a single bond or a C1-C17 divalent saturated hydrocarbon group, and more preferably a single bond or a C1-C4 divalent saturated hydrocarbon group.

Examples of the group represented by formula (b1-3) include those represented by formulae (b1-9), (b1-10) and (b1-11).

(b1-9)

(b1-10)

(b1-11)

In formula (b1-9), $L^{b19}$ represents a single bond or a C1-C23 divalent saturated hydrocarbon group where a hydrogen atom may be replaced by a fluorine atom, and $L^{b20}$ represents a single bond or a C1-C23 divalent saturated hydrocarbon group where a hydrogen atom may be replaced by a hydroxyl group or a fluorine atom and where a methylene group may be replaced by an oxygen atom or carbonyl group, provided that the total carbon atoms of $L^{b19}$ and $L^{b20}$ is up to 23. In formula (b1-10), $L^{b21}$ represents a single bond or a C1-C21 divalent saturated hydrocarbon group where a hydrogen atom may be replaced by a fluorine atom, $L^{b22}$ represents a single bond or a C1-C21 divalent saturated hydrocarbon group and $L^{b23}$ represents a single bond or a C1-C21 divalent saturated hydrocarbon group where a hydrogen atom may be replaced by a hydroxyl group or a fluorine atom and where a methylene group may be replaced by an oxygen atom or a carbonyl group, provided that the total carbon atoms of $L^{b21}$, $L^{b22}$ and $L^{b23}$ is up to 21.

In formula (b1-11), $L^{b24}$ represents a single bond or a C1-C21 divalent saturated hydrocarbon group where a hydrogen atom may be replaced by a fluorine atom, $L^{b25}$ represents a single bond or a C1-C21 divalent saturated hydrocarbon group, and $L^{b26}$ represents a single bond or a C1-C20 divalent saturated hydrocarbon group where a hydrogen atom may be replaced by a hydroxyl group or a fluorine atom and where a methylene group may be replaced by an oxygen atom or a carbonyl group, provided that the total carbon atoms of $L^{b25}$, $L^{b26}$ and $L^{b27}$ is up to 21.

In these formulae, * represents a binding position, * of the left side represents a binding position to —$C(Q^1)(Q^2)$-, and * of the right side represents a binding position to the ring W'.

In these formulae, the divalent saturated hydrocarbon group includes linear chain alkanediyl groups, branched chain alkanediyl groups, monocyclic or polycyclic divalent saturated hydrocarbon groups, and a group combining two or more of the above-mentioned groups. Specific examples of the divalent saturated hydrocarbon group include those as referred to for $L^{b1}$.

Examples of the divalent saturated hydrocarbon group where a methylene group has been replaced by an oxygen atom or a carbonyl group include those having an acyloxy group where a hydrogen atom may be replaced by a hydroxyl group and where a methylene group may be replaced by an oxygen atom or a carbonyl group.

Examples of acyloxy group include an acetyloxy group, a propyonyloxy group, a butyryloxy group, a cyclohexylcarbonyloxy group and an adamantylcarbonyloxy group.

Examples of acyloxy group where a hydrogen atom has been replaced by a hydroxyl group or where a methylene group has been replaced by an oxygen atom or a carbonyl group include an oxoadamantylcarbonyloxy group, a hydroxyadamantylcarbonyloxy group, an oxocyclohexyl-carbonyloxy group, and a hydroxycyclohexylcarbonyloxy group.

Examples of the group represented by formula (b1-4) include the following ones.

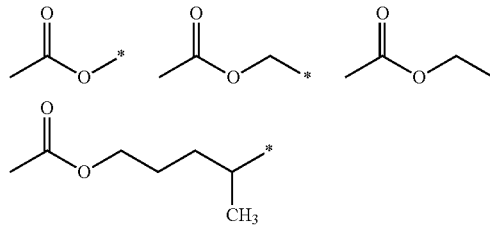

Examples of the group represented by formula (b1-5) include the following ones.

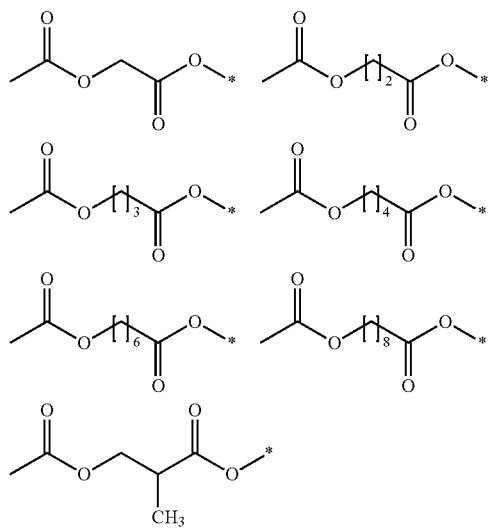

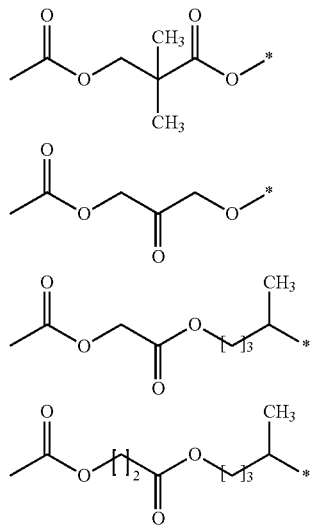

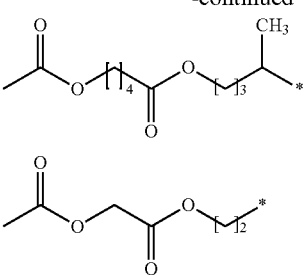

Examples of the group represented by formula (b1-6) include the following ones.

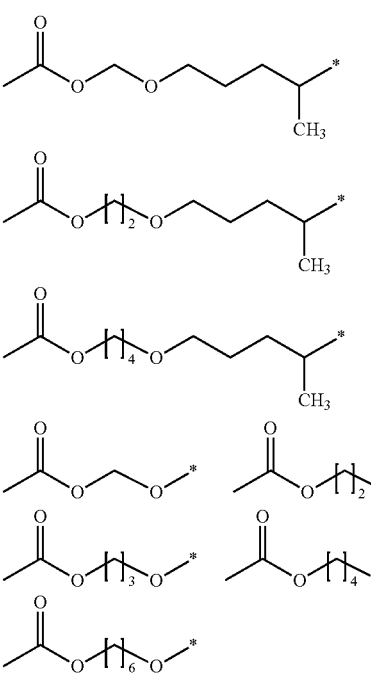

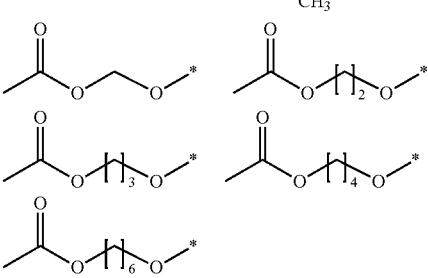

Examples of the group represented by formula (b1-7) include the following ones.

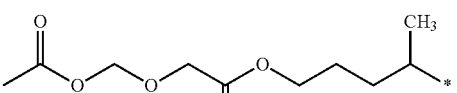

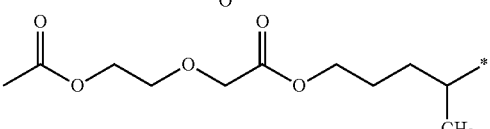

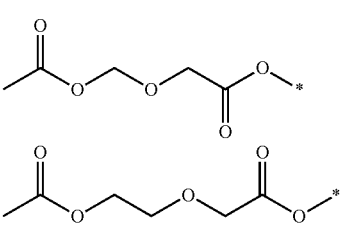

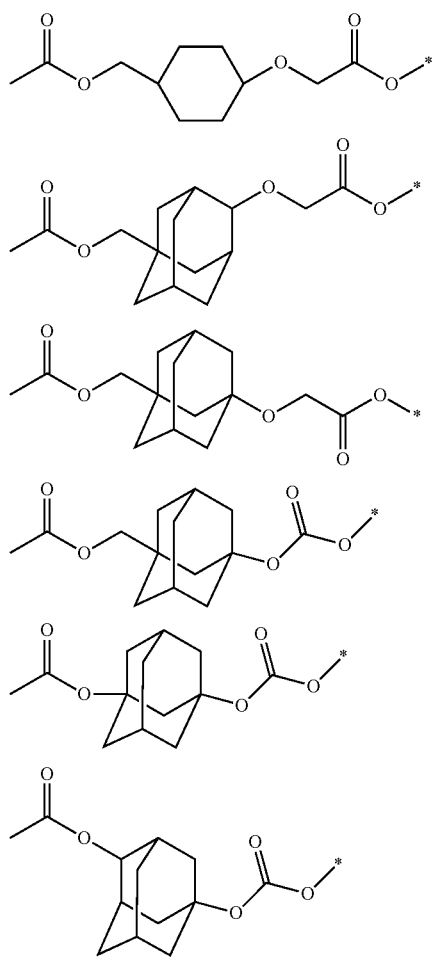
Examples of the group represented by formula (b1-8) include the following ones.
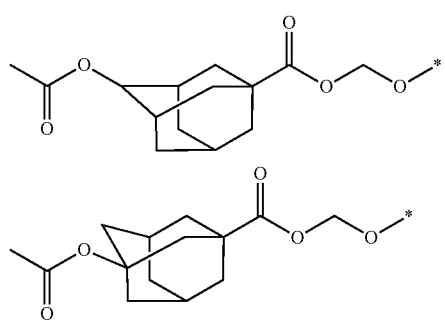
Examples of the group represented by formula (b1-2) include the following ones.
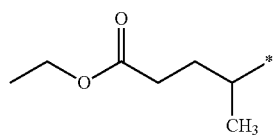
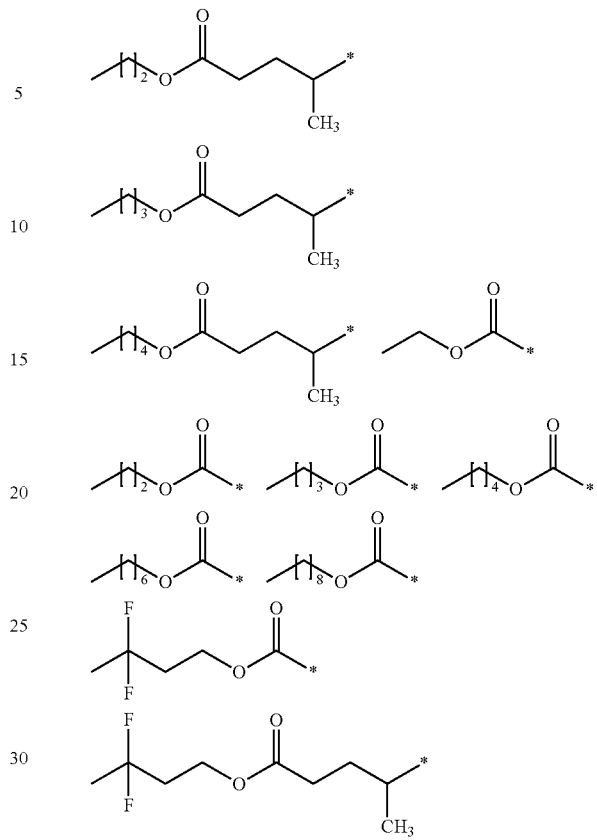
Examples of the group represented by formula (b1-9) include the following ones.
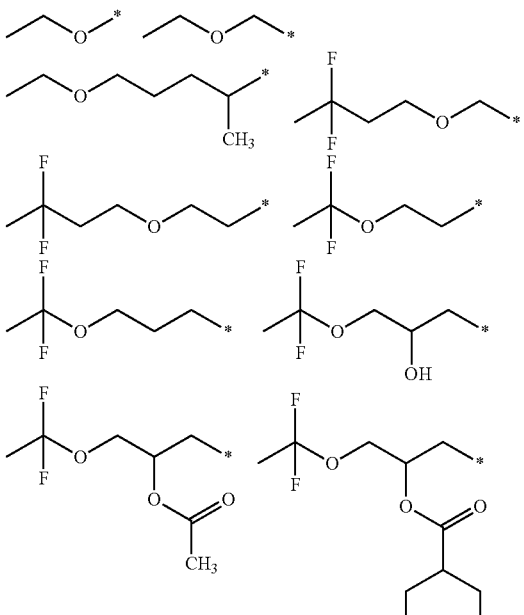
Examples of the group represented by formula (b1-10) include the following ones.

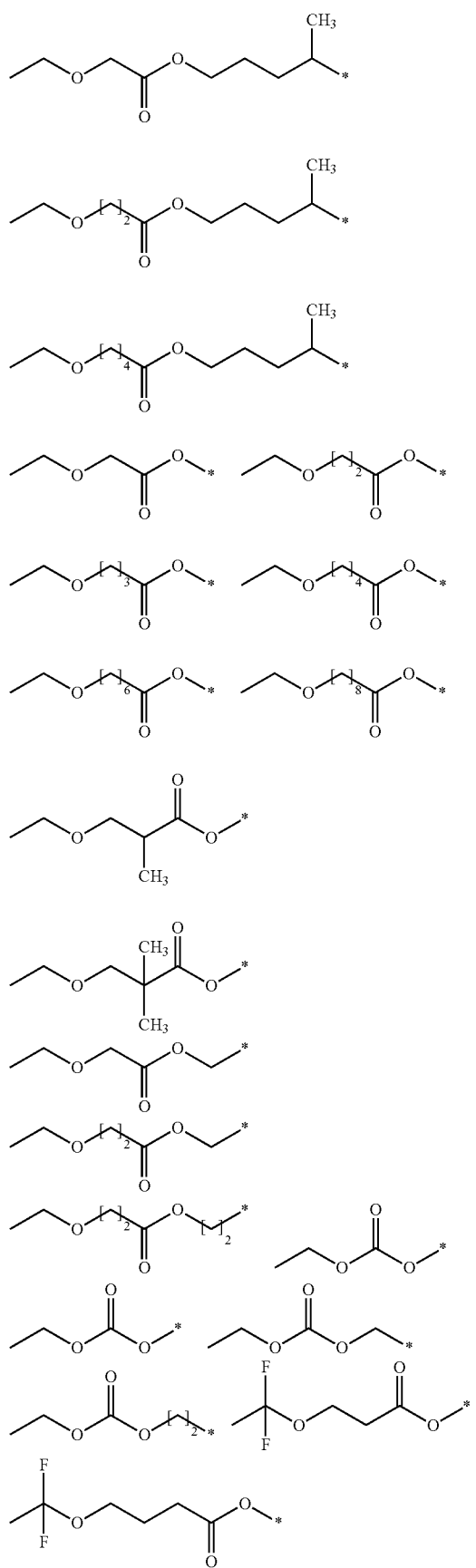
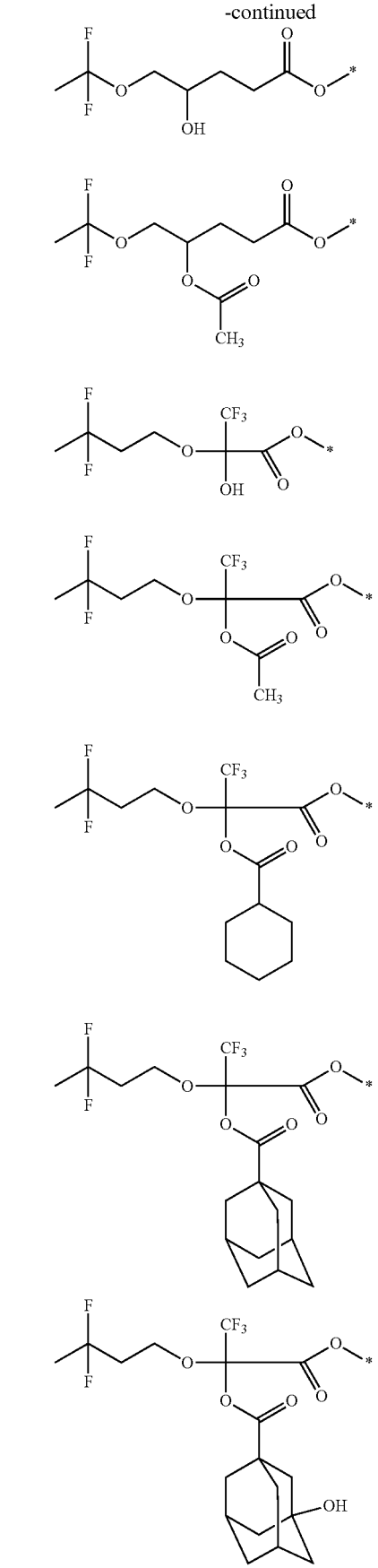

-continued
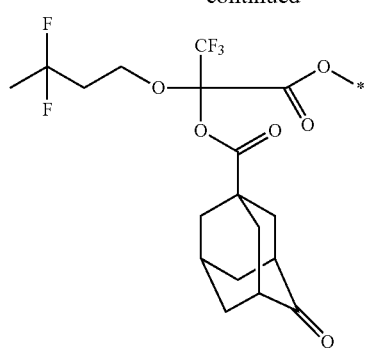
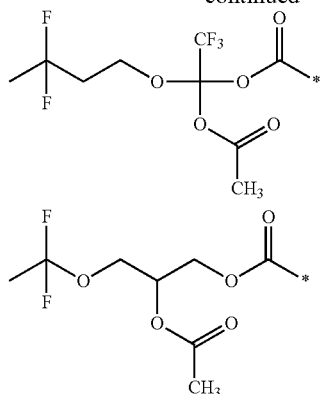
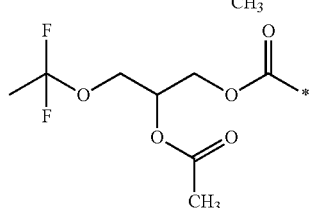
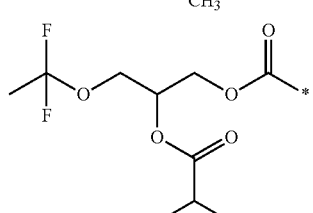
Examples of the group represented by formula (b1-11) include the following ones.
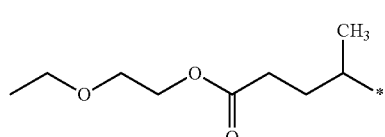
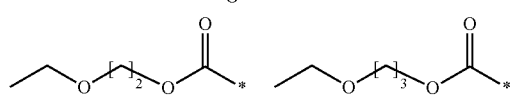
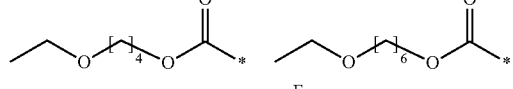
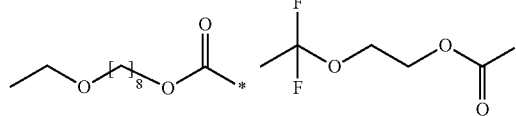
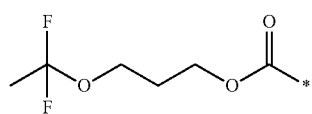
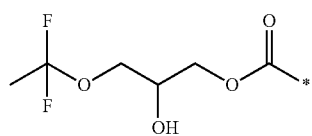
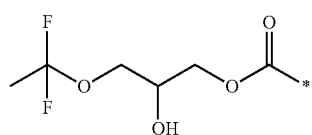
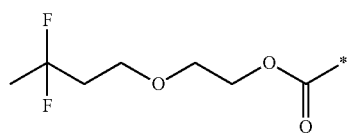
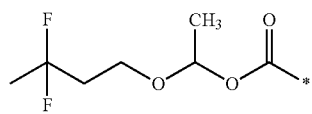
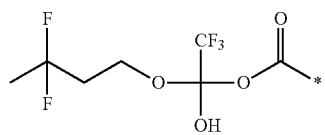
Preferred examples of the alicyclic hydrocarbon group represented by Y include those represented by the formula (Y1), the formula (Y2), the formula (Y3), the formula (Y4), the formula (Y5), the formula (Y6), the formula (Y7), the formula (Y8), the formula (Y9), the formula (Y10) and the formula (Y11).

When a methylene group has been replaced by an oxygen atom, a sulfonyl group or a carbonyl group in the alkyl or alicyclic hydrocarbon group represented by Y, preferred examples of Y include those represented by the formula (Y12), the formula (Y13), the formula (Y14), the formula (Y15), the formula (Y16), the formula (Y17), the formula (Y18), the formula (Y19), the formula (Y20), the formula (Y21), the formula (Y22), the formula (Y23), the formula (Y24), the formula (Y25) and the formula (Y26).

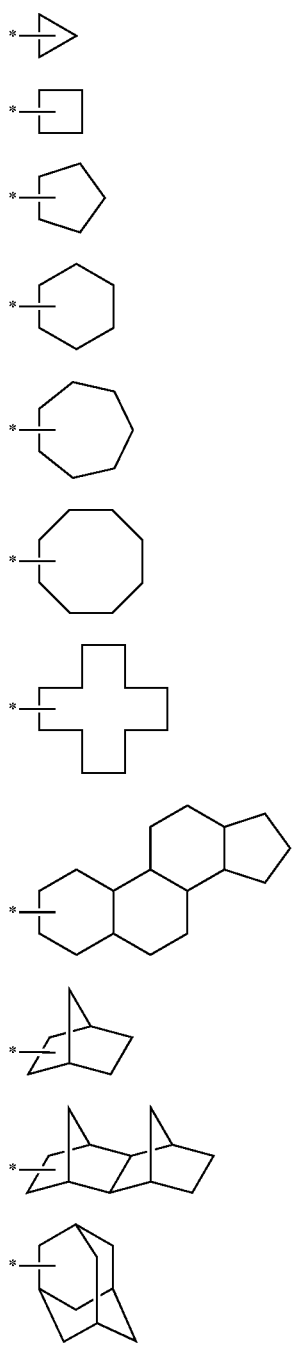
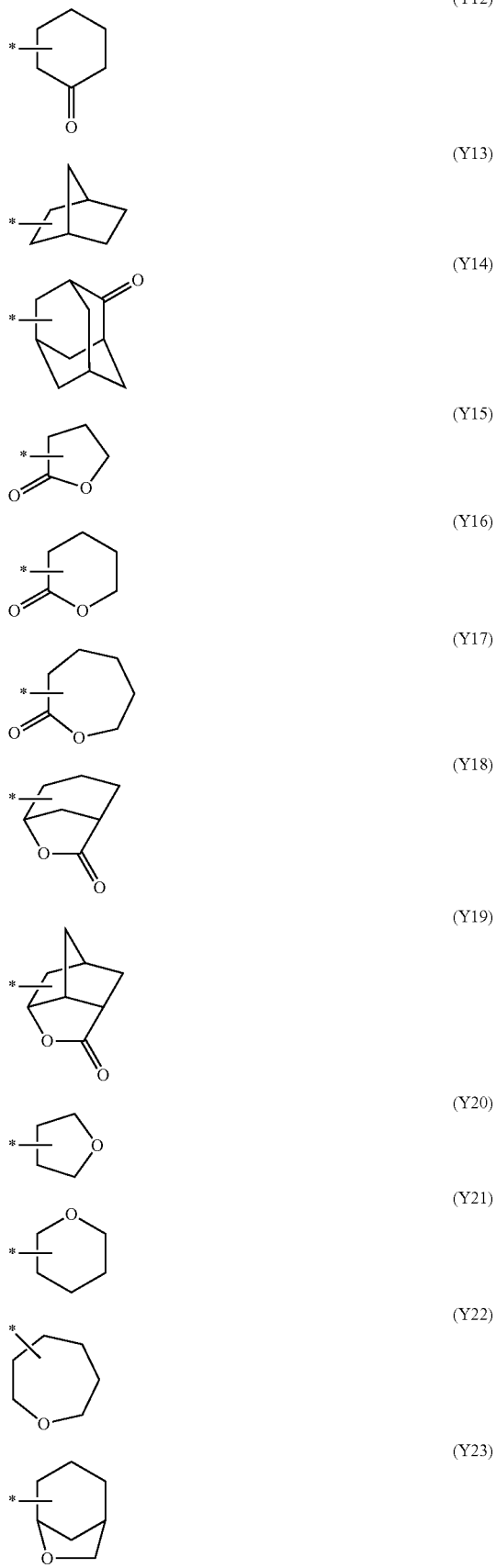

(Y24)

(Y25)

(Y26)

Among the groups represented by the formula (Y1) to the formula (Y26), preferred are those represented by formulae (Y1) to (Y19); more preferred are those represented by the formulae (Y11), (Y14), (Y15) and (Y19); and still more preferred are those represented by the formulae (Y11) and (Y14).

Substituents of the alkyl groups represented by Y include a halogen atom, a hydroxyl group, a C1-C12 alkoxy group, a C3-C16 alicyclic hydrocarbon group, a C6-C18 aromatic hydrocarbon group, a C7-C21 aralkyl group, a C2-C4 acyl group, a glycidyloxy group, and —$(CH_2)_{j2}$—O—CO— in which $R^{b1}$ represents an C1-C16 alkyl group, a C3-C16 alicyclic hydrocarbon group, or a C6-C18 aromatic hydrocarbon group, and j2 represents an integer of 0 to 4. Each of the alkyl group, the alicyclic hydrocarbon group, the aromatic hydrocarbon group and the aralkyl group, which are substituents for the alkyl hydrocarbon groups represented by Y, may have a substituent such as a halogen atom or a hydroxyl group.

Substituents of the alicyclic hydrocarbon groups represented by Y include a halogen atom, an C1-C12 alkyl group, a hydroxyl group, a C1-C12 alkoxy group, a C3-C16 alicyclic hydrocarbon group, a C6-C18 aromatic hydrocarbon group, a C7-C21 aralkyl group, a C2-C4 acyl group, a glycidyloxy group, and —$(CH_2)_{j2}$—O—CO—$R^{b1}$— in which $R^{b1}$ and j2 are defined as above. Each of the alkyl group, the alicyclic hydrocarbon group, the aromatic hydrocarbon group and the aralkyl group, which is the substituent for the alicyclic hydrocarbon groups represented by Y may have a substituent such as an alkyl group, a halogen atom or a hydroxyl group.

Examples of hydroxyl-containing alkyl group include a hydroxymethyl group and a hydroxyethyl group.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

Examples of the aralkyl group include a benzyl group, phenylpropyl group, a phenethyl group, a naphthylmethyl group, or a naphthylethyl group.

Examples of the acyl group include an acetyl group, a propyonyl group and a butyryl group. Examples of the halogen atom include a fluorine atom, a chlorine atom, a bromine atom and an iodine atom.

Examples of Y include the groups as follow.

where * represents a binding position.

Y represents preferably a C3-C18 alicyclic hydrocarbon group which may have a substituent, more preferably an amadantyl group which may have a substituent, and still more preferably an amadantyl group, a hydroxyamadantyl group or an oxoamadantyl group.

Preferred examples of the sulfonic acid anion of the salt represented by formula (B1) include salts represented by the formulae (B1-A-1) to (B1-A-33), preferably the formulae (B1-A-1) to (B1-A-4), (B1-A-9), (B1-A-10) and (B1-A-24) to (B1-A-33).

(B1-A-1)

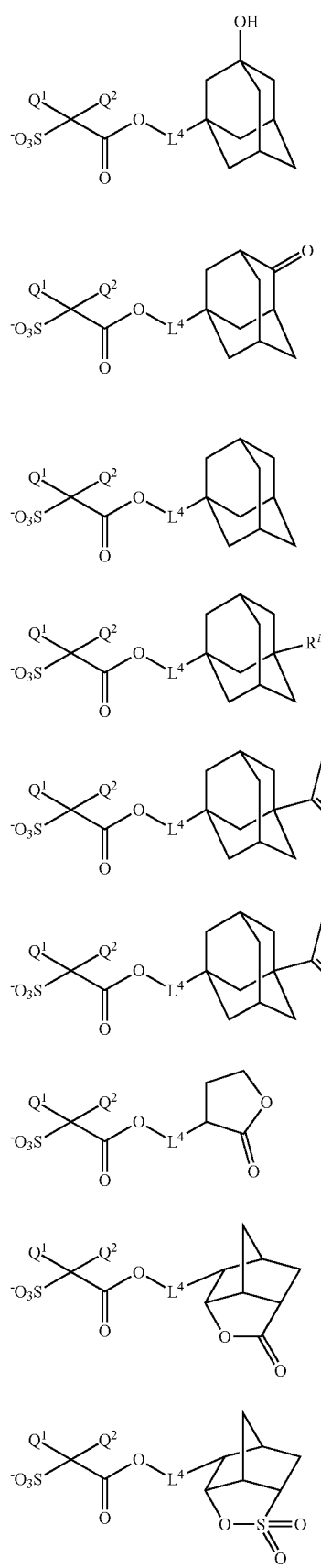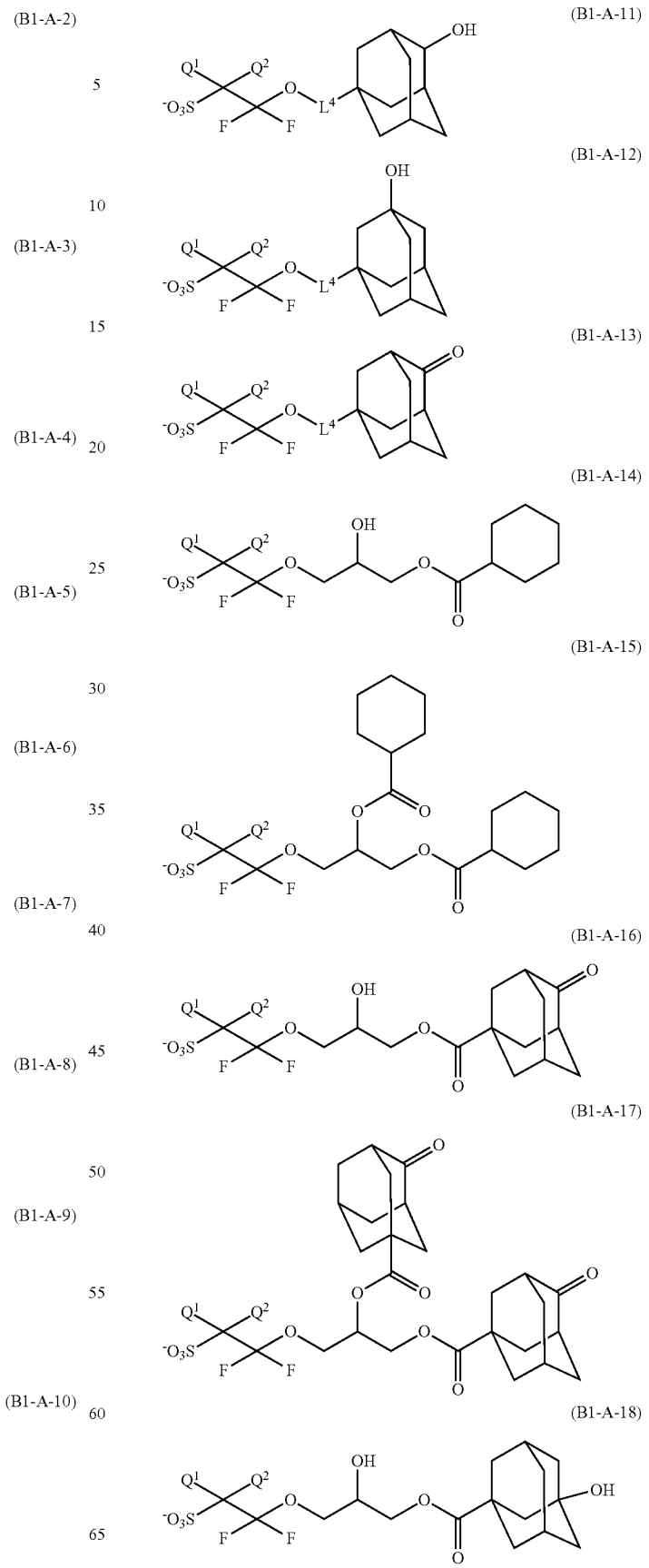

-continued
(B1-A-19)
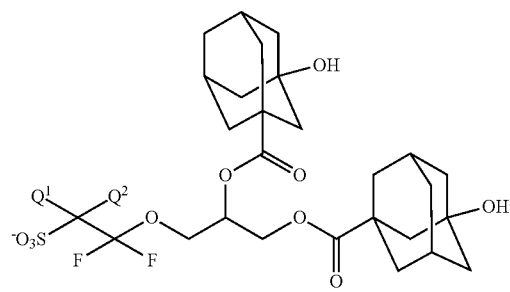
(B1-A-20)
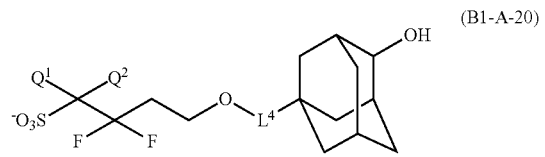
(B1-A-21)
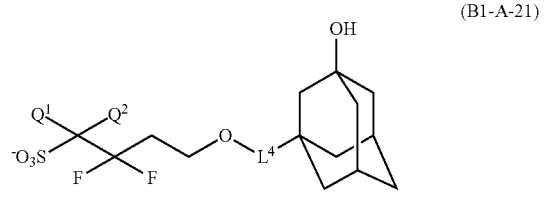
(B1-A-22)
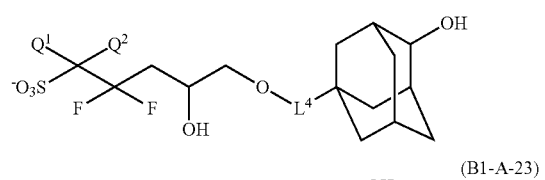
(B1-A-23)
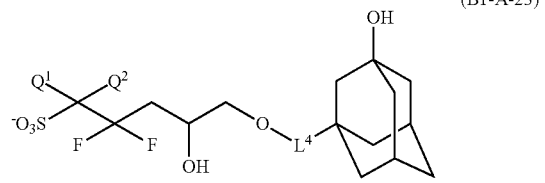
(B1-A-24)
(B1-A-25)
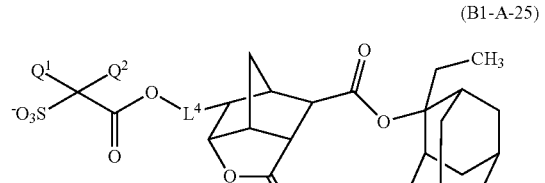
(B1-A-26)
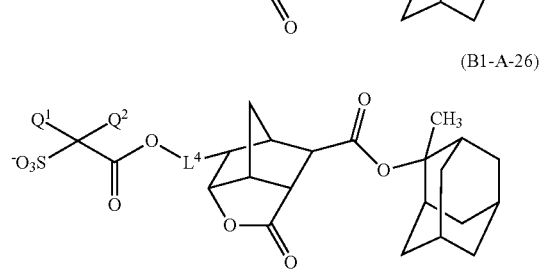
-continued
(B1-A-27)
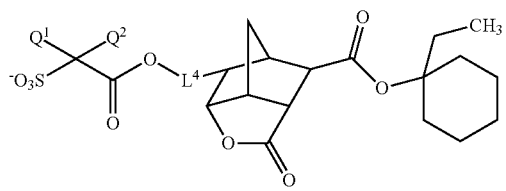
(B1-A-28)
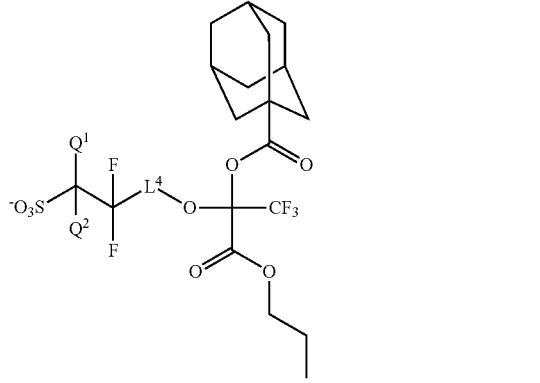
(B1-A-29)
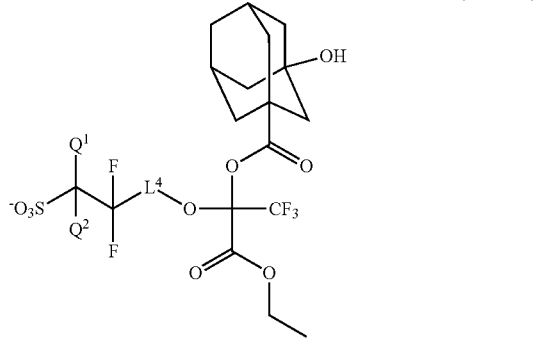
(B1-A-30)
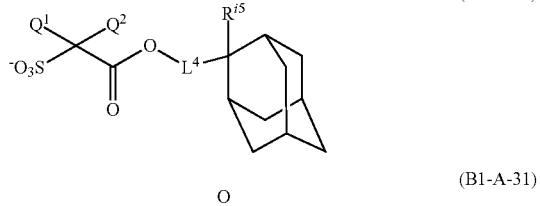
(B1-A-31)
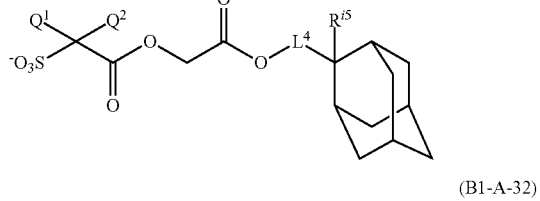
(B1-A-32)
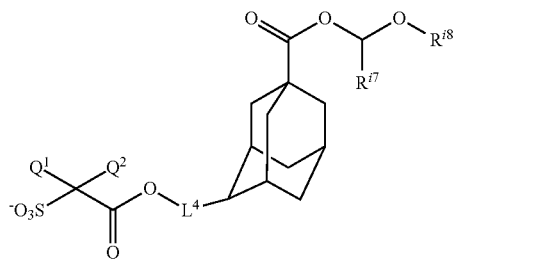

-continued

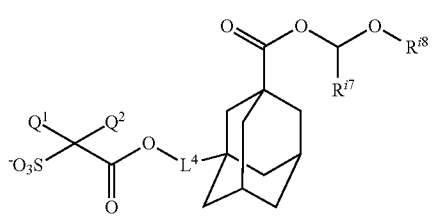
(B1-A-33)

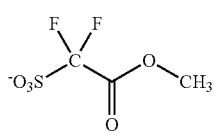
(B1a-6)

In these formulae, the symbols $Q^1$, $Q^2$, $L^4$, Y and $Z^+$ are defined as above, $R^{i2}$, $R^{i3}$, $R^{i4}$, $R^{i5}$, $R^{i6}$, $R^{i7}$ and $R^{i8}$ each independently represent a C1-C4 alkyl group, preferably a methyl group or an ethyl group, $R^{i8}$ represents a C1-C12 aliphatic hydrocarbon group, a C5-C12 monovalent alicyclic hydrocarbon group, or a combined group of them, preferably a methyl group, an ethyl group, a cyclohexyl group or an adamantyl group, and $L^4$ represents a single bond or a C1-C4 alkanediyl group.

Specific examples of the sulfonic acid anion of the salt represented by formula (B1) include anions mentioned in JP2010-204646A1. Among them, preferred examples of the sulfonic acid anion of the salt represented by formula (B1) include anions represented by formulae (B1a-1) to (B1a-15).

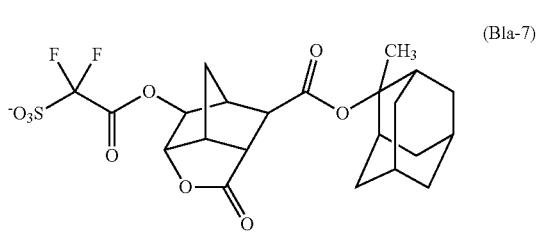
(B1a-7)

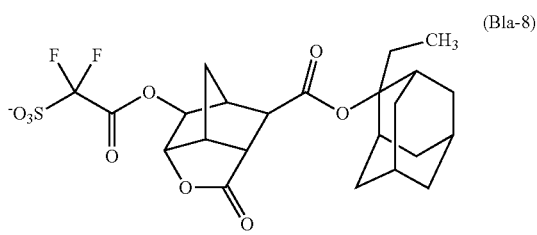
(B1a-8)

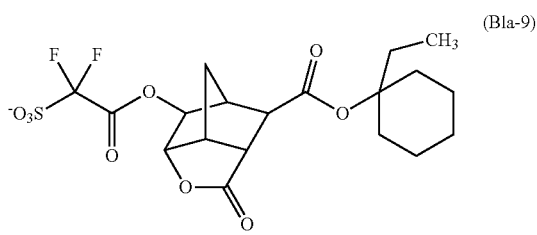
(B1a-9)

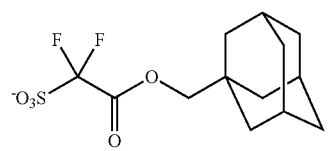
(B1a-1)

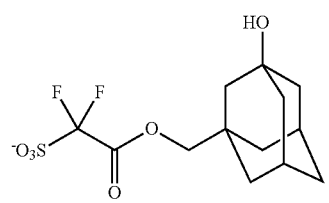
(B1a-2)

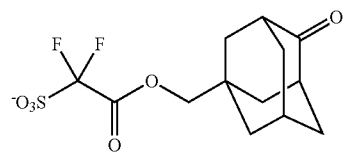
(B1a-3)

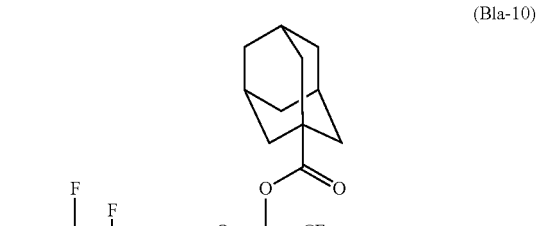
(B1a-10)

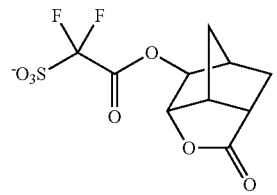
(B1a-4)

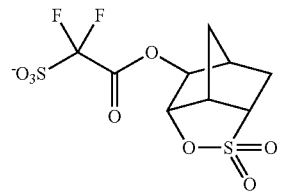
(B1a-5)

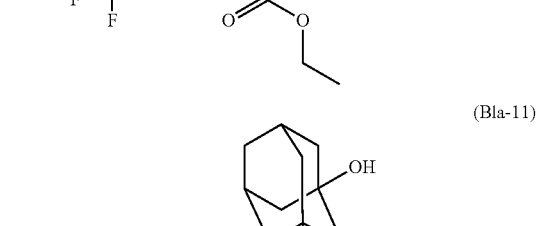
(B1a-11)

(Bla-12)

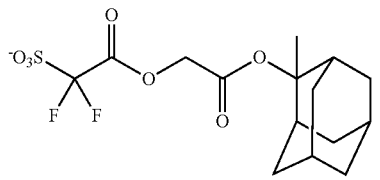

(Bla-13)

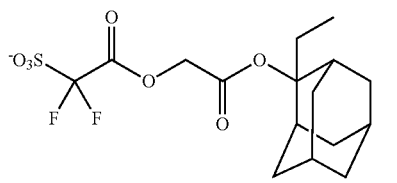

(Bla-14)

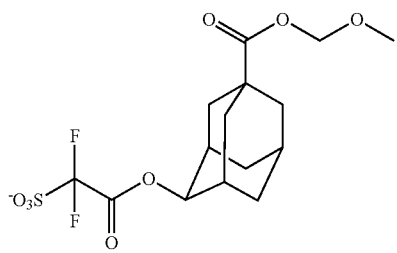

(Bla-15)

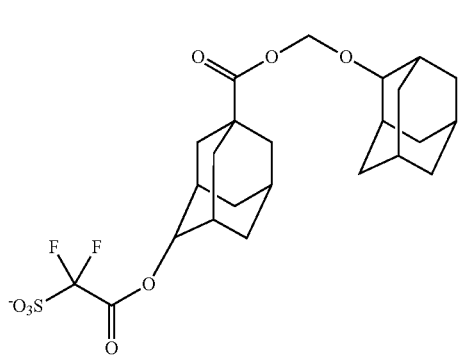

Among them, preferred are those represented by formulae (B1a-1) to (B1a-3) and (B1a-7) to (B1a-15).

Examples of the organic cation represented by $Z^+$ include an organic onium cation such as an organic sulfonium cation, an organic iodonium cation, an organic ammonium cation, a benzothiazolium cation and an organic phosphonium cation, and an organic sulfonium cation and an organic iodonium cation are preferred, and an arylsulfonium cation is more preferred. Herein, the arylsulfonium includes those having one, two or three aryl groups.

Preferred examples of the organic cations represented by $Z^+$ include those represented by the formulae (b2-1) to (b2-4):

(b2-1)

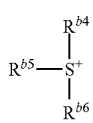

(b2-2)

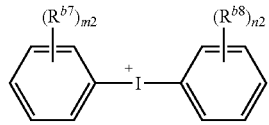

(b2-3)

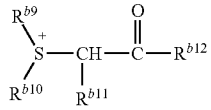

(b2-4)

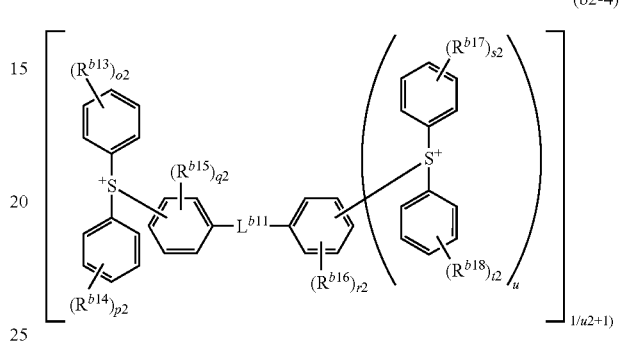

wherein $R^{b4}$, $R^{b5}$ and $R^{b6}$ independently represent a C1-C30 aliphatic hydrocarbon group which can have a substituent selected from the group consisting of a hydroxyl group, a C1-C12 alkoxy group, a C6-C18 aromatic hydrocarbon group, a C3-C18 alicyclic hydrocarbon group which can have a substituent selected from the group consisting of a halogen atom, a C2-C4 acyl group and a glycidyloxy group, and a C6-C18 aromatic hydrocarbon group which can have a substituent selected from the group consisting of a halogen atom, a hydroxyl group, C1-C18 alicyclic hydrocarbon group, or C1-C12 alkoxy group, and $R^{b4}$ and $R^{b5}$, $R^{b4}$ and $R^{b6}$, or $R^{b5}$ and $R^{b6}$ can be bonded each other to form a ring containing $S^+$, $R^{b7}$ and $R^{b8}$ are independently in each occurrence a hydroxyl group, a C1-C12 aliphatic hydrocarbon group or a C1-C12 alkoxy group, m2 and n2 independently represents an integer of 0 to 5, $R^{b9}$ and $R^{b10}$ independently represent a C1-C18 aliphatic hydrocarbon group or a C3-C18 alicyclic hydrocarbon group, or $R^{b9}$ and $R^{b10o}$ are bonded each other to form a C1-C10 divalent acyclic hydrocarbon group which forms a 3- to 12-membered ring, preferably 3- to 7-membered ring together with the adjacent —$S^+$—, and one or more —$CH_2$— in the divalent acyclic hydrocarbon group may be replaced by an oxygen atom, sulfur atom or carbonyl group, and $R^{b11}$ represents a hydrogen atom, a C1-C18 aliphatic hydrocarbon group, or a C3-C18 alicyclic hydrocarbon group, and $R^{b12}$ represents a C1-C12 aliphatic hydrocarbon group, a C3-C18 alicyclic hydrocarbon group, a C6-C18 aromatic hydrocarbon group which can have a substituent selected from the group consisting of a C1-C12 alkyl group, a C1-C12 alkoxyl group, C1-C18 alicyclic hydrocarbon group and a C2-C12 alkylcarbonyloxy group, or $R^{b11}$ and $R^{b12}$ are bonded each other to form a C1-C10 divalent acyclic hydrocarbon group which forms a 2-oxo-cycloalkyl group together with the adjacent —CHCO—, and one or more —$CH_2$— in the divalent acyclic hydrocarbon group may be replaced by an oxygen atom, sulfur atom or carbonyl group, and $R^{b13}$, $R^{b14}$, $R^{b15}$, $R^{b16}$, $R^{b17}$ and $R^{b18}$ independently represent a hydroxyl group, a C1-C12 alkyl group or a C1-C12 alkoxy group, $L^{b11}$ represents —S— or —O—, o2, p2, s2 and t2 each independently represents an integer of 0 to 5, q2 and r2 each independently represents an integer of 0 to 4, and u2 represents 0 or 1.

Examples of the aliphatic hydrocarbon group represented by $R^{b4}$ to $R^{b6}$ include a methyl group, an ethyl group, a propyl group, an isopropyl group, a butyl group, a sec-butyl group, a tert-butyl group, a pentyl group, a hexyl group, an octyl group, a decyl group, a dodecyl group, a hexadecyl group, a pentadecyl group, a heptadecyl group and an octadecyl group, and preferred examples thereof include a methyl group, an ethyl group, a propyl group and a butyl group. The alicyclic hydrocarbon group represented by $R^{b4}$ to $R^{b6}$ may be monocyclic or polycyclic. The monocyclic hydrocarbon group includes cycloalkyl groups such as a cyclopropyl group, a cyclobutyl group, a cyclopentyl group, a cyclohexyl group, a cycloheptyl group, and a cyclodecyl group. The polycyclic alicyclic hydrocarbon group includes cycloalkyl groups such as decahydronaphtyl group, an adamantyl group, a norbornyl group, a methylnorbornyl group, and other polycyclic groups as mentioned bellow.

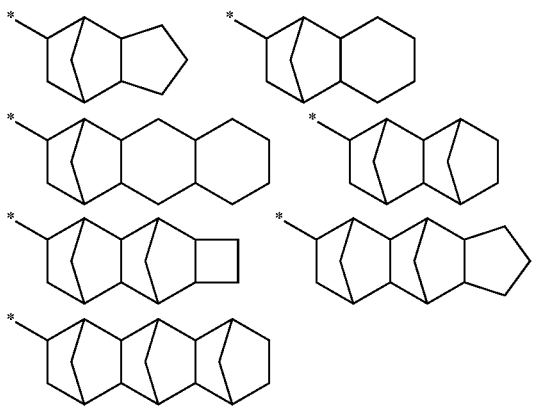

wherein * represents a binding site to an adamantane ring or a cyclohexane ring.

Preferred examples of the alicyclic hydrocarbon group include a cyclopentyl group and a cyclohexyl group.

Examples of the aromatic group represented by $R^{b4}$ to $R^{b6}$ include an aryl group such as a phenyl group, a naphthyl group, p-methyl phenyl group, p-ethyl phenyl group, p-tert butyl phenyl group, p-adamantyl phenyl group, tolyl group, xylyl group, cumenyl group, mesityl group, biphenyl group, phenantolyl group, 2,6-diethylphenyl group and 2-methyl-6-ethylphenyl group.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group.

Examples of the halogen atom include a fluorine atom, a chlorine atom, a bromine atom and an iodine atom.

Examples of the C2-C4 acyl group include an acetyl group, a propyonyl group and a butyryl group.

The ring containing $S^+$ formed by bonding $R^{b4}$ and $R^{b5}$, $R^{b4}$ and $R^{b6}$, or $R^{b5}$ and $R^{b6}$ each other may be a monocyclic ring, a polycyclic ring, an aromatic ring, a non-aromatic ring, a saturated ring or a unsaturated ring. The ring can contain one or more sulfur atom or oxygen atom in addition to S. The ring preferably has 3 to 18 carbon atoms, and more preferably has 4 to 18 carbon atoms. The ring having a sulfur atom preferably has 3 to 18 carbon atoms, more preferably has 3 to 12 carbon atoms, and still more preferably has 3 to 7 carbon atoms, specific examples of which include the following ones.

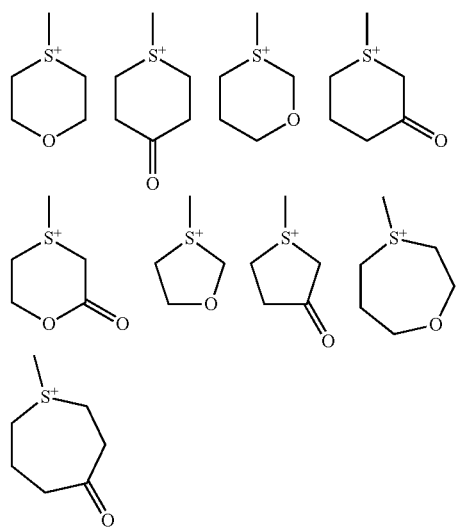

Examples of the aliphatic hydrocarbon group represented by $R^{b9}$ and $R^{b10}$ include a methyl group, an ethyl group, a propyl group, an isopropyl group, a butyl group, a sec-butyl group, a tert-butyl group, a pentyl group, a hexyl group, an octyl group and a 2-ethylhexyl group. Examples of the C1-C12 alkoxy group represented by $R^{b9}$ and $R^{b10}$ include a methoxy group, an ethoxy group, a propoxy group, a butoxy group, a pentyloxy group, a hexyloxy group, a heptyloxy group, an octyloxy group, a decyloxy group and a dodecyloxy group.

Examples of the aliphatic hydrocarbon group represented by $R^{b9}$ to $R^{b12}$ include a methyl group, an ethyl group, a propyl group, an isopropyl group, a butyl group, a sec-butyl group, a tert-butyl group, a pentyl group, a hexyl group, an octyl group and a 2-ethylhexyl group. Such alkyl group preferably has 1 to 12 carbon atoms. Examples of the alicyclic hydrocarbon group represented by $R^{b9}$ to $R^{b11}$ include a cyclopropyl group, a cyclobutyl group, a cyclopentyl group, a cyclohexyl group, a cycloheptyl group, a cyclodecyl group, a 2-alkyl-2-adamantyl group, a 1-(1-adamantyl)-1-alkyl group and an isobornyl group.

The alicyclic hydrocarbon group represented by $R^{b9}$ to $R^{b11}$ has preferably 3 to 18 carbon atoms, more preferably 4 to 12 carbon atoms.

Preferred examples of the aromatic group represented by $R^{b12}$ include a phenyl group, 4-methyl phenyl group, 4-ethyl phenyl group, 4-tert butyl phenyl group, 4-cyclohexyl phenyl group, 4-methoxy phenyl group, biphenyl group and a naphthyl group, and a phenyl group is more preferred.

Preferred examples of the aromatic group where a hydrogen atom has been replaced by an alkoxy group include p-methoxyphenyl group.

Preferred examples of the group in which the alkyl group has been combined with the aromatic hydrocarbon group represented by $R^{b12}$ include an aralkyl group such as benzyl group.

Preferred examples of the alkylcarbonyloxy group represented by $R^{b12}$ include a group consisting of an acyl group and an oxygen atom.

Examples of the C3-C12 divalent acyclic hydrocarbon group formed by bonding $R^{b9}$ and $R^{b10}$ include a trimethylene group, a tetramethylene group and a pentamethylene group. Examples of the ring group formed together with the adjacent $S^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferred.

Examples of the C1-C10 divalent acyclic hydrocarbon group formed by bonding $R^{b11}$ and $R^{b12}$ include a methylene group, an ethylene group, a trimethylene group, a tetramethylene group and a pentamethylene group. Examples of the ring include oxocyclopentane ring, oxocyclohexane ring, oxonorbornene ring and oxoamadantane ring. A C1-C5 divalent acyclic hydrocarbon group is preferred.

Among the above-mentioned cations, preferred is the cation represented by the formula (b2-1) or the formula (b2-2), more preferred is the cation represented by the formula (b2-1), still more preferred is the cation represented by the formula (b2-1) and particularly more preferred is the cation represented by the formula (b2-1-1).

It is more preferred that $R^{b19}$, $R^{b20}$ and $R^{b21}$ are independently in each occurrence a halogen atom, specifically a fluorine atom, a hydroxyl group, a C1-C12 alkyl group or a C1-C12 alkoxy group, and v2, w2 and x2 independently each represent 0 or 1.

As the cation represented by the formula (b2-1-1), a triphenylsulfonium cation and a trytolysulfonium cation are especially preferred.

Examples of the salt represented by formula (B1) include a salt wherein the anion is any one of the above-mentioned anions and the counter ion is any one of organic counter ions. Preferred salt represented by formula (B1) are those consisting of cation represented by formula (b2-1-1) and any one of anions represented by formulae (b1a-1) to (b1a-3) and (b1a-7) to (b1a-15) as well as those consisting of cation represented by formula (b2-3) and any one of anions represented by formulae (b1a-1) to (b1a-3) and (b1a-7) to (b1a-15).

The salt represented by formula (B1) are preferably salts represented by formulae (B1-1) to (B1-28), and more preferably salts which have triphenylsulfonium cation or tri-tolylsulfonium cation, i.e., salts represented by formulae (B1-1), (B1-2), (B1-3), (B1-5), (B1-6), (B1-7), (B1-11), (B1-12), (B1-13), (B1-14), (B1-20), (B1-21), (B1-23), (B1-24), (B1-25) and (B1-26).

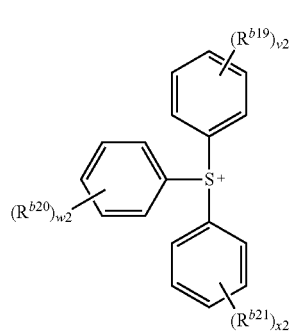

(b2-1-1)

wherein $R^{b19}$, $R^{b20}$ and $R^{b21}$ are independently in each occurrence a halogen atom (preferably a fluorine atom), a hydroxyl group, a C1-C18 aliphatic hydrocarbon group, a C3-C18 saturated cyclic hydrocarbon group or a C1-C12 alkoxy group,
and $R^{b19}$ and $R^{b20}$, $R^{b19}$ and $R^{b21}$ or $R^{b20}$ and $R^{b21}$ can be bonded each other to form a ring together with $S^+$ and v2, w2 and x2 independently each represent an integer of 0 to 5.

The ring represented by two of $R^{b19}$, $R^{b20}$ and $R^{b21}$ may be a monocyclic polycyclic, aromatic or nonaromatic. It preferably has at least one sulfur atom, more preferably at least one sulfur atom and at least one oxygen atom.

The aliphatic hydrocarbon group has preferably 1 to 12 carbon atoms, and the saturated cyclic hydrocarbon group has preferably 4 to 18 carbon atoms. Each of $R^{b19}$, $R^{b20}$ and $R^{b21}$ is preferably a halogen atom (preferably a fluorine atom), a hydroxyl group, a C1-C12 alkyl group and a C1-C12 alkoxy group, or two of $R^{b19}$, $R^{b20}$ and $R^{b21}$ together with $S^+$ preferably represent a ring which contains an oxygen atom and a sulfur atom.

The v2, w2 and x2 independently each preferably represent 0 or 1.

Examples of the organic cations represented by formulae (b2-1-1) include organic cations mentioned in JP2010-204646A1.

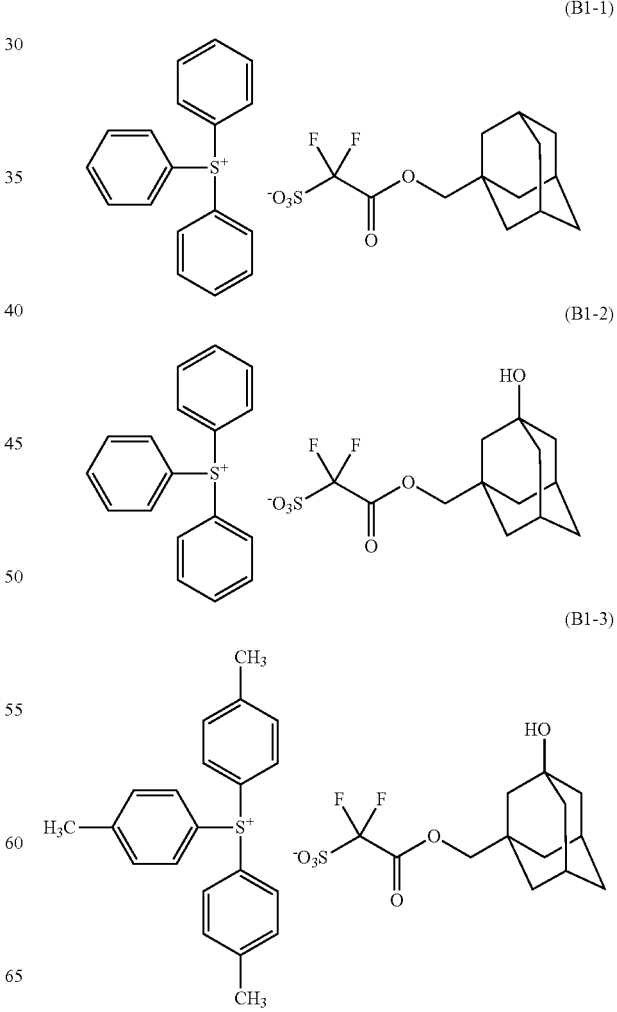

(B1-4)
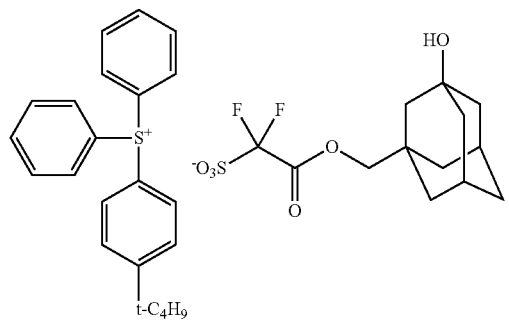
(B1-8)
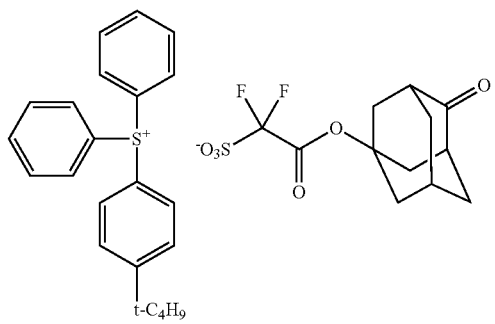
(B1-5)
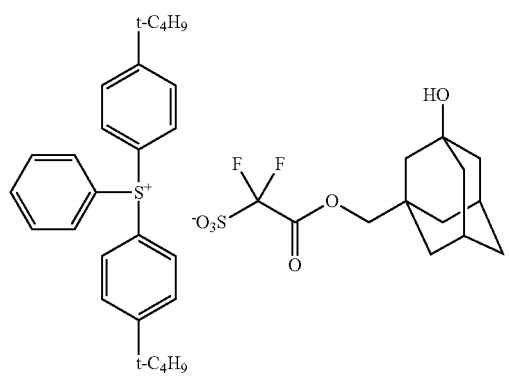
(B1-9)
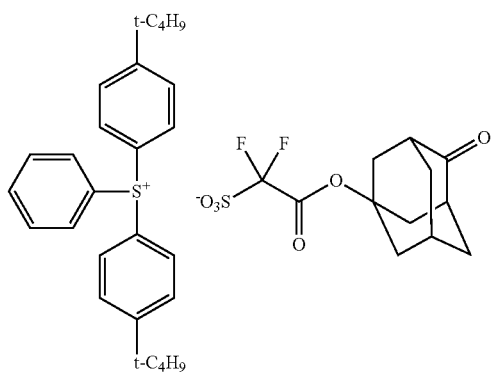
(B1-6)
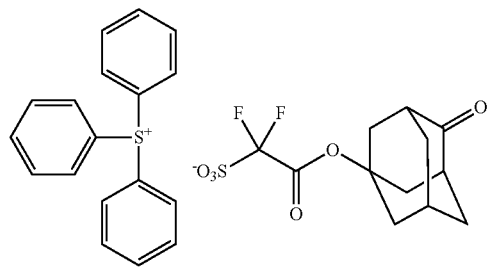
(B1-10)
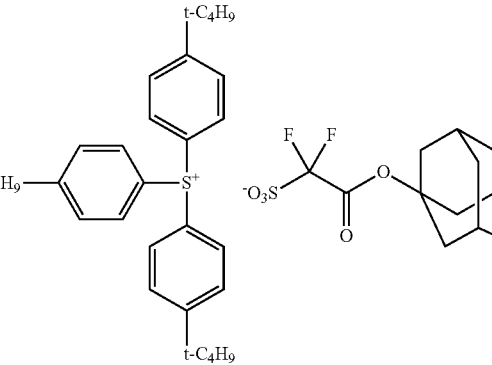
(B1-7)
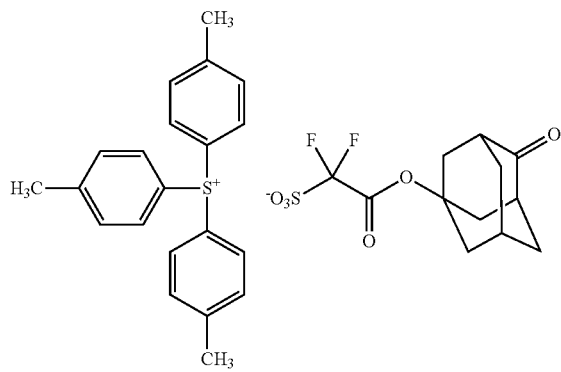
(B1-11)
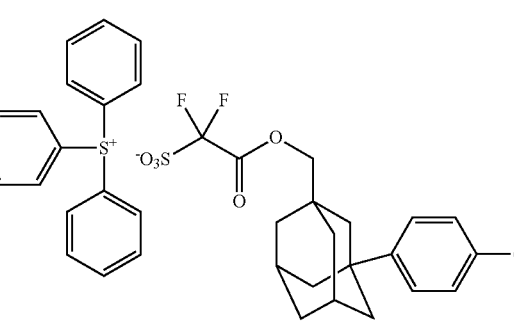

(B1-12)
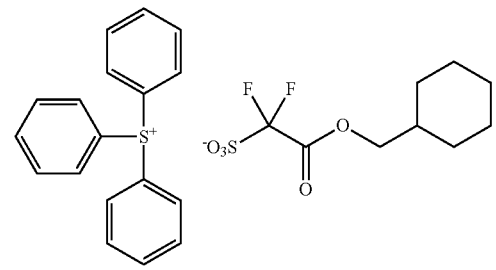
(B1-13)
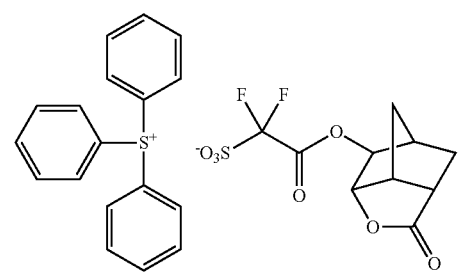
(B1-14)
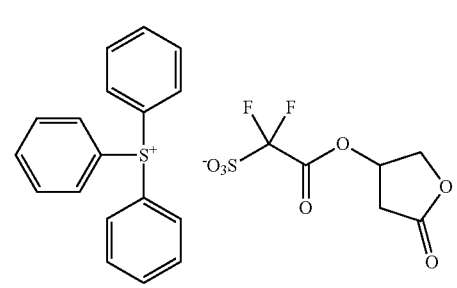
(B1-15)
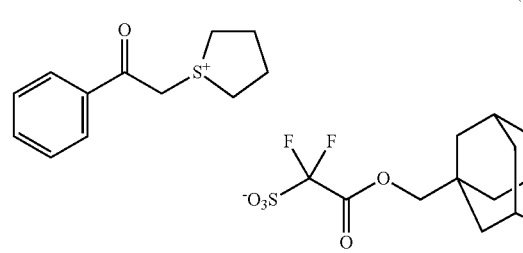
(B1-16)
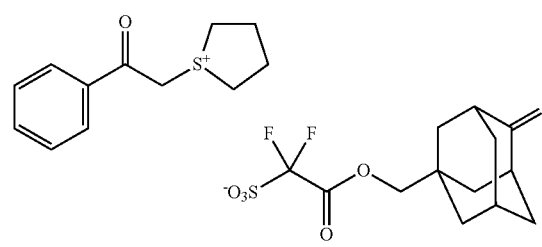
(B1-17)
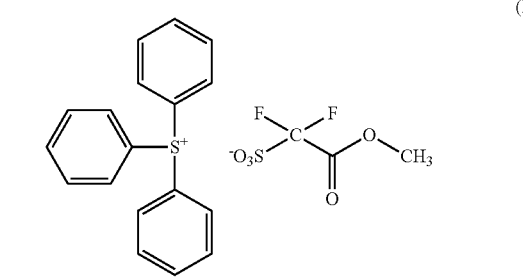
(B1-18)
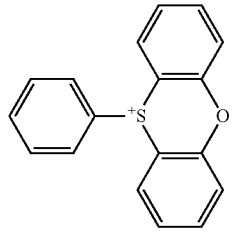
(B1-19)
(B1-20)
(B1-21)
(B1-22)

115
-continued
(B1-23)
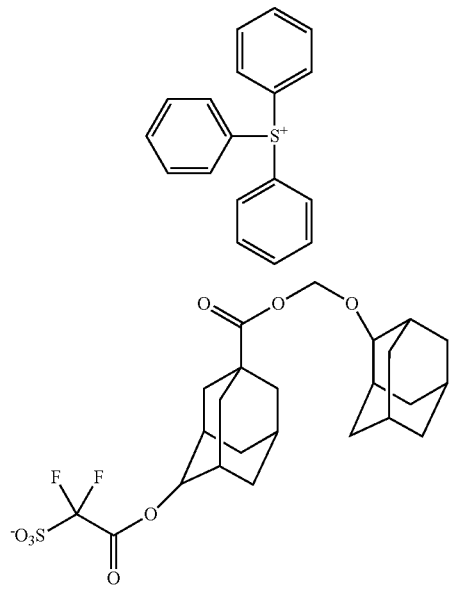
116
-continued
(B1-25)
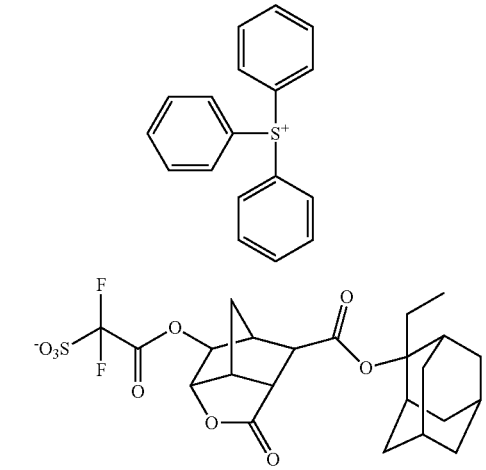
(B1-26)
(B1-24)
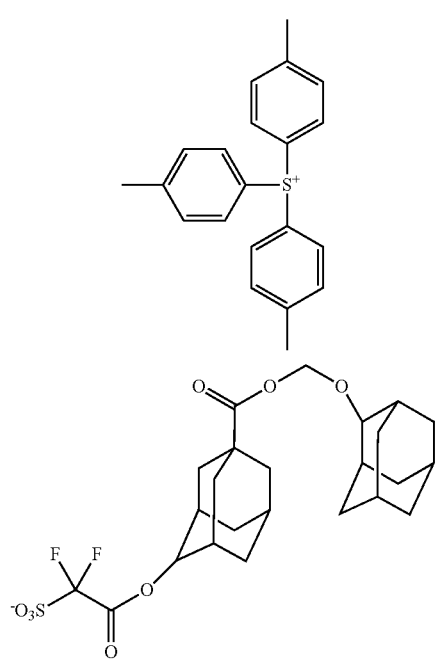
(B1-27)

(B1-28)

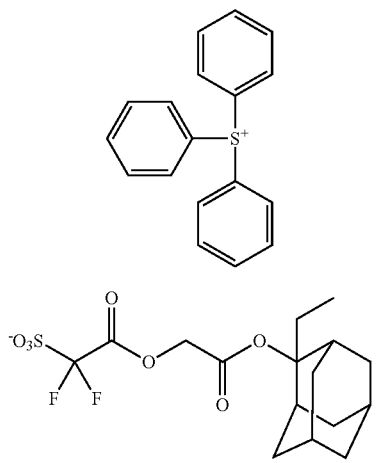

The content of the acid generator is preferably 1 parts by weight or more and more preferably 3 parts by weight or more per 100 parts by weight of the sum of resin, and the content of the acid generator is preferably 30 parts by weight or less and more preferably 25 parts by weight or less per 100 parts by weight of the resin.

The content of the acid generator represented by formula (B1) is preferably 30 parts by weight or more, and more preferably 50 parts by weight or more, per 100 parts by weight of the total acid generator.

The photoresist compositions of the present invention comprise a solvent.

The amount of the solvent is usually 90% by weight or more, preferably 92% by weight or more preferably 94% by weight or more based on total amount of the photoresist composition of the present invention. The amount of the solvent is usually 99.9% by weight or less and preferably 99% by weight or less based on total amount of the photoresist composition of the present invention. The content can be measured with known methods such as liquid chromatography or gas chromatography.

Examples of the solvent include a glycol ether ester such as ethyl cellosolve acetate, methyl cellosolve acetate and propylene glycol monomethyl ether acetate; a glycol ether such as propylene glycol monomethyl ether; an ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The photoresist compositions of the present invention can comprise a quencher. The quencher has the property that it can trap an acid, especially an acid generated from the acid generator by applying a radiation. Examples of the quencher include a basic nitrogen-containing organic compound and a weak acid salt.

Examples of the basic nitrogen-containing organic compound include an amine compound such as an aliphatic amine, an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Examples of the basic nitrogen-containing organic compound include preferably compounds represented by the formulae (C1) to (C8), more preferably compounds represented by the formula (C1), still more preferably (C1-1):

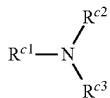

(C1)

wherein $R^{c1}$, $R^{c2}$ and $R^{c3}$ independently represent a hydrogen atom, a C1-C6 alkyl group, a C5-C10 alicyclic hydrocarbon group or a C6-C10 aromatic hydrocarbon group, and the alkyl group and the alicyclic hydrocarbon group can have a substituent selected from the group consisting of a hydroxyl group, an amino group and a C1-C6 alkoxy group, and the aromatic hydrocarbon group can have a substituent selected from the group consisting of C1-C6 alkyl groups, a C5-C10 alicyclic hydrocarbon group, a hydroxyl group, an amino group, and a C1-C6 alkoxy group,

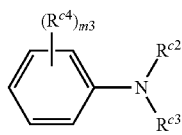

(C1-1)

wherein $R^{c2}$ and $R^{c3}$ are defined as above, each of $R^{c4}$ independently represents a C1-C6 alkyl group, a C1-C6 alkoxy group, a C5-C10 alicyclic hydrocarbon group or a C6-C10 aromatic hydrocarbon group, and m3 represents an integer of 0 to 3;

(C2)

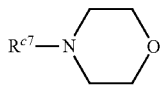

(C3)

(C4)

wherein $R^{c5}$, $R^{c6}$, $R^{c7}$ and $R^{c9}$ are defined same as $R^{c1}$, each of $R^{c9}$ independently represents a C1-C6 alkyl group, a C3-C6 alicyclic group, or a C2-C6 alkanoyl group, and n3 represents an integer of 0 to 8,

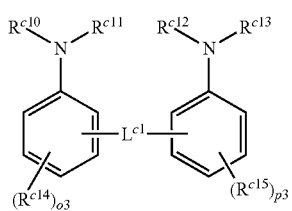

(C5)

-continued

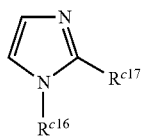
(C6)

wherein each of $R^{c10}$, $R^{c11}$, $R^{c12}$, $R^{c13}$ and $R^{c16}$ is defined same as $R^{c1}$, each of $R^{c14}$, $R^{c15}$ and $R^{c17}$ is defined same as $R^{c4}$, $L^{c1}$ represents a C1-C6 alkanediyl group, —CO—, —C(=NH)—, —S— or a combination thereof, and o3 and p3 respectively represent an integer of 0 to 3,

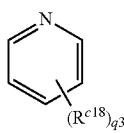
(C7)

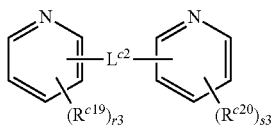
(C8)

wherein each of $R^{c18}$, $R^{c19}$ and $R^{c20}$ is defined same as $R^{c4}$, $L^{c2}$ represents a single bond, a C1-C6 alkanediyl group, —CO—, —C(=NH)—, —S— or a combination thereof, and q3, r3 and p3 respectively represent an integer of 0 to 3.

Examples of the compound represented by the formula (C1) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-dimethyldiphenylmethane. Among them, preferred is diisopropylaniline and more preferred is 2,6-diisopropylaniline Examples of the compound represented by the formula (C2) include piperazine.

Examples of the compound represented by the formula (C3) include morpholine.

Examples of the compound represented by the formula (C4) include piperidine and hindered amine compounds having a piperidine skeleton as disclosed in JP 11-52575 A.

Examples of the compound represented by the formula (C5) include 2,2'-methylenebisaniline.

Examples of the compound represented by the formula (C6) include imidazole and 4-methylimidazole.

Examples of the compound represented by the formula (C7) include pyridine and 4-methylpyridine.

Examples of the compound represented by the formula (C8) include di-2-pyridylketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetrabutylammonium hydroxide, tetrahexylammonium hydroxide, tetraoctylammonium hydroxide, phenyltrimethylammonium hydroxide, β-trifluoromethylphenyl)trimethylammonium hydroxide and (2-hydroxyethyl)trimethylammonium hydroxide (so-called "choline").

The weak acid salt is usually lower in acidity than the acid generator, examples of which include carboxylic acid salts and sulfonic acid salts.

Specific examples of it include a salt represented by formula (C9).

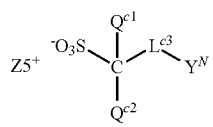
(C9)

In the formula, $Q^{c1}$ and $Q^{c2}$ each independently represent a fluorine atom or a C1-C6 perfluoroalkyl group, $L^{c3}$ represents a single bond or a C1-C17 divalent saturated hydrocarbon group in which a methylene group may be replaced by —O— or —CO—, $Y^N$ represents a monovalent organic group having a nitrogen atom, and $Z^{5+}$ represents an organic cation.

Examples of $Q^{c1}$ and $Q^{c2}$ each independently include those as referred to for $Q^1$ and $Q^2$ of formula (B1).

Examples of $Y^N$ include preferably a monovalent nitrogen-containing heterocyclic group such as an imidazole ring or a morpholine ring. The divalent saturated hydrocarbon group represented by $L^{c3}$ includes linear chain alkanediyl groups, branched chain alkanediyl groups, monocyclic or polycyclic divalent saturated hydrocarbon groups, and a group combining two or more of the above-mentioned groups. Examples of $L^{c3}$ include linear chain alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, a heptadecane-1,17-diyl group, an ethane-1,1-diyl group, a propane-1,1-diyl group, a propane-2,2-diyl group;

branched chain groups such as an ethane-1,1-diyl group, a propane-1,1-diyl group, propane-1,2-diyl group, propane-2,2-diyl group, a pentane-2,4-diyl group, a 1-methylpropane-1,3-diyl group, a 2-methylpropane-1,2-diyl group, a pentane-1,4-diyl group, and a 2-methylbutane-1,4-diyl group;

divalent alicyclic hydrocarbon groups including a cyclobutane-1,3-diyl group, a cyclopentane-1,3-diyl group, a cyclohexane-1,4-diyl group and a cyclooctane-1,5-diyl group; and a polycyclic divalent alicyclic hydrocarbon groups such as a nobornane-1,4-diyl group, a nobornane-1,5-diyl group, an amadantane-1,5-diyl group, or an amadantane-2,6-diyl group. Examples of the divalent saturated hydrocarbon group in which a methylene group has been replaced by an oxygen atom or a carbonyl group include groups represented by the formulae (c9-1) to (c9-9), as follow.

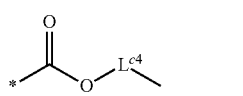

(c9-1)

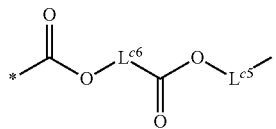

(c9-2)

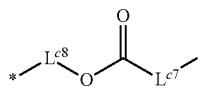

(c9-3)

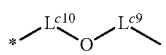

(c9-4)

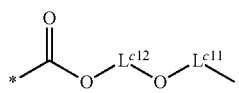

(c9-5)

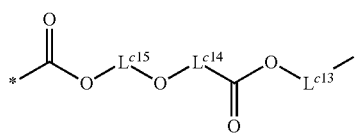

(c9-6)

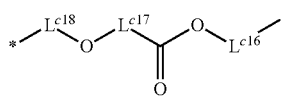

(c9-7)

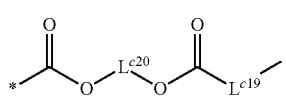

(c9-8)

In formulae, $L^{c4}$ represents a single bond or a C1-C15 divalent saturated hydrocarbon group;

$L^{c5}$ represents a single bond or a C1-C12 divalent saturated hydrocarbon group and $L^{c6}$ represents a C1-C13 divalent saturated hydrocarbon group, provided that total number of the carbon atoms of $L^{c5}$ and $L^{c6}$ is up to 13;

$L^{c7}$ represents a single bond or a C1-C14 divalent saturated hydrocarbon group and $L^{c8}$ represents a C1-C15 divalent saturated hydrocarbon group, provided that total number of the carbon atoms of $L^{c7}$ and $L^{c8}$ is up to 15;

$L^{c9}$ represents a single bond or a C1-C15 divalent saturated hydrocarbon group and $L^{10}$ represents a C1-C16 divalent saturated hydrocarbon group, provided that total number of the carbon atoms of $L^{c9}$ and $L^{10}$ is up to 15;

$L^{c11}$ represents a single bond or a C1-C13 divalent saturated hydrocarbon group and $L^{c12}$ represents a C1-C14 divalent saturated hydrocarbon group, provided that total number of the carbon atoms of $L^{c11}$ and $L^{c12}$ is up to 14;

$L^{c13}$ and $L^{c14}$ each independently represent a single bond or a C1-C11 divalent saturated hydrocarbon group and $L^{c15}$ represents a C1-C12 divalent saturated hydrocarbon group, provided that total number of the carbon atoms of $L^{c13}$, $L^{c14}$ and $L^{c15}$ is up to 12;

$L^{c16}$ and $L^{c17}$ each independently represent a single bond or a C1-C13 divalent saturated hydrocarbon group and $L^{c18}$ represents a C1-C14 divalent saturated hydrocarbon group, provided that total number of the carbon atoms of $L^{c16}$, $L^{c17}$ and $L^{c18}$ is up to 14;

$L^{c19}$ represents a single bond or a C1-C12 divalent saturated hydrocarbon group and $L^{c20}$ represents a C1-C13 divalent saturated hydrocarbon group, provided that total number of the carbon atoms of $L^{c19}$ and $L^{c20}$ is up to 13;

$L^{c3}$ is preferably one represented by formula (C9-1), more preferably where $L^{c4}$ is a single bond or a C1-C6 aliphatic hydrocarbon group. Examples of groups represented by formula (C9-1) include the following ones.

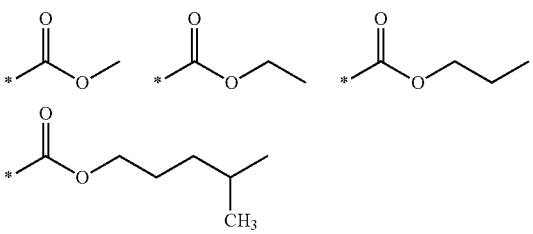

Examples of groups represented by formula (C9-2) include the following ones.

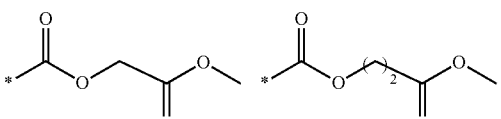

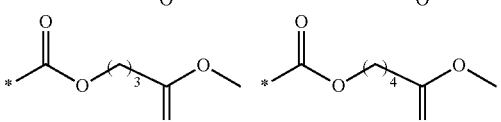

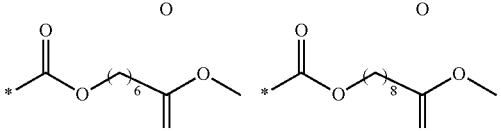

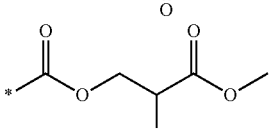

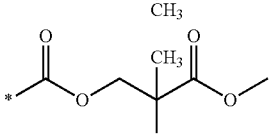

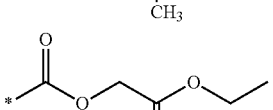

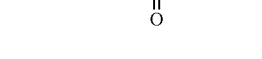

-continued
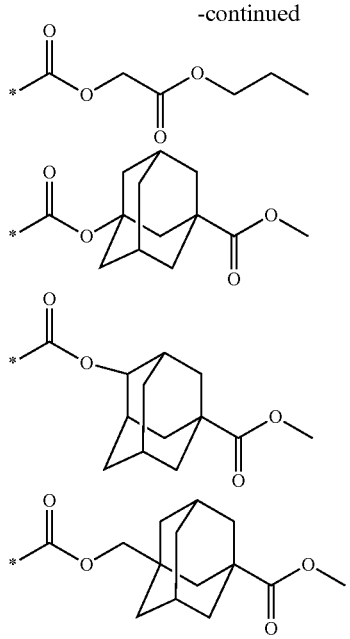
Examples of groups represented by formula (C9-3) include the following ones.
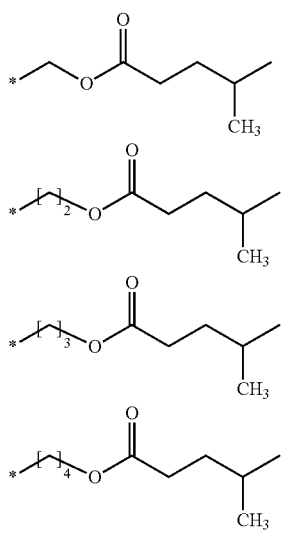
Examples of groups represented by formula (C9-4) include the following ones
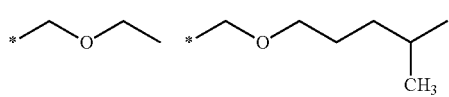
Examples of groups represented by formula (C9-5) include the following ones.
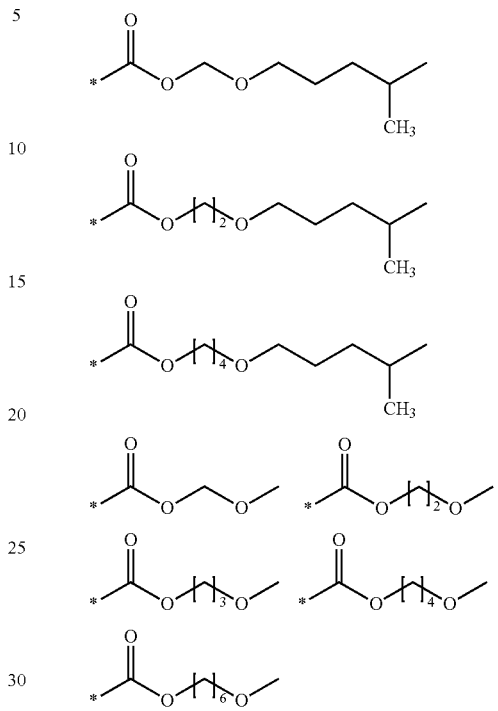
Examples of groups represented by formula (C9-6) include the following ones.
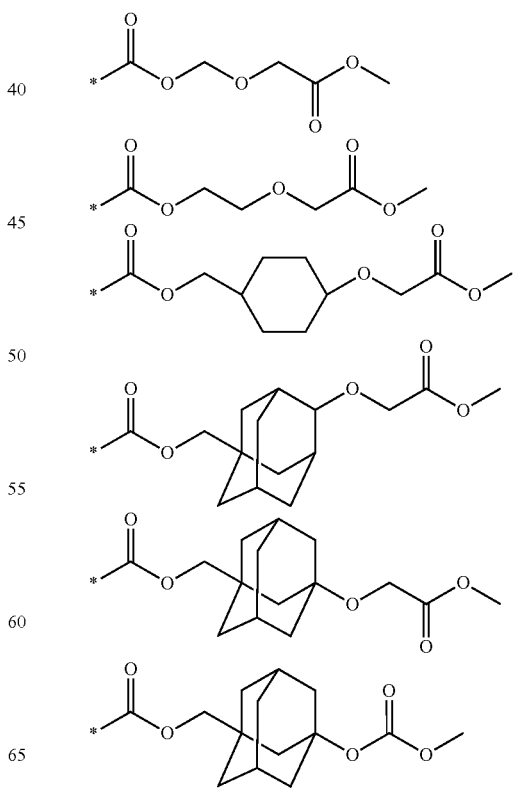

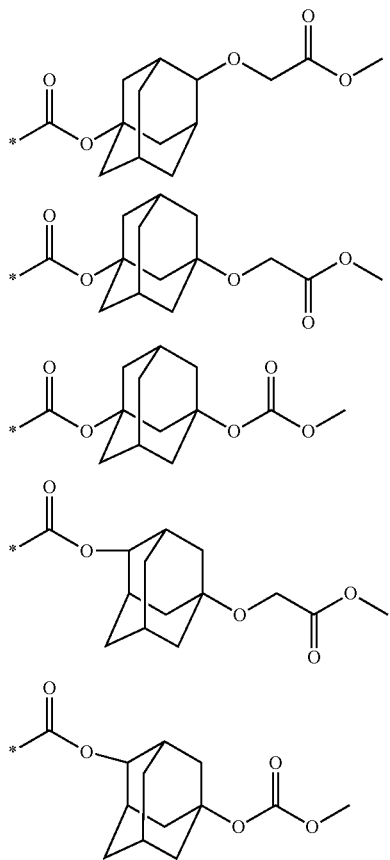
Examples of groups represented by formula (C9-7) include the following ones.
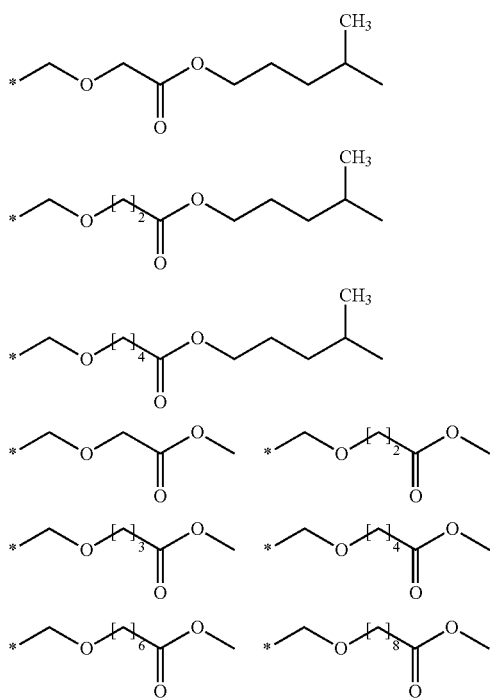
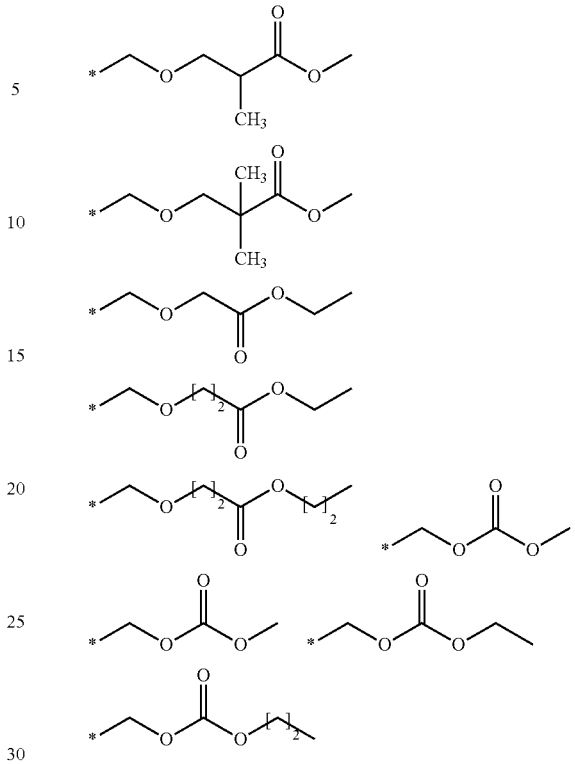
Examples of groups represented by formula (C9-8) include the following ones.
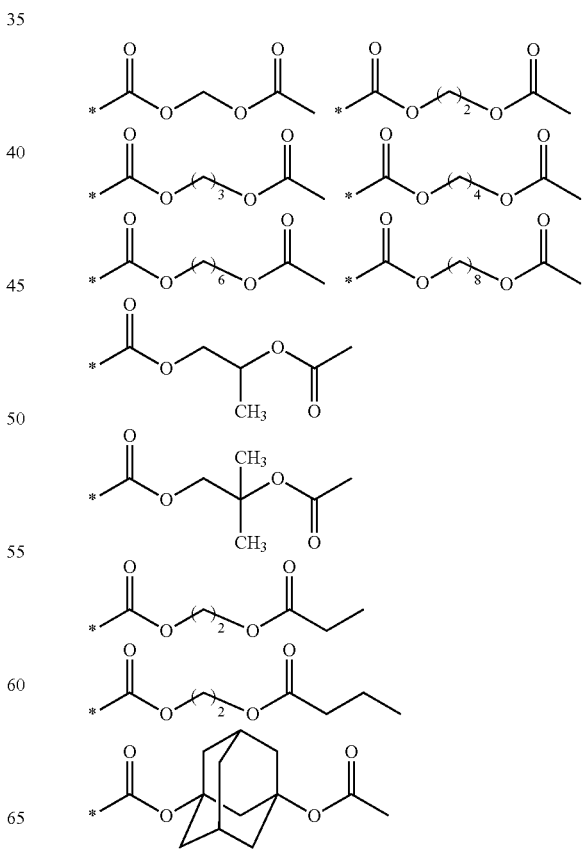

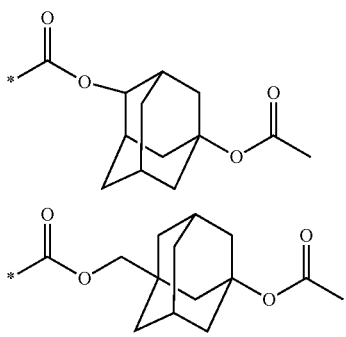

Examples of the salt represented by formula (C9) include the following ones and salts as mentioned in JP2012-6908A1 and JP2012-72109A1.

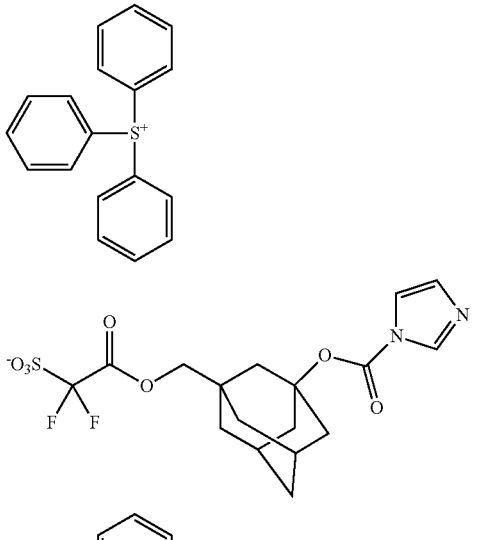

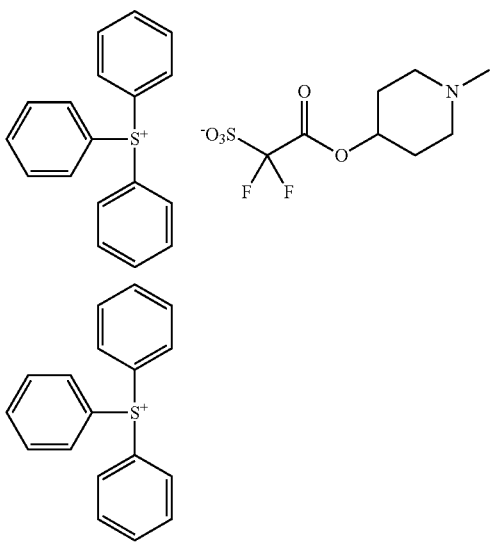

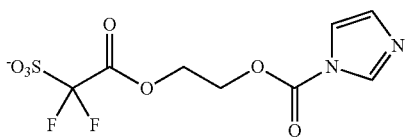

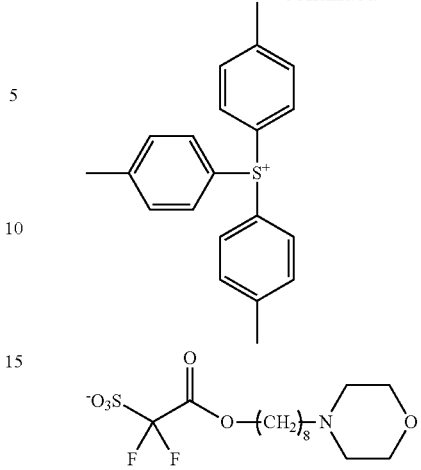

The weak acid salt is preferably a salt represented by formula (C10) or (C11).

$$Z6^+ {}^-OCO-R^{c21} \quad (C10)$$

In the formula, $R^{c21}$ represents a C1-C10 monovalent aliphatic hydrocarbon group which may have a substituent, a C4-C36 monovalent alicyclic hydrocarbon group which may have a substituent, a C6-C10 aromatic hydrocarbon group which may have a substituent, or a C3-C36 heterocyclic hydrocarbon group which may have a substituent. In the monovalent aliphatic hydrocarbon group and the monovalent alicyclic hydrocarbon group, a methyelene group can be replaced by an oxygen atom or a carbonyl group. $Z^{6+}$ represents an organic cation.

$$Z7^+ {}^-O_3N-N\begin{matrix}R^{c22}\\R^{c23}\end{matrix} \quad (C11)$$

In the formula, $R^{c22}$ and $R^{c23}$ each independently represent a hydrogen atom, a C1-C12 monovalent aliphatic hydrocarbon group which may have a substituent, a C3-C20 monovalent alicyclic hydrocarbon group, a C6-C20 aromatic hydrocarbon group, or a C7-C21 aralkyl hydrocarbon group. The monovalent aliphatic hydrocarbon group, the monovalent alicyclic hydrocarbon group, and the aralkyl group can respectively have a substituent selected from the group consisting of a hydroxyl group, a cyano group, a fluorine atom, a trifluoromethyl group, and a nitro group. In the monovalent aliphatic hydrocarbon group, a methyelene group can be replaced by an oxygen atom or a carbonyl group. Or $R^{c22}$ and $R^{c23}$ represent a C4-C20 cyclic group together with the nitrogen atom attaching to them.

$Z^{7+}$ represents an organic cation.

Examples of the organic cations represented by $Z^{6+}$ and $Z^{7+}$ include an organic onium cation such as an organic sulfonium cation, an organic iodonium cation, an organic ammonium cation, a benzothiazolium cation and an organic phosphonium cation, and an organic sulfonium cation and an organic iodonium cation are preferred, and an arylsulfonium cation is more preferred. Specific examples of the organic cations represented by $Z^{6+}$ and $Z^{7+}$ include those represented by the formulae (b2-1) to (b2-4) as mentioned above.

Preferred organic cations represented by $Z^{6+}$ and $Z^{7+}$ are the same as referred to as a cation for the acid generator.

Examples of the salt represented by formula (C10) include the following ones and salts as mentioned in JP2011-39502A1.

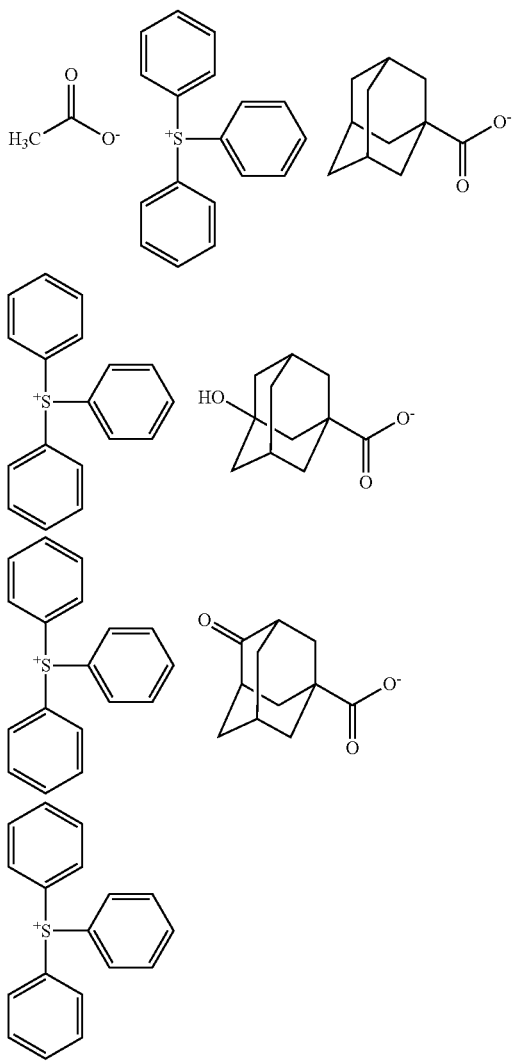

Examples of the salt represented by formula (C11) include the following ones and salts as mentioned in JP2011-191745A1.

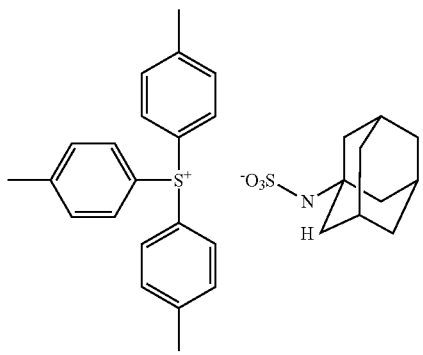

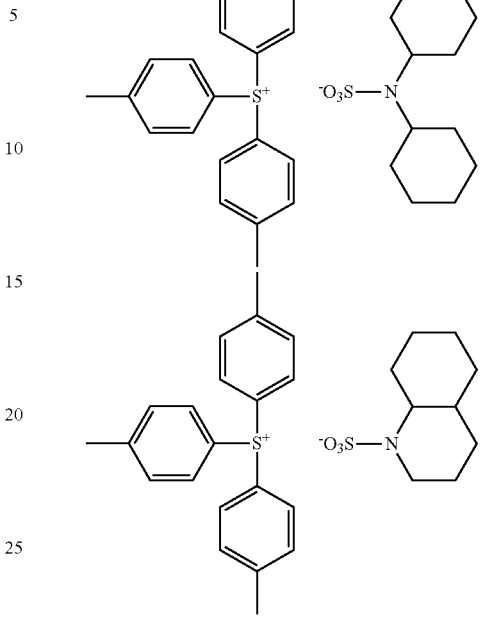

When the photoresist composition of the present invention comprises a quencher, its total content is preferably 0.01 to 10% by weight, more preferably 0.01 to 8% by weight, still more preferably 0.01 to 5% by weight, further still more preferably 0.01 to 3% by weight, based on sum of solid component.

The photoresist compositions of the present invention can comprise a compound represented by formula (D).

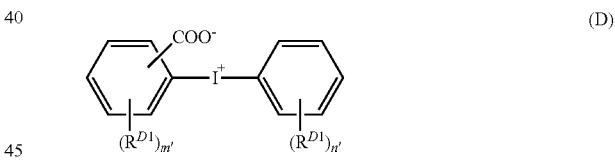

(D)

In the formula, $R^{D1}$ and $R^{D2}$ each independently represent a C1-C12 monovalent hydrocarbon group, a C1-C6 alkoxy group, a C2-C7 acyl group, a C2-C7 acyloxy group, a C2-C6 alkoxycarbonyl group, a nitro group or a halogen atom; and m' and n' each independently represent an integer of 0 to 4.

The monovalent hydrocarbon group includes any of monovalent aliphatic hydrocarbon groups, monovalent alicyclic hydrocarbon groups, monovalent aromatic hydrocarbon groups and a combination thereof.

Examples of the monovalent aliphatic hydrocarbon group include an alkyl group such as methyl, ethyl, propyl, isopropyl, butyl, sec-butyl, tert-butyl, pentyl, hexyl and nonyl groups.

The monovalent alicyclic hydrocarbon group may be any one of monocyclic or polycyclic hydrocarbon group, and saturated or unsaturated hydrocarbon group. Examples thereof include a cycloalkyl group such as a cyclopropyl group, a cyclobutyl group, a cyclopentyl group, a cyclohexyl group, a cyclononyl group and a cyclododecyl group; an adamantyl group and a norbornyl group.

Examples of the monovalent aromatic hydrocarbon group include anarylgroupsuchasphenyl, 1-naphthyl, 2-naphthyl, 2-methylphenyl, 3-methylphenyl, 4-methylphenyl, 4-ethylphenyl, 4-propylphenyl, 4-isopropylphenyl, 4-butylphenyl, 4-tert-butylphenyl, 4-hexylphenyl, 4-cyclohexylphenyl, anthryl, p-adamantylphenyl, tolyl, xylyl, cumenyl, mesityl, biphenyl, phenanthryl, 2,6-diethylphenyl and 2-methyl-6-ethylphenyl groups.

Examples of the combination thereof include an alkyl-cycloalkyl, a cycloalkyl-alkyl, and aralkyl groups such as phenylmethyl, 1-phenylethyl, 2-phenylethyl, 1-phenyl-1-propyl, 1-phenyl-2-propyl, 2-phenyl-2-propyl, 3-phenyl-1-propyl, 4-phenyl-1-butyl, 5-phenyl-1-pentyl and 6-phenyl-1-hexyl groups.

Examples of the alkoxyl group include methoxy and ethoxy groups.

Examples of the acyl group include acetyl, propanonyl, benzoyl and cyclohexanecarbonyl groups.

Examples of the acyloxy group include a group in which oxy group [—O—] bonds to an acyl group.

Examples of the alkoxycarbonyl group include a group in which the carbonyl group [—CO—] bonds to the alkoxy group, such as methoxycarbonyl, ethoxycarbonyl, n-propoxycarbonyl, isopropoxycarbonyl, n-butoxycarbonyl, sec-butoxycarbonyl, and tert-butoxycarbonyl groups.

Examples of the halogen atom include a chlorine atom, a fluorine atom and bromine atom.

In the formula (D), $R^{D1}$ and $R^{D2}$ in each occurrence independently preferably represent a C1-C8 alkyl group, a C3-C10 cycloalkyl group, a C1-C6 alkoxyl group, a C2-C4 acyl group, a C2-C4 acyloxy group, a C2-C4 alkoxycarbonyl group, a nitro group or a halogen atom.

m and n independently preferably represent an integer of 0 to 2, more preferably 0.

Examples of the compound represented by formula (D) include the following ones.

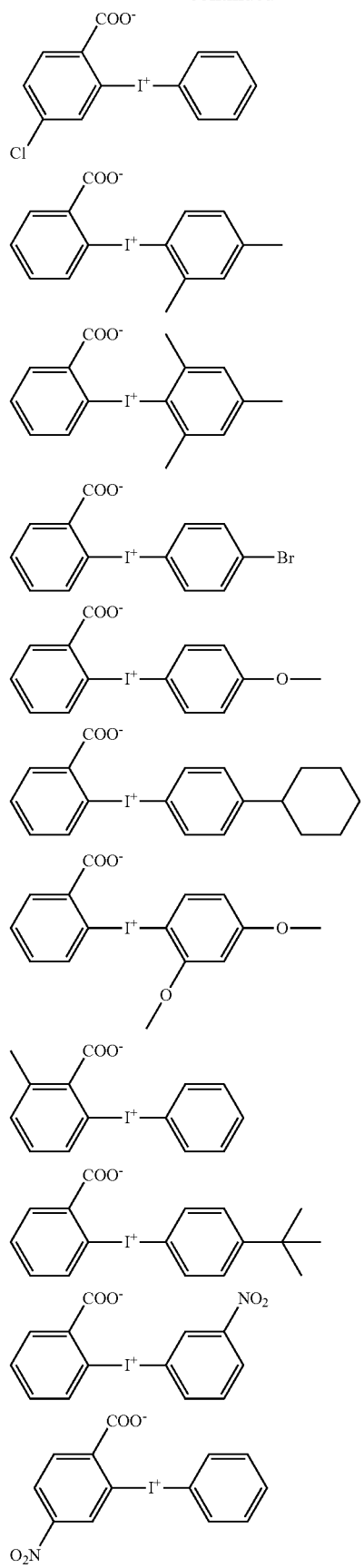

-continued

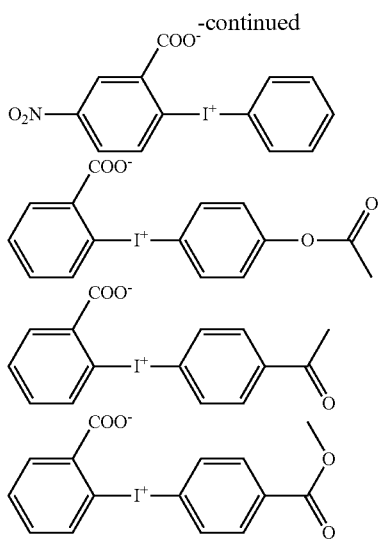

The compound represented by formula (D) can be produced with a method as mentioned in Tetrahedron Vol. 45, No. 19, p 6281-6296, which is available in the market.

The content of the compound represented by formula (D) is preferably 0.01 to 12 weight parts, more preferably 0.03 to 10 weight parts, and still more preferably 0.06 to 6 weight parts, based on sum of the resin.

The content of the compound is preferably 0.01 to 10% by weight, more preferably 0.03 to 8% by weight, and still more preferably 0.05 to 5% by weight, based on sum of solid component.

The photoresist compositions of the present invention can comprise, if necessary, a small amount of various additives such as a sensitizer, a dissolution inhibitor, other polymers, a surfactant, a stabilizer and a dye as long as the effect of the present invention is not prevented.

The photoresist compositions of the present invention can usually be prepared by mixing a solvent, an acid generator, and a resin of the present invention, and if necessary a quencher, and/or additives at a suitable ratio for the composition, optionally followed by filtrating the mixture with a filter having 0.003 μm to 0.2 μm of a pore size.

The order of mixing these components is not limited to any specific order. The temperature at mixing the components is usually 10 to 40° C., which can be selected in view of the resin or the like.

The mixing time is usually 0.5 to 24 hours, which can be selected in view of the temperature. The means for mixing the components is not limited to specific one. The components can be mixed by being stirred.

The photoresist compositions of the present invention are useful for a chemically amplified photoresist composition.

The method of the present invention comprises the following steps (1) to (5):

(1) a step of applying the photoresist composition of the present invention on a substrate, (2) a step of forming a composition film by conducting drying, (3) a step of exposing the composition film to radiation, (4) a step of baking the exposed composition film, and (5) a step of developing the baked composition film to form a photoresist pattern.

The applying of the photoresist composition on a substrate is usually conducted using a conventional apparatus such as spin coater.

Examples of the substrate include a silicon wafer or a quartz wafer on which a sensor, a circuit, a transistor or the like is formed. The substrate may be coated with a reflect-preventing layer such as one containing hexamethyldisilazane. For forming the reflect-preventing layer, such composition for organic reflect-preventing layer as available on the market can be used.

The composition film is usually formed by heating the coat layer with a heating apparatus such as hot plate or a decompressor, to thereby dry off the solvent. The heating temperature is preferably 50 to 200° C., and the operation pressure is preferably 1 to $1.0*10^5$ Pa. These conditions can be selected in view of the solvent.

The composition film is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 248 nm), an ArF excimer laser (wavelength: 193 nm) and a F2 laser (wavelength: 157 nm), and a light source radiating harmonic laser light in a far UV region or a vacuum UV region by wavelength conversion of laser light from a solid laser light source (such as YAG or semiconductor laser). The exposure source may be electric beam or extremely ultraviolet (EUV).

The step of baking of the exposed composition film is so called post-exposure bake, which is conducted with heating means such as hot plates. The temperature of baking of the exposed composition film is preferably 50 to 200° C., and more preferably 70 to 150° C.

The step of developing the baked composition film is usually carried out with a developer using a development apparatus. Developing can be conducted in the manner of dipping method, paddle method, spray method and dynamic dispensing method. Temperature for developing is generally 5 to 60° C. The time for developing is generally 5 to 300 seconds.

The photoresist pattern obtained from the photoresist composition may be a positive one or a negative one.

The development for obtaining a positive photoresist pattern is usually carried out with an alkaline developer using a development apparatus. The alkaline developer to be used may be any one of various alkaline aqueous solution used in the art. Generally, an aqueous solution of tetramethylammonium hydroxide or (2-hydroxyethyl)trimethylammonium hydroxide (commonly known as "choline") is often used.

After development, the photoresist pattern formed is preferably washed with ultrapure water, and the residual water remained on the photoresist film or on the substrate is preferably removed therefrom.

The development for obtaining a negative photoresist pattern is usually carried out with a developer containing an organic solvent. The organic solvent to be used may be any one of various organic solvents used in the art, examples of which include ketone solvents such as 2-hexanone, 2-heptanone; glycol ether ester solvents such as propylene glycol monomethyl ether acetate; ester solvents such as the butyl acetate; glycol ether solvents such as the propylene glycol monomethyl ether; amide solvents such as N,N-dimethylacetamide; aromatic hydrocarbon solvents such as anisole.

In the developer containing an organic solvent, the amount of organic solvents is preferably 90% by mass to 100% by mass of the developer, more preferably 95% by mass to 100% by mass of the developer. The developer still more preferably consists essentially of organic solvents.

The developer containing an organic solvent preferably comprises butyl acetate and/or 2-heptanone.

In the developer containing an organic solvent, the total amount of butyl acetate and 2-heptanone is preferably 50% by mass to 100% by mass of the developer, more preferably 90% by mass to 100% by mass of the developer. The developer still more preferably consists essentially of butyl acetate and/or 2-heptanone.

Developers containing an organic solvent may comprise a surfactant. Developer containing an organic solvent may comprise a little water.

The developing with a developer containing an organic solvent can be finished by replacing the developer by another solvent.

After development, the photoresist pattern formed is preferably washed with a rinse agent. Such rinse agent is not unlimited provided that it does not detract a photoresist pattern. Examples of the agent include solvents which contain organic solvents other than the above-mentioned developers, such as alcohol agents or ester agents.

After washing, the residual rinse agent remained on the substrate or photoresist film is preferably removed therefrom.

The photoresist composition of the present invention is suitable for KrF excimer laser lithography, ArF excimer laser lithography, EUV exposure lithography or EB (electron beam) lithography.

The photoresist composition is particularly preferred as photoresist composition for immersion exposure, which is useful for fine processing for semiconductor.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

Structures of compounds were determined by mass spectrometry (Liquid Chromatography: 1100 Type, manufactured by AGILENT TECHNOLOGIES LTD., Mass Spectrometry: LC/MSD Type, manufactured by AGILENT TECHNOLOGIES LTD.). Hereinafter, the value of the peak in the mass spectrometry is referred to as "MASS".

The weight-average molecular weight of any material used in the following examples is a value found by gel permeation chromatography under the following conditions.

Apparatus: HLC-8120GPC, manufactured by TOSOH CORPORATION

Column: Three of TSKgel Multipore HXL-M with guard column, manufactured by TOSOH CORPORATION Solvent: tetrahydrofuran Flow rate: 1.0 mL/min.

Detector: RI Detector, Column temperature: 40° C., Injection volume: 100 μL]

Standard reference material: standard polystyrene (TOSOH CORPORATION)

Example 1

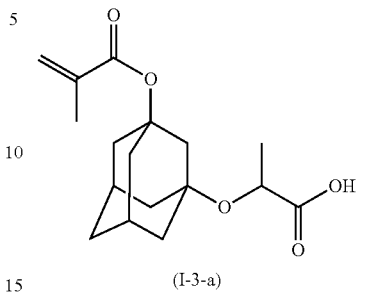

(I-3-a)

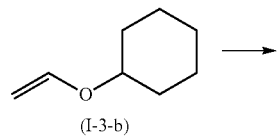

(I-3-b)

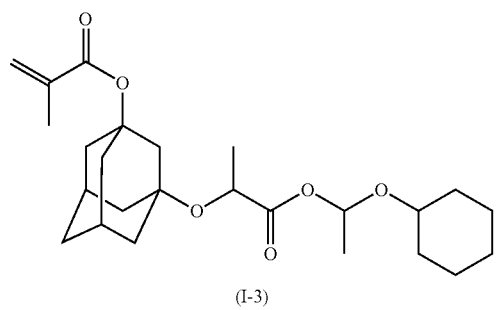

(I-3)

Feeding 19.80 parts of the compound represented by formula (I-3-a), 160 parts of chloroform and 20 parts of tert-butylmethylether into a reactor, they was stirred at 23° C. for 30 minutes, 2.13 parts of 0.2% camphorsulfonic acid solution of chloroform was added thereinto and then stirred at 23° C. for 30 minutes.

To the obtained mixture, 11.33 parts of the compound represented by formula (I-3-b) was dropped over 1 hour at 23° C., and then stirred at 23° C. for 24 hours. Then 0.014 parts of triethylamine was added thereto, 54 parts of 2% aqueous sodium hydrogencarbonate solution was added thereto, then stirred at 23° C. for 30 minutes, and made remain still, followed by being separated into an organic layer. To the separated organic layer, 70 parts of ion exchange water was added, then stirred at 23° C. for 30 minutes, and made remain still, followed by being separated for washing the organic layer. Such washing with water was conducted three times. The washed organic layer was concentrated to obtain 10.98 parts of the compound represented by formula (I-3).

MS(ESI(+) Spectrum): $M^+$ 434.3 [Molecular ion peak]

Example 2

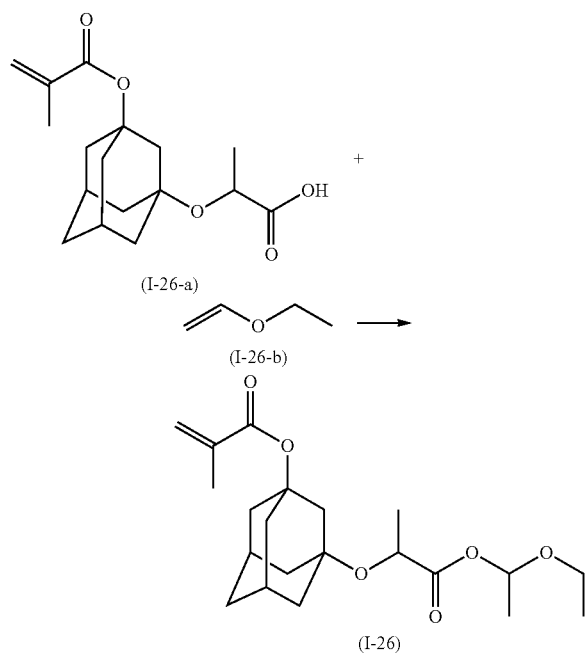

Feeding 19.80 parts of the compound represented by formula (I-26-a) and 140 parts of tert-butylmethylether into a reactor, they was stirred at 23° C. for 30 minutes, 2.13 parts of 0.2% camphorsulfonic acid solution of chloroform was added thereinto and then stirred at 23° C. for 30 minutes.

To the obtained mixture, 6.5 parts of the compound represented by formula (I-26-b) was dropped over 1 hour at 23° C., and then stirred at 23° C. for 24 hours. Then 0.014 parts of triethylamine was added thereto, 54 parts of 2% aqueous sodium hydrogencarbonate solution was added thereto, then stirred at 23° C. for 30 minutes, and made remain still, followed by being separated into an organic layer.

To the separated organic layer, 70 parts of ion exchange water was added, then stirred at 23° C. for 30 minutes, and made remain still, followed by being separated for washing the organic layer. Such washing with water was conducted three times. The washed organic layer was concentrated to obtain 23.74 parts of the compound represented by formula (I-26).

MS(ESI(+) Spectrum): M⁺ 380.2 [Molecular ion peak]

Example 3

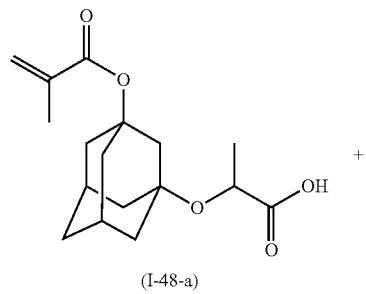

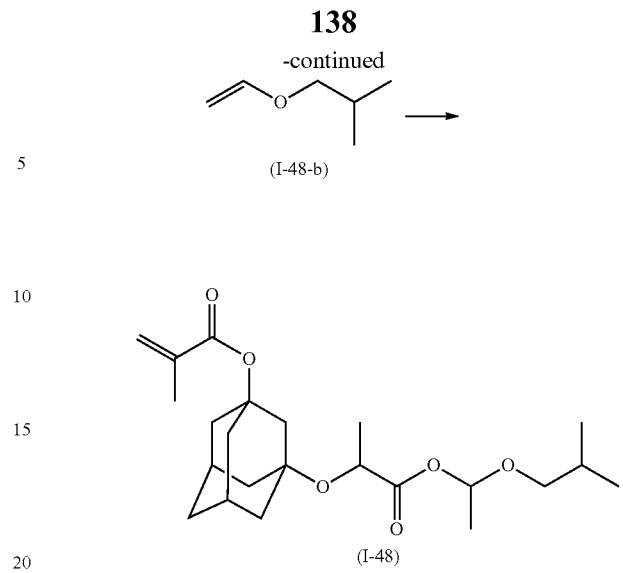

Feeding 2.60 parts of the compound represented by formula (I-48-a) and 26 parts of chloroform into a reactor, they was stirred at 23° C. for 30 minutes, 0.28 parts of 0.2% camphorsulfonic acid solution of chloroform was added thereinto and then stirred at 23° C. for 30 minutes.

To the obtained mixture, 1.20 parts of the compound represented by formula (I-48-b) was dropped over 30 minutes at 23° C., and then stirred at 23° C. for 4 hours. Then 0.01 parts of triethylamine was added thereto, 11.65 parts of 5% aqueous sodium hydrogencarbonate solution was added thereto, then stirred at 23° C. for 30 minutes, and made remain still, followed by being separated into an organic layer. To the separated organic layer, 13 parts of ion exchange water was added, then stirred at 23° C. for 30 minutes, and made remain still, followed by being separated for washing the organic layer. Such washing with water was conducted five times. The washed organic layer was concentrated to obtain 2.58 parts of the compound represented by formula (I-48).

MS(ESI(+) Spectrum): M⁺ 408.3 [Molecular ion peak]

Example 4

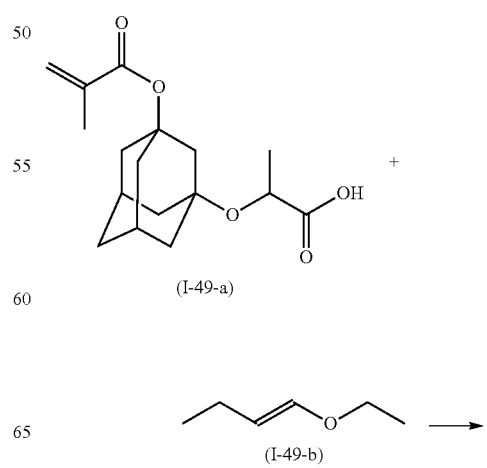

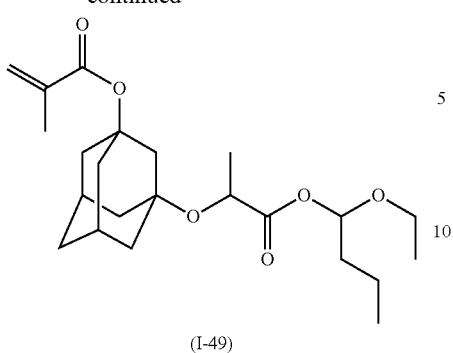

(I-49)

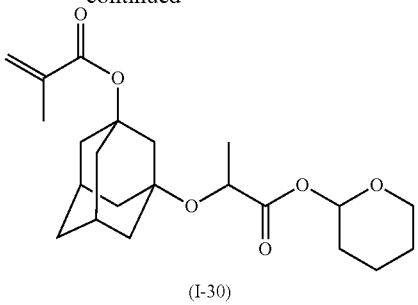

(I-30)

Feeding 2.5 parts of the compound represented by formula (I-49-a) and 25 parts of chloroform into a reactor, they was stirred at 23° C. for 30 minutes, 0.27 parts of 0.2% camphorsulfonic acid solution of chloroform was added thereinto and then stirred at 23° C. for 30 minutes.

To the obtained mixture, 1.27 parts of the compound represented by formula (I-49-b) was dropped over 15 minutes at 23° C., and then stirred at 23° C. for 32 hours. Then 0.01 parts of triethylamine was added thereto, 11.5 parts of 5% aqueous sodium hydrogencarbonate solution was added thereto, then stirred at 23° C. for 30 minutes, and made remain still, followed by being separated into an organic layer. To the separated organic layer, 12 parts of ion exchange water was added, then stirred at 23° C. for 30 minutes, and made remain still, followed by being separated for washing the organic layer. Such washing with water was conducted five times. The washed organic layer was concentrated to obtain 2.32 parts of the compound represented by formula (I-49).

MS(ESI(+) Spectrum): M+ 408.3 [Molecular ion peak]

Feeding 2.6 parts of the compound represented by formula (I-30-a) and 26 parts of chloroform into a reactor, they was stirred at 23° C. for 30 minutes, 0.28 parts of 0.2% camphorsulfonic acid solution of chloroform was added thereinto and then stirred at 23° C. for 30 minutes.

To the obtained mixture, 1.01 parts of the compound represented by formula (I-30-b) was dropped over 15 minutes at 23° C., and then stirred at 23° C. for 32 hours. Then 0.01 parts of triethylamine was added thereto, 11.65 parts of 5% aqueous sodium hydrogencarbonate solution was added thereto, then stirred at 23° C. for 30 minutes, and made remain still, followed by being separated into an organic layer. To the separated organic layer, 13 parts of ion exchange water was added, then stirred at 23° C. for 30 minutes, and made remain still, followed by being separated for washing the organic layer. Such washing with water was conducted five times. The washed organic layer was concentrated to obtain 2.44 parts of the compound represented by formula (I-30).

MS(ESI(+) Spectrum): M+ 392.2 [Molecular ion peak]

Synthesis of Resin

The compounds, i.e. monomer, used for synthesis of the resin are shown bellow.

Example 5

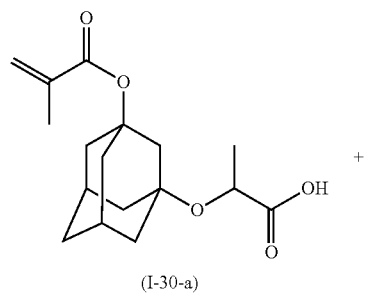

(I-30-a)

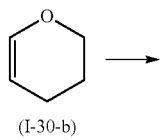

(I-30-b)

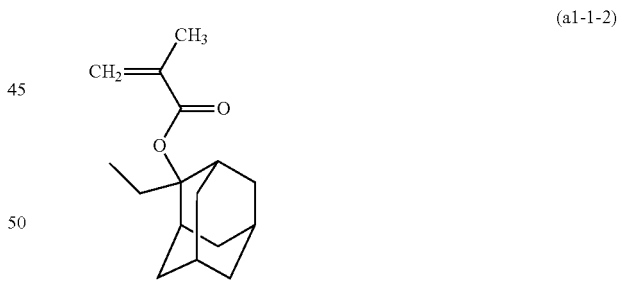

(a1-1-2)

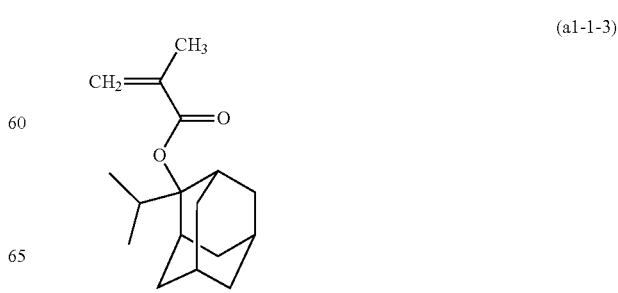

(a1-1-3)

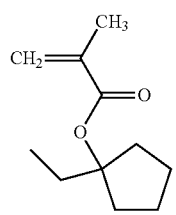 (a1-2-9)
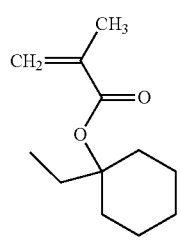 (a1-2-3)
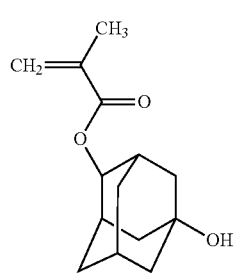 (a2-1-1)
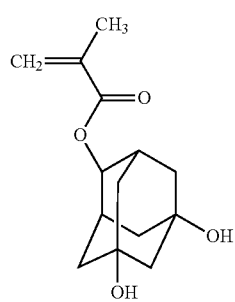 (a2-1-3)
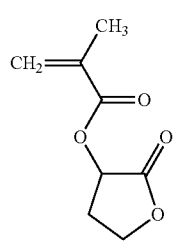 (a3-1-1)
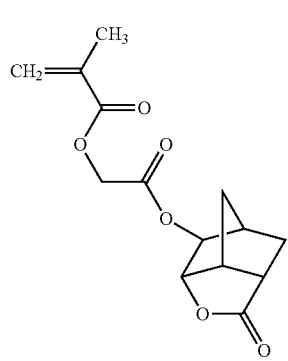 (a3-2-3)
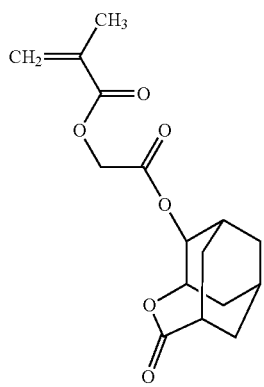 (a3-4-2)
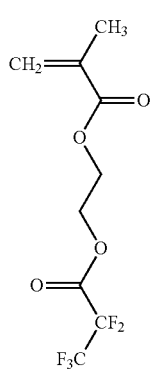 (a4-1-7)
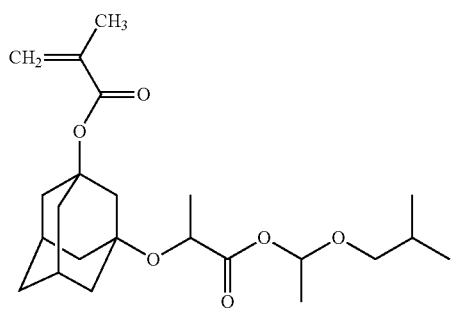 (I-3)
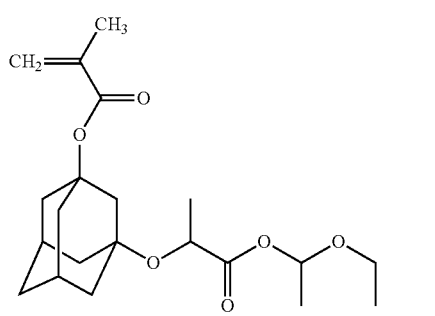 (I-26)

(I-30)
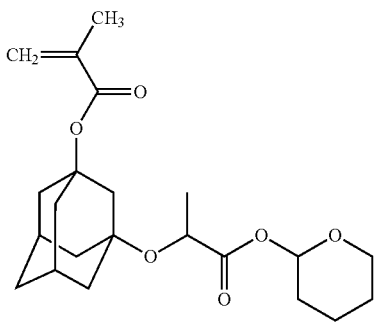

(I-48)
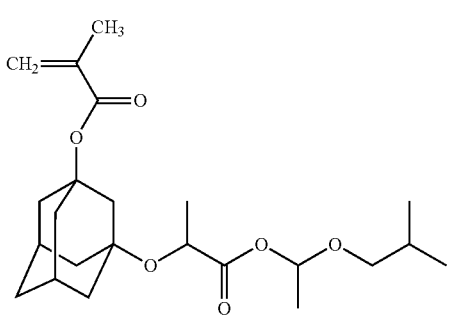

(I-49)
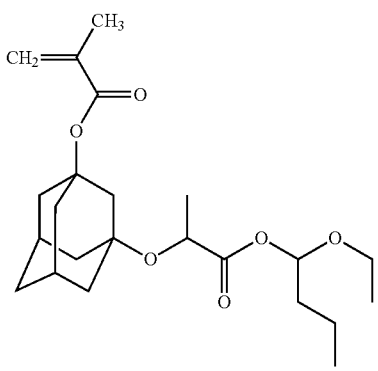

(IX-1)
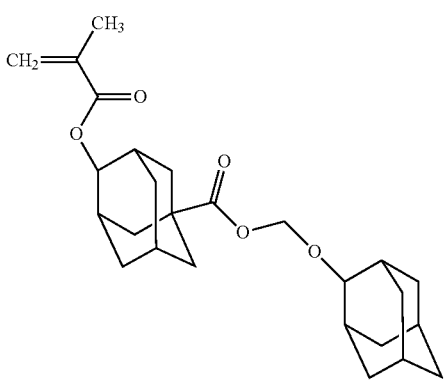

(IX-2)
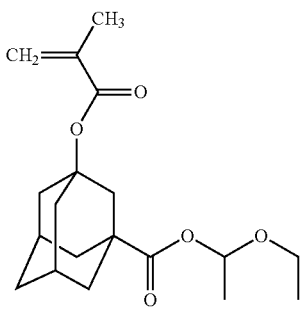

(IX-3)
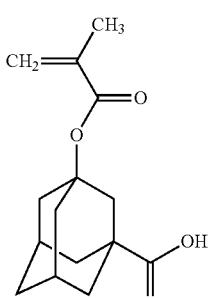

Hereinafter, the monomer of formula (x) where "(x)" represents the symbol for each formula is referred to as Monomer (x).

Example 6

The monomer (I-3), the monomer (a1-2-9), the monomer (a2-1-3), and the monomer (a3-4-2) were mixed in their molar ratio of [monomer (I-3)]/[monomer (a1-2-9)]/[monomer (a2-1-3)]/[monomer (a3-4-2)]=45/14/2.5/38.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about $8.2 \times 10^3$ was obtained at yield 82%. This resin is called as resin A1.

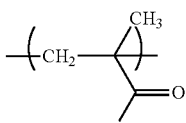
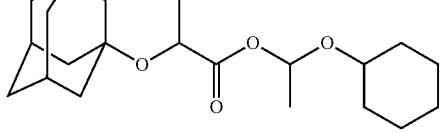

-continued

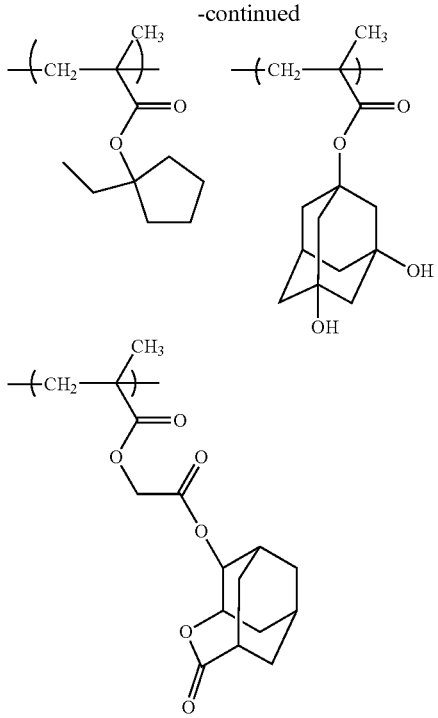

Example 7

The monomer (I-3), the monomer (a1-2-9), the monomer (a2-1-3), the monomer (a3-2-3) and the monomer (a3-4-2) were mixed in their molar ratio of [monomer (I-3)]/[monomer (a1-2-9)]/[monomer (a2-1-3)]/[monomer (a3-2-3)]/[monomer (a3-4-2)]=45/14/2.5/22/16.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about 7.9× 10³ was obtained at yield 79%. This resin is called as resin A2.

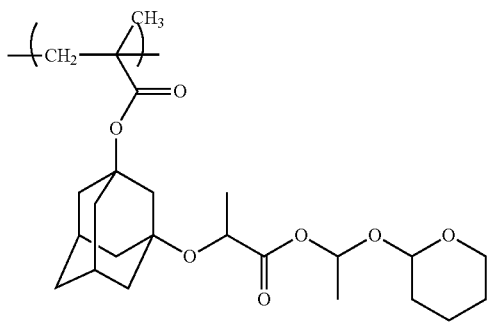

-continued

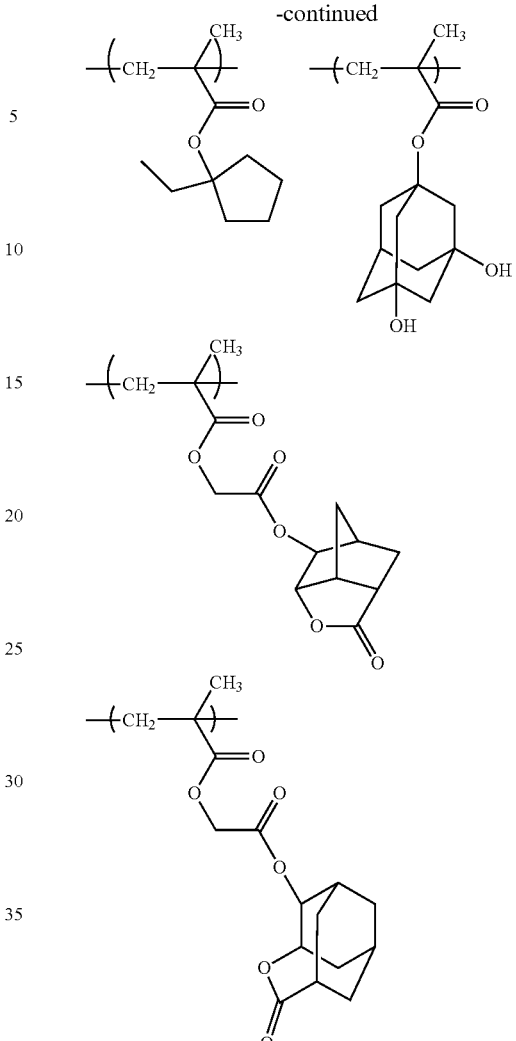

Example 8

The monomer (a1-1-3), the monomer (I-3), the monomer (a2-1-3), the monomer (a3-2-3) and the monomer (a3-4-2) were mixed in their molar ratio of [monomer (a1-1-3)]/[monomer (I-3)]/[monomer (a2-1-3)]/[monomer (a3-2-3)]/[monomer (a3-4-2)]=45/14/2.5/22.5/16, and further added thereto was dioxane in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 73° C. for about 5 hours.

Into the resulting reaction mixture, a large amount of mixture of water and methanol was poured to cause precipitation, followed by filtrating the resulting mixture.

Then the following steps were conducted twice: The filtrate was dissolved in dioxane, which is poured into mixture of water and methanol to cause precipitation, followed by filtrating the resulting mixture.

As a result, a polymer having the following structural units and a weight-average molecular weight of about 8.1× 10³ was obtained at yield 58%. This resin is called as resin A3.

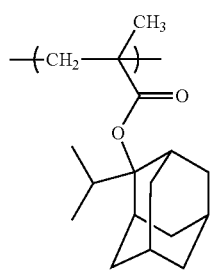
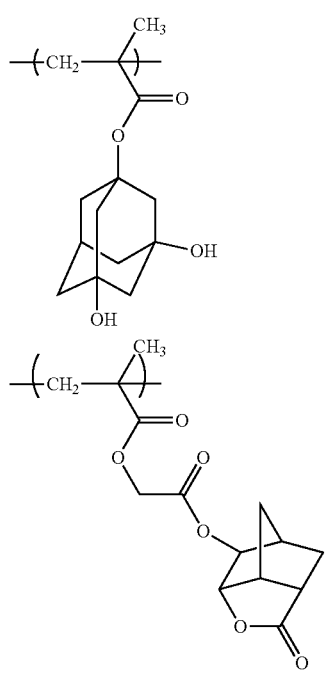
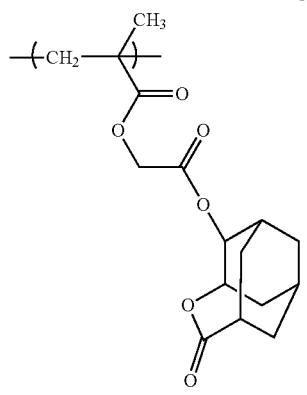

Example 9

The monomer (a1-1-2), the monomer (a1-2-3), the monomer (a2-1-1), the monomer (a3-2-3), the monomer (a3-1-1) and the monomer (I-3) were mixed in their molar ratio of [monomer (a1-1-2)]/[monomer (a1-2-3)]/[monomer (a2-1-1)]/[monomer (a3-2-3)]/[monomer (a3-1-1)]/[monomer (I-3)]=30/6/8/20/30/6, and further added thereto was dioxane in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture.

Then the following steps were conducted twice: The filtrate was dissolved in dioxane, which was poured into mixture of water and methanol to cause precipitation, followed by filtrating the resulting mixture.

As a result, a polymer having the following structural units and a weight-average molecular weight of about $7.8 \times 10^3$ was obtained at yield 78%. This resin is called as resin A4.

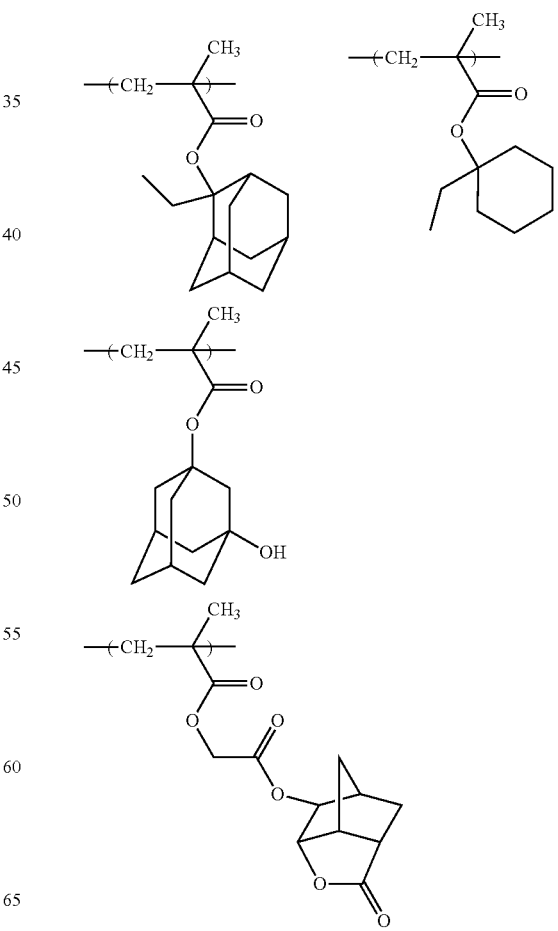

-continued

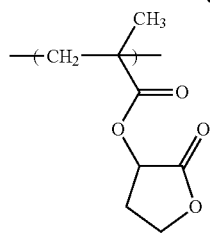

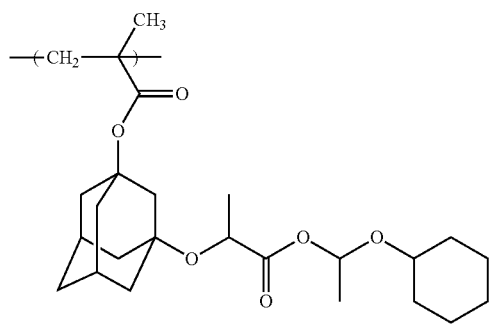

Example 10

The monomer (I-26), the monomer (a1-2-9), the monomer (a2-1-3) and the monomer (a3-4-2) were mixed in their molar ratio of [monomer (I-26)]/[monomer (a1-2-9)]/[monomer (a2-1-3)]/[monomer (a3-4-2)]=45/14/2.5/38.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about $8.4 \times 10^3$ was obtained at yield 88%. This resin is called as resin A5.

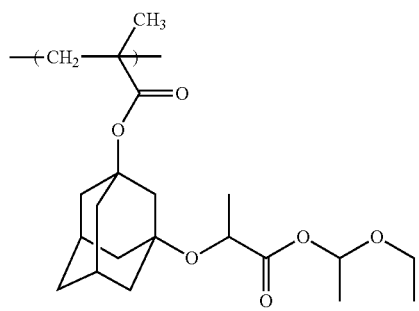

-continued

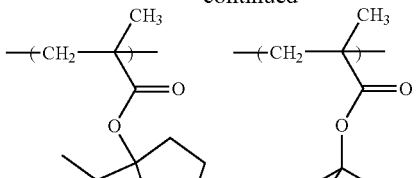

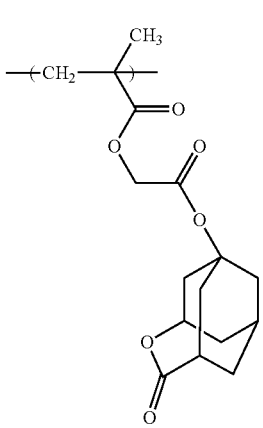

Example 11

The monomer (I-26), the monomer (a1-2-9), the monomer (a2-1-3), the monomer (a3-2-3) and the monomer (a3-4-2) were mixed in their molar ratio of [monomer (I-26)]/[monomer (a1-2-9)]/[monomer (a2-1-3)]/[monomer (a3-2-3)]/[monomer (a3-4-2)]=45/14/2.5/22/16.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was dissolved in methanol, followed by filtrating the resulting mixture.

As a result, a polymer having the following structural units and a weight-average molecular weight of about $8.1 \times 10^3$ was obtained at yield 83%. This resin is called as resin A6.

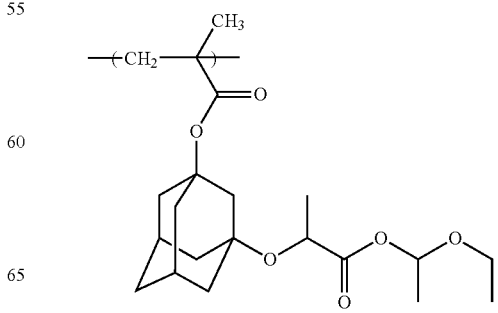

-continued

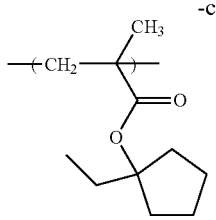

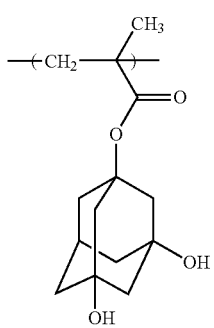

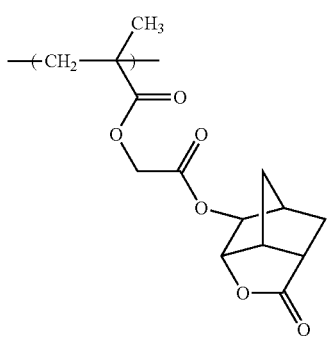

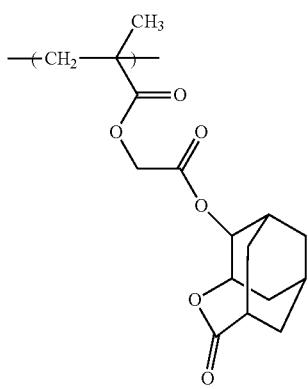

Example 12

The monomer (a1-1-3), the monomer (I-26), the monomer (a2-1-3), the monomer (a3-2-3) and the monomer (a3-4-2) were mixed in their molar ratio of [monomer (a1-1-3)]/[monomer (I-26)]/[monomer (a2-1-3)]/[monomer (a3-2-3)]/[monomer (a3-4-2)]=45/14/2.5/22.5/16, and further added thereto was dioxane in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 73° C. for about 5 hours.

Into the resulting reaction mixture, a large amount of mixture of water and methanol was poured to cause precipitation, followed by filtrating the resulting mixture. Then the following procedure was conducted twice: The filtrate was dissolved in dioxane, and the resulting solution was poured into a mixture of water and methanol to cause precipitation, followed by filtrating the resulting mixture. As a result, a polymer having the following structural units and a weight-average molecular weight of about $8.5 \times 10^3$ was obtained at yield 60%. This resin is called as resin A7.

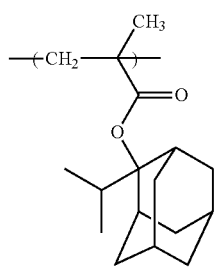

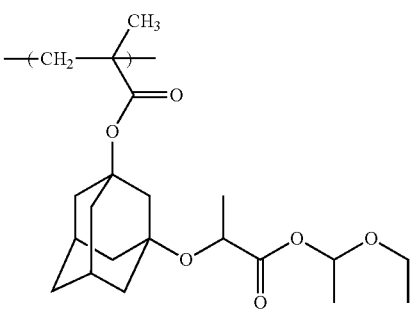

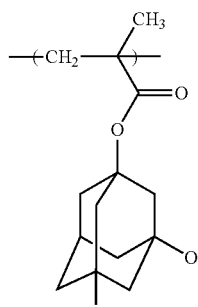

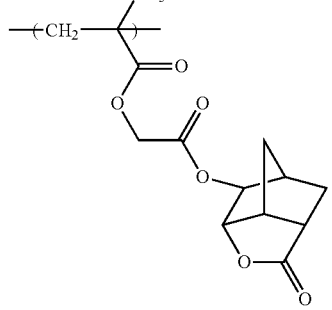

-continued

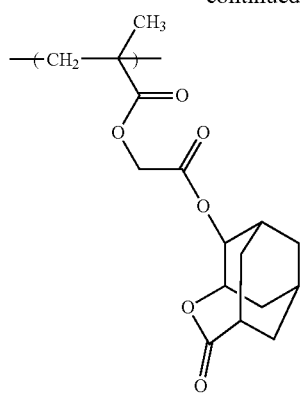

Example 13

The monomer (I-30), the monomer (a2-1-9), the monomer (a2-1-3) and the monomer (a3-4-2) were mixed in their molar ratio of [monomer (I-30)]/[monomer (a2-1-9)]/[monomer (a2-1-3)]/[monomer (a3-4-2)]=45/14/2.5/38.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was poured into methanol, followed by filtrating the resulting mixture.

As a result, a polymer having the following structural units and a weight-average molecular weight of about $7.9 \times 10^3$ was obtained at yield 85%. This resin is called as resin A8.

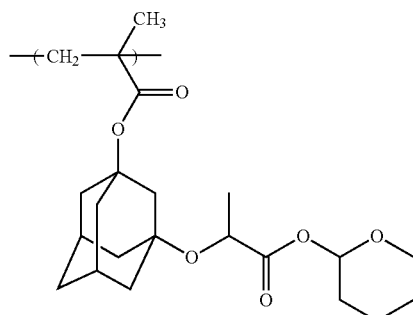

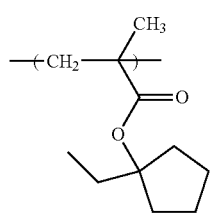

-continued

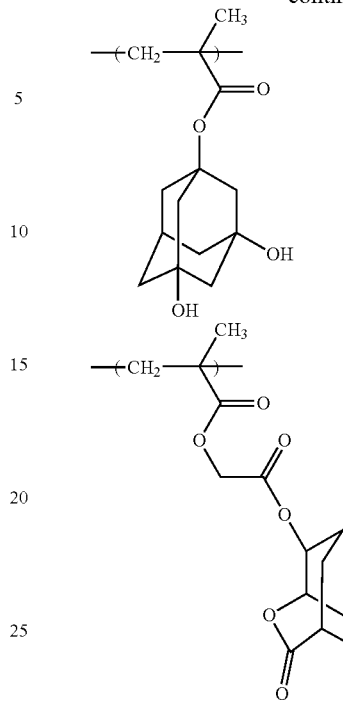

Example 14

The monomer (I-48), the monomer (a2-1-9), the monomer (a2-1-3) and the monomer (a3-4-2) were mixed in their molar ratio of [monomer (I-48)]/[monomer (a2-1-9)]/[monomer (a2-1-3)]/[monomer (a3-4-2)]=45/14/2.5/38.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo (2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was poured into methanol, followed by filtrating the resulting mixture.

As a result, a polymer having the following structural units and a weight-average molecular weight of about $8.0 \times 10^3$ was obtained at yield 87%. This resin is called as resin A9.

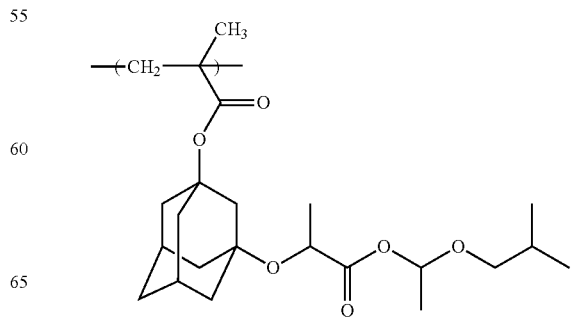

-continued

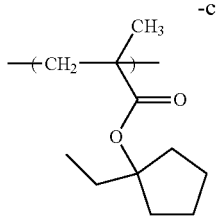

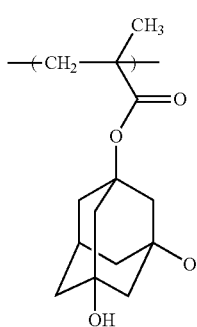

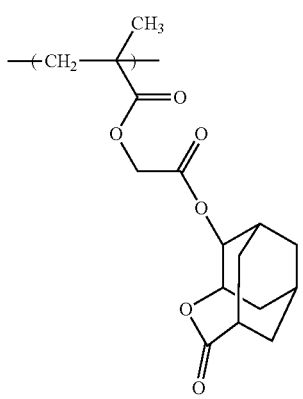

Example 15

The monomer (I-49), the monomer (a2-1-9), the monomer (a2-1-3) and the monomer (a3-4-2) were mixed in their molar ratio of [monomer (I-49)]/[monomer (a2-1-9)]/[monomer (a2-1-3)]/[monomer (a3-4-2)]=45/14/2.5/38.5, and further added thereto was propylene glycol monomethyl ether acetate in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. The filtrate was poured into methanol, followed by filtrating the resulting mixture.

As a result, a polymer having the following structural units and a weight-average molecular weight of about $8.0 \times 10^3$ was obtained at yield 87%. This resin is called as resin A10.

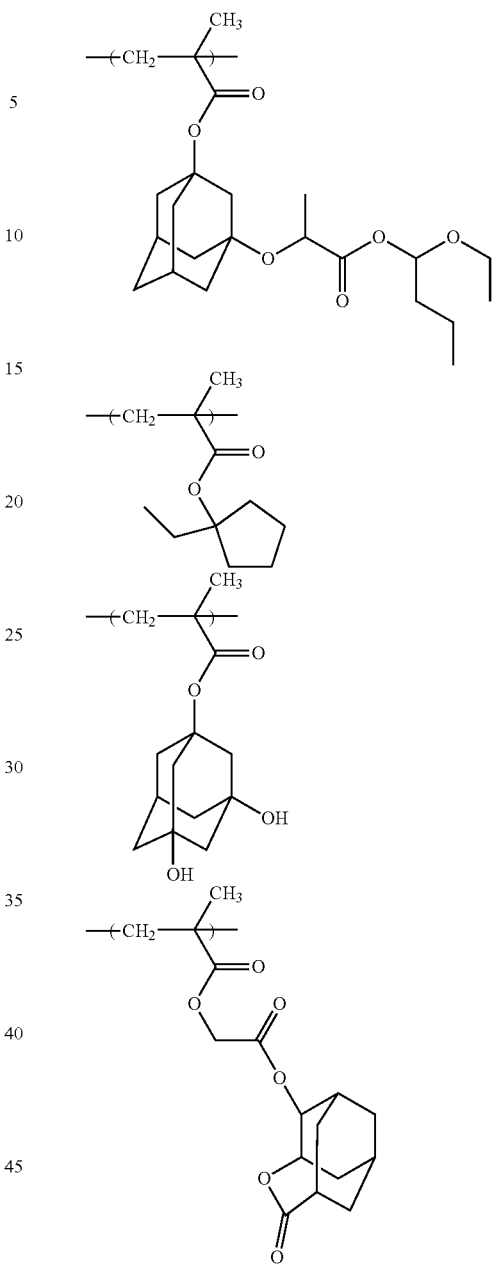

Synthesis Example 1

The monomer (a1-1-2), the monomer (a1-2-3), the monomer (a2-1-1), the monomer (a3-2-3), the monomer (a3-1-1), and the monomer (IX-1) were mixed in their molar ratio of [monomer (a1-1-2)]/[monomer (a1-2-3)]/[monomer (a2-1-1)]/[monomer (a3-2-3)]/[monomer (a3-1-1)]/[monomer (IX-1)]=30/6/8/20/30/6, and further added thereto was dioxane in an amount of 1.5 weight parts relative to the total weight of the monomers.

To the resulting solution, 1 part by mole of azobisisobutyronitrile and 3 parts by mole of azo(2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. Then the following procedure was conducted twice: The filtrate was dissolved in dioxane, and the resulting solution was poured into a mixture of water and methanol to cause precipitation, followed by filtrating the resulting mixture. As a result, a polymer having the following structural units and a weight-average molecular weight of about 8.2×10³ was obtained at yield 85%. This resin is called as resin H1.

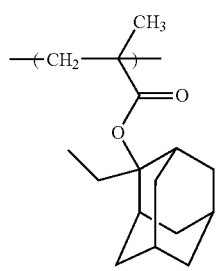

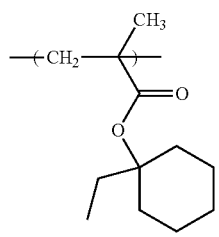

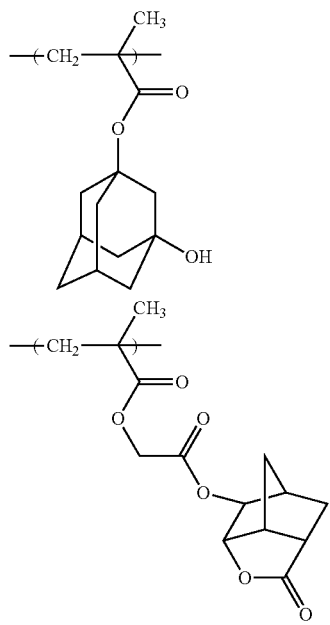

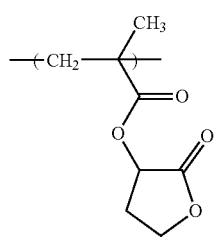

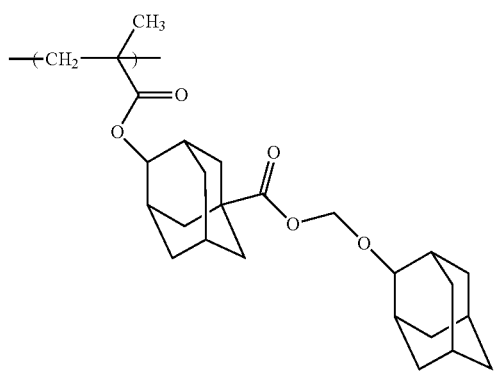

Synthesis Example 2

To the monomer (a4-1-7), dioxane was added in an amount of 1.5 weight parts relative to the total weight of the monomer.

To the resulting solution, 0.7 part by mole of azobisisobutyronitrile and 2.1 parts by mole of azo (2,4-dimethylvaleronitrile) were added, as initiators, per 100 parts by mole of the total monomer amount, and heated at 75° C. for about 5 hours.

Into the resulting reaction mixture, a large amount of mixture of water and methanol was poured to cause precipitation, followed by filtrating the resulting mixture. Then the following procedure was conducted twice: The filtrate was dissolved in dioxane, and the resulting solution was poured into a mixture of water and methanol to cause precipitation, followed by filtrating the resulting mixture. As a result, a polymer having the following structural unit and a weight-average molecular weight of about 1.8×10⁴ was obtained at yield 77%. This resin is called as resin X1.

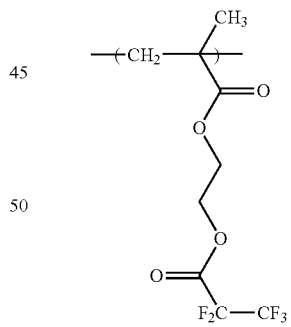

Synthesis Example 3

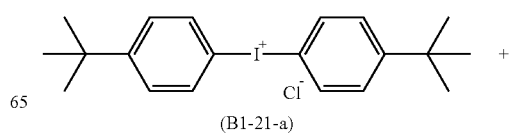

(B1-21-a)

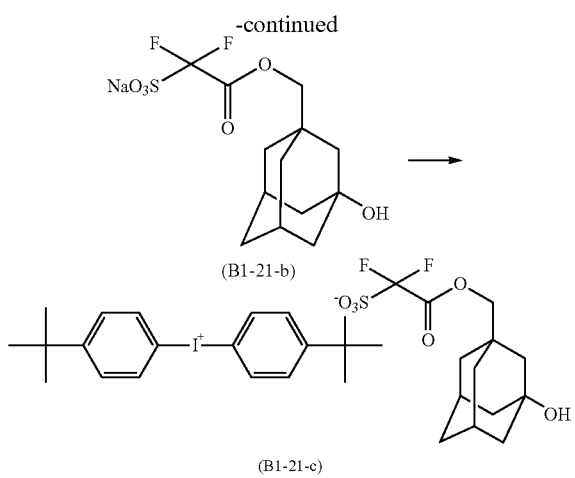

(B1-21-b)

(B1-21-c)

The compound represented by formula (B1-21-b) was produced according to a method recited in JP2008-209917A1.

Thirty [30.00] parts of compound represented by formula (B1-21-b) and 35.50 parts of salt represented by formula (B1-21-a), 100 parts of chloroform and 50 parts of ion exchanged water were fed and stirred at 23° C. for about 15 hours.

The obtained reaction mixture, which had two layers, was separated into a chloroform layer and the other layer. To the chloroform layer, 30 parts of ion exchanged water was added and washed with it: These steps were conducted five times.

Then the washed layer was concentrated, and then to the obtained residues, 100 parts of tert-butylmethylether was added and then stirred at 23° C. for about 30 minutes. The resulting mixture was filtrated to obtain 48.57 parts of salt represented by formula (B1-21-c).

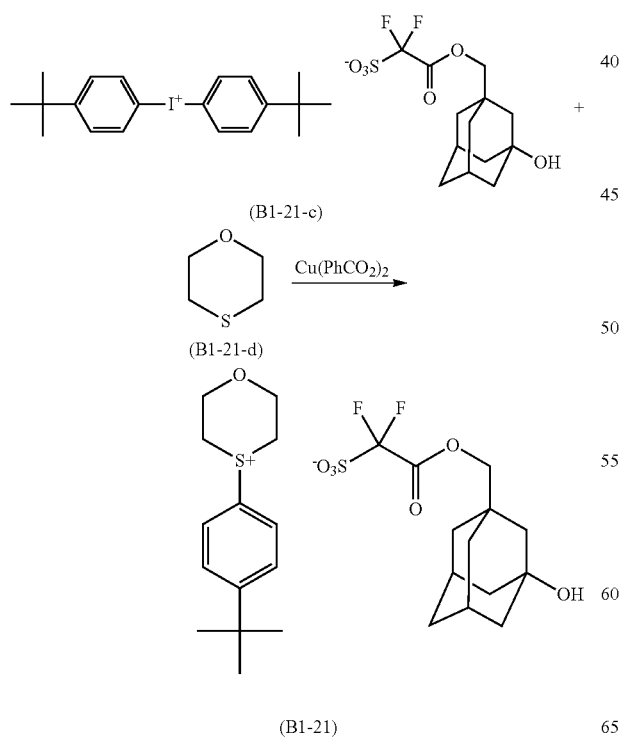

(B1-21-c)

(B1-21-d)

(B1-21)

Stirred were 20.00 parts of salt represented by formula (B1-21-c), 2.84 parts of compound represented by formula (B1-21-d) and 250 parts of monochlorobenzene at 23° C. for 30 minutes. To the resulting mixture, 0.21 parts of dibenzoic acid copper (II) was added and stirred at 100° C. for 1 hour. The reaction mixture was concentrated, and then, to the obtained residues, 200 parts of chloroform and 50 parts of ion exchanged water were added and stirred at 23° C. for 30 minutes, followed by being separated into an organic layer.

The following washing steps were conducted five times: 50 parts of ion exchanged water was added to the obtained organic layer and then stirred at 23° C. for 30 minutes, followed by being separated into an organic layer.

The reaction mixture was concentrated, and then the obtained residues were dissolved in 53.51 parts of acetonitrile. Then the mixture was concentrated, and then 113.05 parts of tert-butylmethylether was added thereto and stirred, followed by filtrating it to obtain 10.47 parts of salt represented by formula (B1-21).

MASS(ESI(+)Spectrum):$M^+$ 237.1

MASS(ESI(−)Spectrum):$M^−$ 339.1

Synthesis Example 4

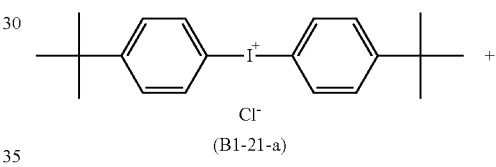

(B1-21-a)

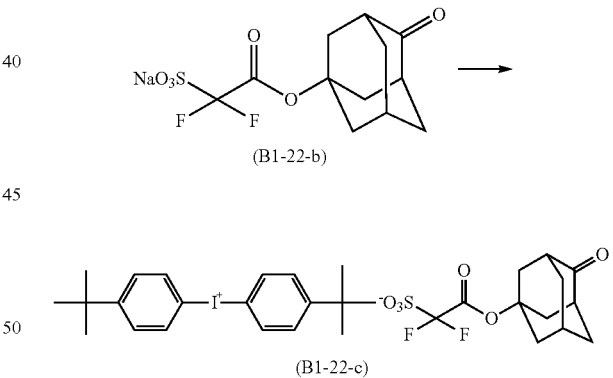

(B1-22-b)

(B1-22-c)

Ten [10.00] parts of compound represented by formula (B1-22-b), 11.26 parts of salt represented by formula (B1-21-a), 50 parts of chloroform and 25 parts of ion exchanged water were fed and stirred at 23° C. for about 15 hours. The obtained reaction mixture, which had two layers, was separated into a chloroform layer and the other layer. To the chloroform layer, 15 parts of ion exchanged water was added and washed with it: These steps were conducted five times. Then the washed layer was concentrated, and then to the obtained residues, 50 parts of tert-butylmethylether was added and then stirred at 23° C. for about 30 minutes. The resulting mixture was filtrated to obtain 48.57 parts of salt represented by formula (B1-22-c).

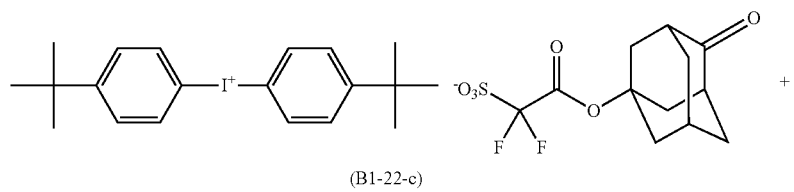

(B1-22-c)

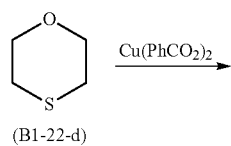

(B1-22-d)

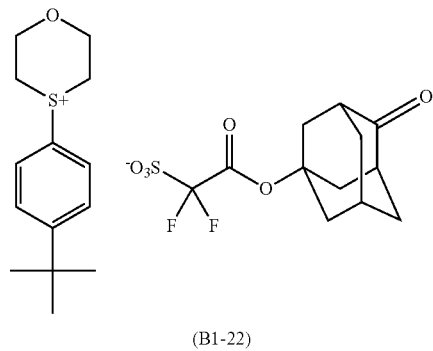

(B1-22)

Stirred were 11.71 parts of salt represented by formula (B1-22-c), 1.7 parts of compound represented by formula (B1-22-d) and 46.84 parts of monochlorobenzene at 23° C. for 30 minutes. To the resulting mixture, 0.12 parts of dibenzoic acid copper (II) was added and stirred at 100° C. for 30 minutes. The reaction mixture was concentrated, and then, to the obtained residues, 50 parts of chloroform and 12.5 parts of ion exchanged water were added and stirred at 23° C. for 30 minutes, followed by being separated into an organic layer. The following washing steps were conducted eight times: 12.5 parts of ion exchanged water was added to the obtained organic layer and then stirred at 23° C. for 30 minutes, followed by being separated into an organic layer.

Then the mixture was concentrated, and then 50 parts of tert-butylmethylether was added thereto and stirred, followed by filtrating it to obtain 6.84 parts of salt represented by formula (B1-22).

MASS(ESI(+)Spectrum):M⁺ 237.1
MASS(ESI(−)Spectrum):M⁻ 323.0

Synthesis Example 5

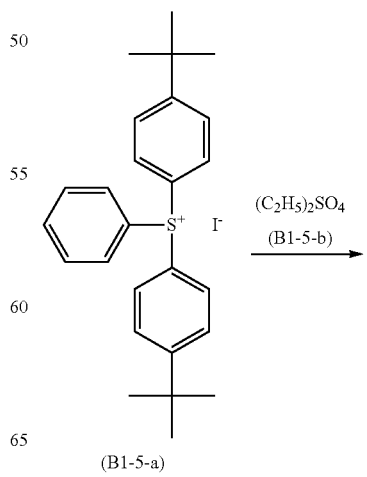

(B1-5-a)

-continued

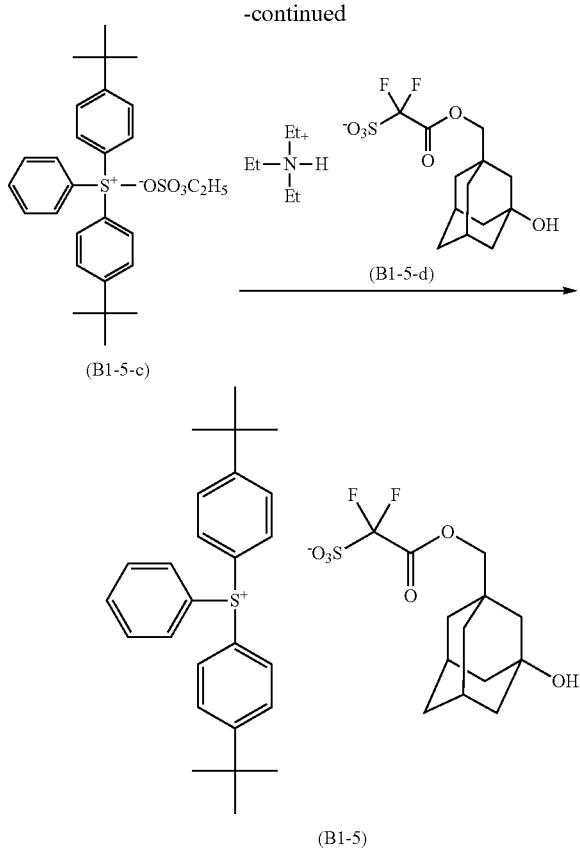

In to a reactor, 50.49 parts of salt represented by formula (B1-5-a) and 252.44 parts of chloroform were fed and stirred at 23° C. for about 30 minutes. Then 16.27 parts of salt represented by formula (B1-5-b) was dropped thereinto and stirred at 23° C. for 1 hour to obtain a solution which contained a salt represented by formula (B1-5-c). To the obtained solution, 48.80 parts of salt represented by formula (B1-5-d) and 84.15 parts of ion exchanged water were added and then stirred at 23° C. for 12 hours.

The obtained reaction mixture, which had two layers, was separated into a chloroform layer and the other layer. To the chloroform layer, 84.15 parts of ion exchanged water was added and washed with it: These steps were conducted five times.

To the obtained mixture, 3.88 parts of active carbon was added and stirred, followed by being filtrated. Then 125.87 parts of acetonitrile was added thereto and stirred, followed by being concentrated. After concentration, 20.62 parts of acetonitrile and 309.30 parts of tert-butylmethylether were added to the obtained residues, followed by being stirred at 23° C. for about 30 minutes. Then the supernatant was removed therefrom, and the residues were concentrated. To the concentrated residues, 200 parts of n-heptane was added and then stirred at 23° C. for about 30 minutes, followed by being filtrated to obtain 61.54 parts of salt represented by formula (B1-5).

MASS(ESI(+)Spectrum):$M^+$ 375.2
MASS(ESI(-)Spectrum):$M^-$ 339.1

Examples 16 to 27 and Comparative Examples 1 to 3

Preparation of Photoresist Composition

The resin, the acid generator and Compound (D) were dissolved in the solvent as shown in Table 1, and the resulting mixture was further filtrated through a fluorine resin filter having pore diameter of 0.2 μm, to prepare photoresist compositions shown in Table 1.

TABLE 1

| Composition | Resin (Amount) | Acid generator (Amount) | Compound (D) (Amount) | PB/PEB |
|---|---|---|---|---|
| Comp. 1 | X1 [0.7 parts] A1 [10 parts] | B1-21 [0.95 parts] B1-22 [0.40 parts] | D1 [0.28 parts] | 90° C./85° C. |
| Comp. 2 | X1 [0.7 parts] A2 [10 parts] | B1-21 [0.95 parts] B1-22 [0.40 parts] | D1 [0.28 parts] | 90° C./85° C. |
| Comp. 3 | X1 [0.7 parts] A3 [10 parts] | B1-21 [0.95 parts] B1-22 [0.40 parts] | D1 [0.28 parts] | 90° C./85° C. |
| Comp. 4 | X1 [0.7 parts] A4 [10 parts] | B1-21 [0.95 parts] B1-22 [0.40 parts] | D1 [0.28 parts] | 90° C./85° C. |
| Comp. 5 | X1 [0.7 parts] A4 [10 parts] | B1-3 [0.60 parts] | D1 [0.28 parts] | 90° C./85° C. |
| Comp. 6 | X1 [0.7 parts] A5 [10 parts] | B1-21 [0.95 parts] B1-22 [0.40 parts] | D1 [0.28 parts] | 90° C./85° C. |
| Comp. 7 | X1 [0.7 parts] A6 [10 parts] | B1-21 [0.95 parts] B1-22 [0.40 parts] | D1 [0.28 parts] | 90° C./85° C. |
| Comp. 8 | X1 [0.7 parts] A7 [10 parts] | B1-21 [0.95 parts] B1-22 [0.40 parts] | D1 [0.28 parts] | 90° C./85° C. |
| Comp. 9 | X1 [0.7 parts] A7 [10 parts] | B1-5 [0.60 parts] | D1 [0.28 parts] | 90° C./85° C. |
| Comp. 10 | X1 [0.7 parts] A8 [10 parts] | B1-21 [0.95 parts] B1-22 [0.40 parts] | D1 [0.28 parts] | 90° C./85° C. |
| Comp. 11 | X1 [0.7 parts] A9 [10 parts] | B1-21 [0.95 parts] B1-22 [0.40 parts] | D1 [0.28 parts] | 90° C./85° C. |
| Comp. 12 | X1 [0.7 parts] A10 [10 parts] | B1-21 [0.95 parts] B1-22 [0.40 parts] | D1 [0.28 parts] | 90° C./85° C. |
| Comparative Comp. 1 | X1 [0.7 parts] H7 [10 parts] | B1-3 [0.60 parts] | D1 [0.28 parts] | 90° C./85° C. |

In Table 1, the symbols respectively represent the components as follow.

<Resin>

A1=Resin A1, A2=Resin A2, A3=Resin A3, A4=Resin A4, A5=Resin A5, A6=Resin A6, A7=Resin A7, A8=Resin A8, A9=Resin A9, A10=Resin A10, X1=Resin X1, H1=Resin H1

<Acid Generator>

B1-3: The salt represented by the following formula, which was produced according to JP2010-152341A1.

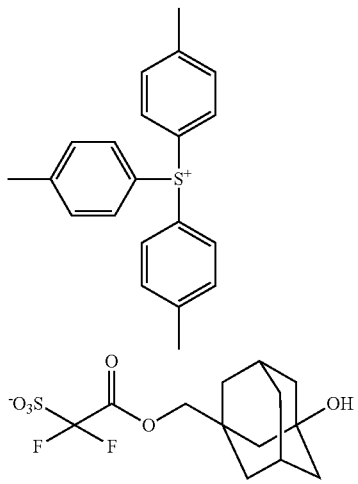

B1-21: The salt represented by formula (B1-21)
B1-22: The salt represented by formula (B1-22)
B1-5: The salt represented by formula (B1-5)

<Compound (D)>

D1: The compound represented by the following formula, produced by Tokyo chemical industry, Co. Ltd.

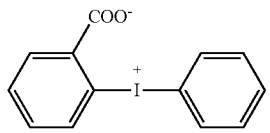

<Solvent>

| propylene glycol monomethyl ether acetate | 265 parts |
| propylene glycol monomethyl ether | 20 parts |
| 2-heptanone | 20 parts |
| γ-butyrolactone | 3.5 parts |

(Producing Negative Photoresist Patterns)

Silicon wafers (12 inches) were each coated with "ARC-29", which is an organic anti-reflective coating composition available from Nissan Chemical Industries, Ltd., and then baked at 205° C. for 60 seconds, to form a 78 nm-thick organic anti-reflective coating.

Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in the column "PB" in Table 1 for 60 seconds. Using an ArF excimer stepper for immersion exposure ("XT: 1900Gi" manufactured by ASML, NA=1.35, Dipole 0.900/0.700, Y-pol., illumination) and a mask for forming trench pattern [pitch: 120 nm, trench width: 40 nm], each wafer thus formed with the respective resist film was subjected to with the exposure quantity being varied stepwise. Ultrapure water was used as an immersion medium.

After the exposure, each wafer was subjected to post-exposure baking on a hotplate at a temperature shown in the column "PEB" in Table 1 for 60 seconds. Then the baked film was subjected to development using butyl acetate [Tokyo Chemical Industry, Co. Ltd.] as a developer at 23° C. for 20 seconds in the manner of dynamic dispensing method to obtain negative photoresist patterns.

Effective Sensitivity (ES): It was expressed as the exposure quantity such that the trench width in the obtained pattern was 40 nm.

Focus margin (DOF): The photoresist patterns were obtained at the exposure quantity of ES, with the focal point distance being varied stepwise. Each of patterns developed on the organic anti-reflective coating substrate after the development were observed and the focal point distances when the patterns of which trench width were within 40 nm±5% (between 38 nm and 42 nm) were measured and the difference between the max value of the focal point distance and the minimum value of the focal point distance was calculated, and such difference is also shown in parentheses in a column of "DOF". The difference is larger, the better focus margin the photoresist composition has.

The results are shown in Table 2.

TABLE 2

| Ex. No. | Composition | DOF |
|---|---|---|
| Ex. 16 | Comp. 1 | 135 |
| Ex. 17 | Comp. 2 | 120 |
| Ex. 18 | Comp. 3 | 105 |
| Ex. 19 | Comp. 4 | 75 |
| Ex. 20 | Comp. 5 | 60 |
| Ex. 21 | Comp. 6 | 135 |
| Ex. 22 | Comp. 7 | 120 |
| Ex. 23 | Comp. 8 | 105 |
| Ex. 24 | Comp. 9 | 90 |
| Ex. 25 | Comp. 10 | 135 |
| Ex. 26 | Comp. 11 | 135 |
| Ex. 27 | Comp. 12 | 135 |
| Compar. Ex. 1 | Comparative Comp. 1 | 45 |

According to the results, the photoresist compositions of the present invention provided negative photoresist patterns excellent in DOF.

According to the present invention, provided are a compound which is useful for photoresist compositions and a photoresist composition which can provide negative photoresist patterns excellent in DOF.

What is claimed is:

1. A photoresist composition comprising:
a resin which comprises a structural unit derived from a compound represented by formula (I):

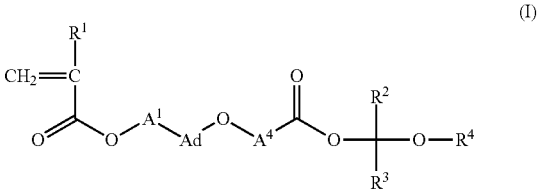

wherein
$R^1$ represents a hydrogen atom or a methyl group,
$R^2$ and $R^3$ each independently represent a hydrogen atom or a C1-C6 alkyl group, $R^4$ represents a C1-C6 alkyl group or $R^3$ and $R^4$ represent an oxolane ring, an oxetane ring, an oxisolan ring or a tetrahydropyran group together with an oxygen atom and a carbon atom,
$A^1$ represents a single bond,
$A^4$ represents a C1-C6 alkanediyl group, and
Ad represents a divalent adamantanediyl group,
a structural unit derived from a monomer having an acid-labile group but not being represented by formula (I), a structural unit having no acid-labile group but a hydroxy group, and a structural unit having no acid-labile group but a lactone ring;
a resin which comprises a structural unit having no acid-labile group but having a fluorine atom;
an acid generator; and
a quencher.

2. A process for producing a photoresist pattern comprising the following steps (1) to (5):
(1) a step of applying the photoresist composition according to claim 1 on a substrate,
(2) a step of forming a composition film by conducting drying,
(3) a step of exposing the composition film to radiation,
(4) a step of baking the exposed composition film, and
(5) a step of developing the baked composition film thereby to form a photoresist pattern.

3. The photoresist composition according to claim 1, wherein Ad is a divalent group represented by any one of formulae (Ad-1), (Ad-2) and (Ad-3);

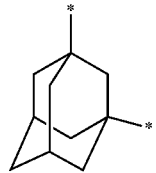

(Ad-1)

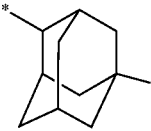

(Ad-2)

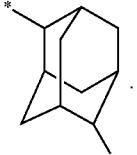

(Ad-3)

\* \* \* \* \*